US011450709B2

(12) United States Patent
Yamazaki et al.

(10) Patent No.: US 11,450,709 B2
(45) Date of Patent: Sep. 20, 2022

(54) FUNCTIONAL PANEL, DISPLAY DEVICE, INPUT/OUTPUT DEVICE, AND DATA PROCESSING DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 4 days.

(21) Appl. No.: 17/094,660

(22) Filed: Nov. 10, 2020

(65) Prior Publication Data
US 2021/0143209 A1 May 13, 2021

(30) Foreign Application Priority Data

Nov. 12, 2019 (JP) .............................. JP2019-205057
Nov. 21, 2019 (JP) .............................. JP2019-210593

(51) Int. Cl.
*G09G 3/32* (2016.01)
*G06F 3/041* (2006.01)
(Continued)

(52) U.S. Cl.
CPC ............ *H01L 27/156* (2013.01); *G06F 3/041* (2013.01); *G09G 3/32* (2013.01); *H01L 25/18* (2013.01);
(Continued)

(58) Field of Classification Search
CPC . G06F 3/041; G06F 3/02; G06F 3/013; G06F 3/16; G06F 3/0412; G06F 3/04166;
(Continued)

(56) References Cited

U.S. PATENT DOCUMENTS 7,358,935 B2    4/2008   Yamashita et al.
7,692,610 B2 *   4/2010   Kimura ................. G09G 3/325
                                                                                   345/76
(Continued)

FOREIGN PATENT DOCUMENTS

JP    2013-145833 A    7/2013
JP    2014-202778 A    10/2014
(Continued)

*Primary Examiner* — Vijay Shankar
(74) *Attorney, Agent, or Firm* — Nixon Peabody LLP; Jeffrey L. Costellia

(57) ABSTRACT

A novel functional panel that is highly convenient or highly reliable is provided. The functional panel includes a first pixel. The first pixel includes a first element, a color conversion layer, and a first functional layer. The first functional layer is positioned between the first element and the color conversion layer. The first element has a function of emitting light and contains gallium nitride. The color conversion layer has a function of converting the color of light emitted from the first element into a different color. The first functional layer includes a first insulating film and a pixel circuit. The first insulating film includes a region positioned between the pixel circuit and the first element, and has an opening. The pixel circuit includes a first transistor. The first transistor includes a first oxide semiconductor film and is electrically connected to the first element through the opening.

16 Claims, 24 Drawing Sheets

(51) Int. Cl.
  *H01L 27/15* (2006.01)
  *H01L 25/18* (2006.01)
  *G06F 3/02* (2006.01)
  *G06F 3/01* (2006.01)
  *G06F 3/16* (2006.01)
(52) U.S. Cl.
  CPC .............. *G06F 3/013* (2013.01); *G06F 3/02* (2013.01); *G06F 3/16* (2013.01); *G09G 2354/00* (2013.01); *G09G 2360/144* (2013.01)
(58) Field of Classification Search
  CPC ......... G06F 3/0446; G06F 2203/04108; G06F 2203/04106; G09G 3/32; G09G 2360/144; G09G 2354/00; G09G 3/2014; G09G 3/2081; G09G 2300/0861; G09G 2310/04; G09G 2320/064; G09G 2340/0435; H01L 27/156; H01L 25/18; H01L 33/32; H01L 33/50
  See application file for complete search history.

(56) References Cited

U.S. PATENT DOCUMENTS

| | | | |
|---|---|---|---|
| 9,105,813 | B1 | 8/2015 | Chang |
| 9,153,171 | B2 | 10/2015 | Sakariya et al. |
| 9,219,197 | B1 | 12/2015 | Chen et al. |
| 9,231,153 | B2 | 1/2016 | Chen et al. |
| 9,590,137 | B2 | 3/2017 | Chen et al. |
| 10,158,043 | B2 | 12/2018 | Chen et al. |
| 10,559,249 | B2 | 2/2020 | Yoneda |
| 11,222,583 | B2 | 1/2022 | Takahashi et al. |
| 2005/0156828 | A1 | 7/2005 | Yamashita et al. |
| 2007/0120785 | A1* | 5/2007 | Kimura ................ G09G 3/3233 345/82 |
| 2010/0102752 | A1 | 4/2010 | Chen et al. |
| 2014/0168037 | A1 | 6/2014 | Sakariya et al. |
| 2014/0292745 | A1 | 10/2014 | Kikuchi et al. |
| 2014/0367705 | A1 | 12/2014 | Bibl et al. |
| 2015/0339979 | A1 | 11/2015 | Kikuchi et al. |
| 2015/0349200 | A1 | 12/2015 | Chen et al. |
| 2015/0349285 | A1 | 12/2015 | Seo et al. |
| 2016/0013170 | A1 | 1/2016 | Sakariya et al. |
| 2016/0268513 | A1 | 9/2016 | Ishisone et al. |
| 2017/0062749 | A1 | 3/2017 | Seo et al. |
| 2017/0090246 | A1 | 3/2017 | Seo et al. |
| 2017/0133550 | A1 | 5/2017 | Schuele et al. |
| 2017/0170200 | A1 | 6/2017 | Ikeda et al. |
| 2017/0186365 | A1 | 6/2017 | Yoneda |
| 2018/0012949 | A1 | 1/2018 | Takeya et al. |
| 2018/0122836 | A1 | 5/2018 | Kang et al. |
| 2019/0244937 | A1 | 8/2019 | Honjo et al. |
| 2020/0006688 | A1 | 1/2020 | Seo et al. |
| 2020/0027388 | A1 | 1/2020 | Iwaki et al. |
| 2020/0152612 | A1* | 5/2020 | Chen .................... H01L 33/58 |
| 2020/0403028 | A1 | 12/2020 | Kusunoki et al. |
| 2021/0005845 | A1* | 1/2021 | Kim ...................... G06F 3/0446 |
| 2021/0159222 | A1* | 5/2021 | Yamazaki ............ G09G 3/2003 |

FOREIGN PATENT DOCUMENTS

| | | |
|---|---|---|
| JP | 2017-120412 A | 7/2017 |
| WO | WO-2008/006756 | 1/2008 |
| WO | WO-2019/130138 | 7/2019 |

\* cited by examiner

FIG. 22A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 22B
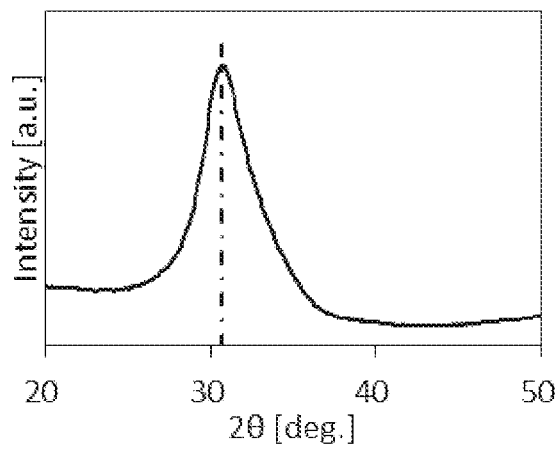
FIG. 22C
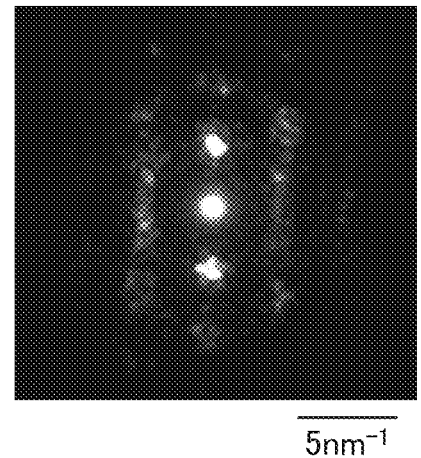

FUNCTIONAL PANEL, DISPLAY DEVICE, INPUT/OUTPUT DEVICE, AND DATA PROCESSING DEVICE

BACKGROUND OF THE INVENTION

1. Field of the Invention

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method of driving any of them, and a method of manufacturing any of them.

2. Description of the Related Art

A display using a micro light-emitting diode whose chromaticity changes little with respect to a current density is known (Patent Document 1). Specifically, a plurality of pixels each include a display element and a microcontroller. The microcontroller includes a first transistor, a triangular wave generation circuit, a comparator, a switch, and a constant current circuit. The first transistor has a function of retaining a potential corresponding to data written to the pixel by being turned off. The triangular wave generation circuit has a function of generating a triangular wave signal. The comparator has a function of generating an output signal corresponding to the retained potential and the triangular wave signal. The switch has a function of controlling, in accordance with the output signal, the supply of a current flowing through the constant current circuit to the display element.

REFERENCE

[Patent Document 1] PCT International Publication No. WO2019/130138

SUMMARY OF THE INVENTION

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the descriptions of these objects do not preclude the existence of other objects. One embodiment of the present invention does not have to achieve all these objects. Other objects will be apparent from and can be derived from the descriptions of the specification, the drawings, the claims, and the like.

(1) One embodiment of the present invention is a functional panel including a first pixel. The first pixel includes a first element, a color conversion layer, and a first functional layer.

The first functional layer is positioned between the first element and the color conversion layer. The first element has a function of emitting light and contains gallium nitride.

The color conversion layer has a function of converting the color of light emitted from the first element into a different color.

The first functional layer includes a first insulating film and a pixel circuit. The first insulating film includes a region positioned between the pixel circuit and the first element, and has an opening.

The pixel circuit includes a first transistor. The first transistor includes a first oxide semiconductor film and is electrically connected to the first element through the opening.

(2) One embodiment of the present invention is a functional panel including the first pixel. The first pixel includes the first element and the first functional layer.

The first element has a function of emitting light and includes a first electrode, a second electrode, and a layer containing a light-emitting material. The layer containing a light-emitting material includes a region positioned between the first electrode and the second electrode, and contains gallium nitride.

The first functional layer includes the first insulating film and the pixel circuit. The first insulating film includes a region positioned between the pixel circuit and the first element, and has the opening.

The pixel circuit includes the first transistor. The first transistor includes the first oxide semiconductor film and is electrically connected to the first electrode through the opening.

Thus, the pixel circuit can be provided to overlap with the first element. Alternatively, the first element can occupy a larger area in the first pixel. Alternatively, high luminance can be obtained at a low density of current flowing through the first element. Alternatively, the reliability can be improved as compared to the case of using an organic compound for the layer containing a light-emitting material. Alternatively, current leakage from the first transistor in an off state can be reduced. Alternatively, the transistor can have less operation characteristics distribution, which can reduce display unevenness. Alternatively, the pixel circuit can have stable operation characteristics. As a result, a novel functional panel that is highly convenient, useful, or reliable can be provided.

(3) Another embodiment of the present invention is a functional panel in which the first insulating film includes a second insulating film and a third insulating film.

The second insulating film includes a region where the third insulating film is positioned between the first transistor and the second insulating film, and contains silicon and oxygen. The third insulating film contains silicon and nitrogen.

Accordingly, diffusion of impurities that cause malfunction during the operation can be inhibited. Alternatively, diffusion of impurities such as water and hydrogen into the first transistor can be inhibited. As a result, a novel functional panel that is highly convenient, useful, or reliable can be provided.

(4) Another embodiment of the present invention is the functional panel including a pixel set.

The pixel set includes the first pixel and a second pixel, and the second pixel includes a second element.

The first insulating film includes a fourth insulating film, and the fourth insulating film has a function of separating the second element from the first element.

Accordingly, an influence of the operation of the first element on the operation of the second element can be reduced. Alternatively, the second element can be positioned close to the first element. Alternatively, the first element can occupy a larger area in the first pixel and the second element can occupy a larger area in the second pixel. As a result, a novel functional panel that is highly convenient, useful, or reliable can be provided.

(5) Another embodiment of the present invention is the functional panel including a first driver circuit.

The first functional layer includes the first driver circuit, and the first driver circuit includes a second transistor.

The second transistor includes a second oxide semiconductor film, and the second oxide semiconductor film contains an element contained in the first oxide semiconductor film.

Thus, in a step of forming the semiconductor film of the transistor included in the pixel circuit, the semiconductor film of the transistor included in the first driver circuit can be formed. Alternatively, the fabrication process of the functional panel can be simplified. As a result, a novel functional panel that is highly convenient, useful, or reliable can be provided.

(6) Another embodiment of the present invention is the functional panel further including a second functional layer.

The second functional layer includes a first contact, a second driver circuit, and a fifth insulating film.

The first contact is electrically connected to the second driver circuit, the second driver circuit includes a third transistor, and the third transistor includes a semiconductor containing a Group 14 element.

The first functional layer includes a sixth insulating film and a second contact. The sixth insulating film includes a region positioned between the fifth insulating film and the fourth insulating film, and includes a region bonded to the fifth insulating film.

The second contact is electrically connected to the first contact and the pixel circuit.

Accordingly, the second driver circuit can supply an image signal, for example. Alternatively, a transistor including single crystal silicon as a semiconductor can be used for the second driver circuit, for example. Alternatively, the second driver circuit can be provided to overlap with the first pixel, for example. Alternatively, the outer size of the functional panel can be reduced. As a result, a novel functional panel that is highly convenient, useful, or reliable can be provided.

(7) Another embodiment of the present invention is the functional panel in which the second pixel has a function of performing display using light emitted from the second element.

The second element has a function of emitting light of the same color as light emitted from the first element, the first pixel includes the color conversion layer, and the color conversion layer has a function of converting the color of light emitted from the first element into a different color.

Accordingly, the second element can be formed in the same step as the first element. Alternatively, the first pixel can display a color different from that of the second pixel. As a result, a novel functional panel that is highly convenient, useful, or reliable can be provided.

(8) Another embodiment of the present invention is the functional panel further including a region.

The region includes a group of pixel sets and another group of pixel sets.

The group of pixel sets is arranged in a row direction and includes the pixel set. The group of pixel sets is electrically connected to a first conductive film.

Another group of pixel sets is arranged in a column direction intersecting the row direction, and includes the pixel set. The another group of pixel sets is electrically connected to a second conductive film.

Thus, image data can be supplied to a plurality of pixels. As a result, a novel functional panel that is highly convenient, useful, or reliable can be provided.

(9) Another embodiment of the present invention is a display device including a control unit and the functional panel.

The control unit is supplied with image data and control data, generates data on the basis of the image data, generates a control signal on the basis of the control data, and supplies the data and the control signal.

The functional panel is supplied with the data and the control signal, and the pixel set performs display on the basis of the data.

Thus, image data can be displayed using the first display element. As a result, a novel display device that is highly convenient, useful, or reliable can be provided.

(10) Another embodiment of the present invention is an input/output device including an input unit and a display unit.

The display unit includes the above functional panel. The input unit includes a sensing region and senses an object approaching the sensing region. The sensing region includes a region overlapping with the pixel set.

Accordingly, an object that approaches the region overlapping with the display unit can be sensed while image data is displayed using the display unit. Alternatively, a finger or the like that approaches the display unit can be used as a pointer to input positional data. Alternatively, positional data can be associated with image data displayed on the display unit. As a result, a novel input/output device that is highly convenient, useful, or reliable can be provided.

(11) Another embodiment of the present invention is a data processing device including an arithmetic device and an input/output device.

The arithmetic device is supplied with input data or sensing data, generates control data and image data on the basis of the input data or the sensing data, and supplies the control data and the image data.

The input/output device supplies the input data and the sensing data, is supplied with the control data and the image data, and includes a display unit, an input unit, and a sensor unit.

The display unit includes the above functional panel and displays the image data on the basis of the control data, and the input unit generates the input data. The sensor unit generates sensing data.

Accordingly, the control data can be generated on the basis of the input data or the sensing data. Alternatively, the image data can be displayed on the basis of the input data or the sensing data. As a result, a novel data processing device that is highly convenient, useful, or reliable can be provided.

(12) Another embodiment of the present invention is a data processing device including the functional panel and at least one of a keyboard, a hardware button, a pointing device, a touch sensor, an illuminance sensor, an imaging device, an audio input device, an eye-gaze input device, and an attitude sensing device.

The above structure allows the arithmetic device to generate image data or control data on the basis of data supplied using a variety of input devices. As a result, a novel data processing device that is highly convenient, useful, or reliable can be provided.

Although the block diagram attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

In this specification, one of a first electrode and a second electrode of a transistor refers to a source electrode and the other refers to a drain electrode.

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the descriptions of these effects do not preclude the existence of other effects. One embodiment of the present invention does not necessarily have all these effects. Other effects will be apparent from and can be derived from the descriptions of the specification, the drawings, the claims, and the like.

BRIEF DESCRIPTION OF THE DRAWINGS

In the accompanying drawings:

FIG. 22A shows classification of IGZO crystal structures, FIG. 22B shows an XRD spectrum of a CAAC-IGZO film, and FIG. 22C shows a nanobeam electron diffraction pattern of the CAAC-IGZO film;

DETAILED DESCRIPTION OF THE INVENTION

Figure 1A:
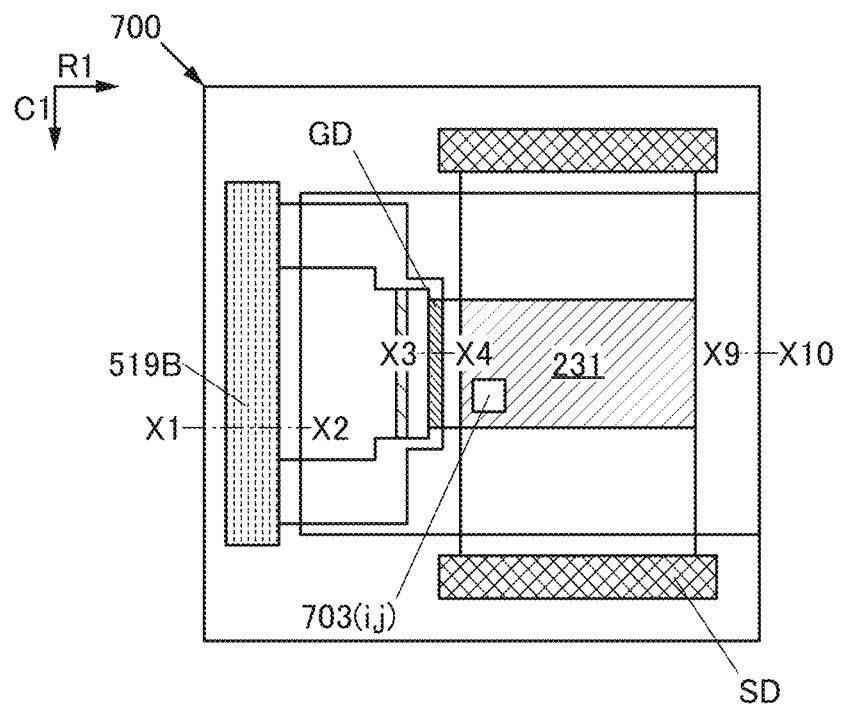
FIGS. 1A to 1C illustrate a structure of a functional panel of one embodiment.

The functional panel of one embodiment of the present invention includes the first pixel, and the first pixel includes the first element, the color conversion layer, and the first functional layer. The first functional layer is positioned between the first element and the color conversion layer. The first element has a function of emitting light and contains gallium nitride. The color conversion layer has a function of converting the color of light emitted from the first element into a different color. The first functional layer includes the first insulating film and the pixel circuit. The first insulating film includes a region positioned between the pixel circuit and the first element, and has the opening. The pixel circuit includes the first transistor. The first transistor includes the first oxide semiconductor film and is electrically connected to the first electrode through the opening.

Thus, the pixel circuit can be provided to overlap with the first element. The first element can occupy a larger area in the first pixel. High luminance can be obtained at a low density of current flowing through the first element. The reliability can be improved as compared to the case of using an organic compound for the layer containing a light-emitting material. Current leakage from the first transistor in an off state can be reduced. The transistor can have less operation characteristics distribution, which can reduce display unevenness. The pixel circuit can have stable operation characteristics. As a result, a novel functional panel that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and the description thereof is not repeated.

Embodiment 1

In this embodiment, structures of a functional panel of one embodiment of the present invention will be described with reference to FIGS. 1A to 1C, FIG. 2, FIG. 3, FIGS. 4A and 4B, FIGS. 5A and 5B, and FIGS. 6A and 6B.

Figure 1B:
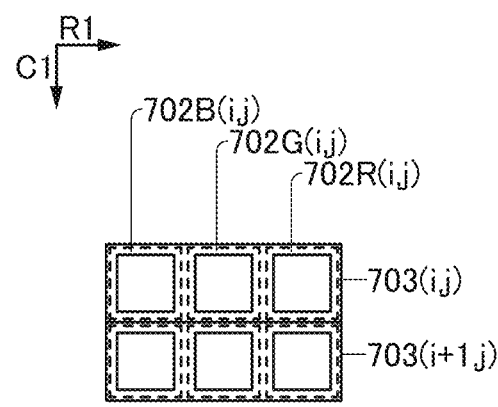
Figure 1C:
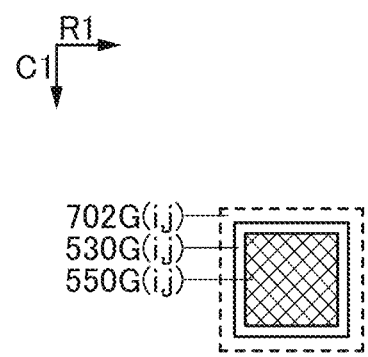

FIG. 1A is a block diagram of the functional panel of one embodiment of the present invention, and FIGS. 1B and 1C each illustrate part of FIG. 1A.

Figure 2:
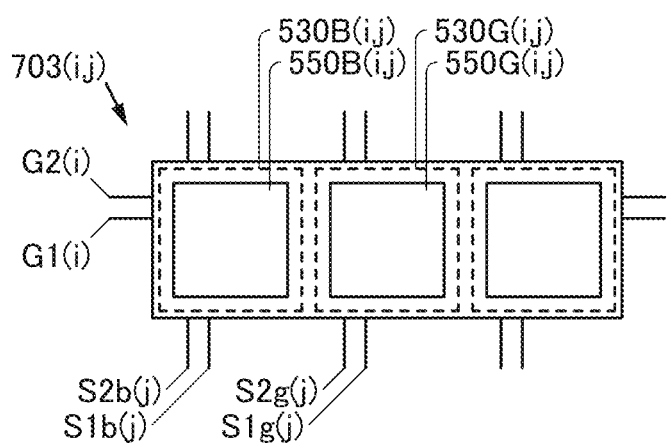
FIG. 2 is a top view illustrating a structure of a functional panel of one embodiment.

FIG. 2 illustrates a structure of the functional panel of one embodiment of the present invention, which is part of FIG. 1A.

Figure 3:
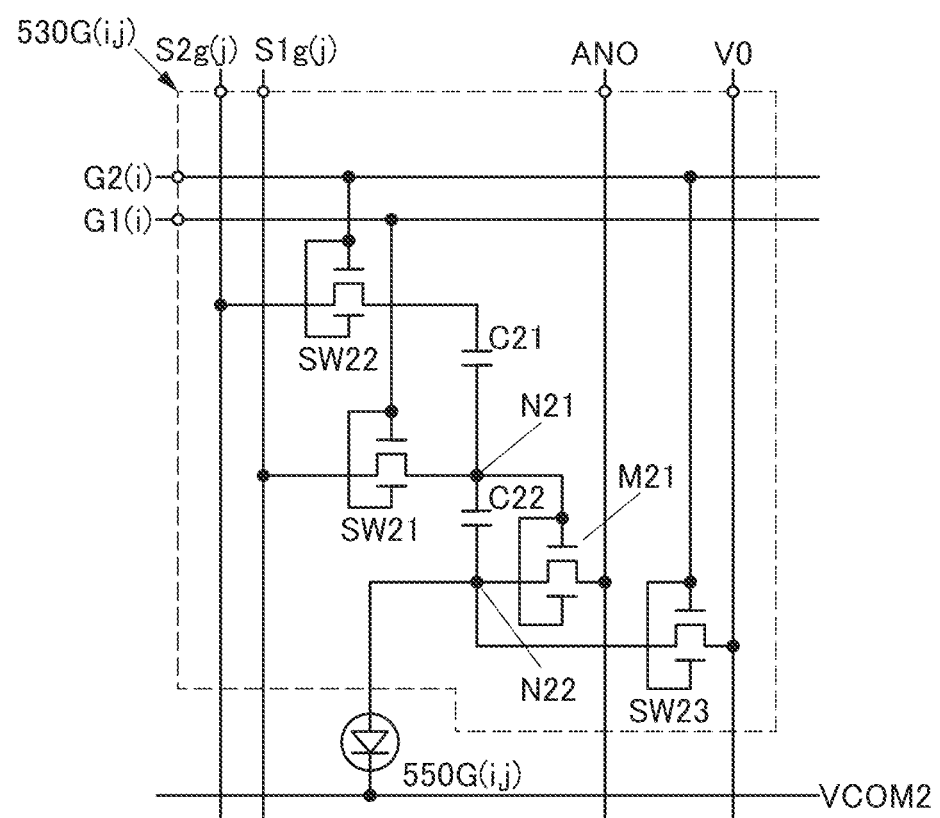
FIG. 3 is a circuit diagram showing a configuration of a functional panel of one embodiment.

FIG. 3 is a circuit diagram of a pixel circuit 530G(i,j) that can be used in the functional panel of one embodiment of the present invention.

Figure 4A:
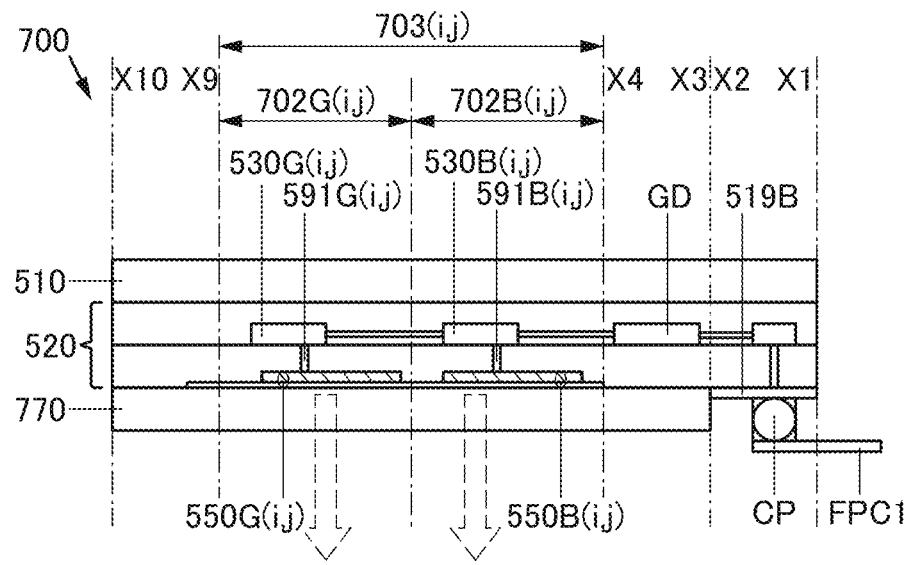
FIGS. 4A and 4B are cross-sectional views each illustrating a structure of a functional panel of one embodiment.
Figure 4B:
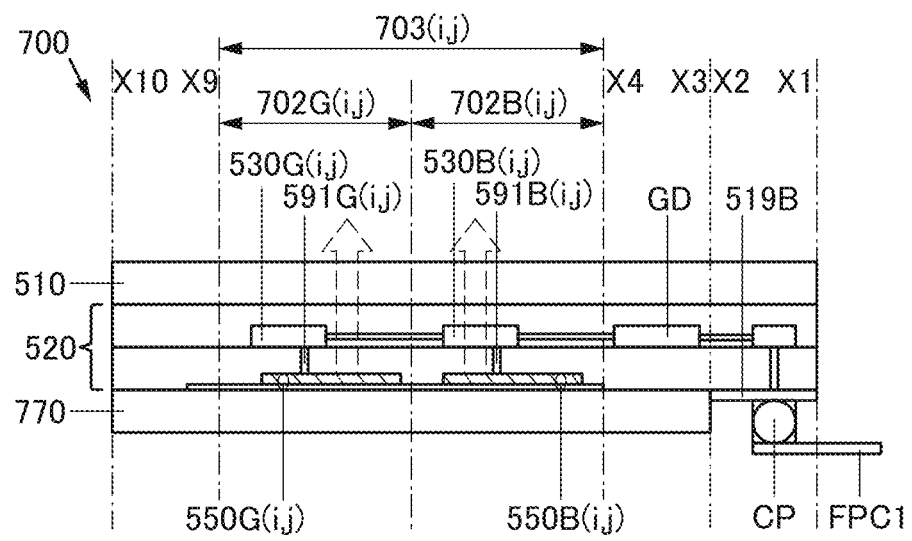

FIG. 4A illustrates the structure of the functional panel of one embodiment of the present invention, and illustrates a cross-section of a pixel set 703(i,j) and cross sections along the cutting lines X1-X2, X3-X4, and X9-X10 in FIG. 1A. FIG. 4B illustrates a structure of the functional panel of one embodiment of the present invention, which is different from of the structure in FIG. 4A.

Figure 5A:
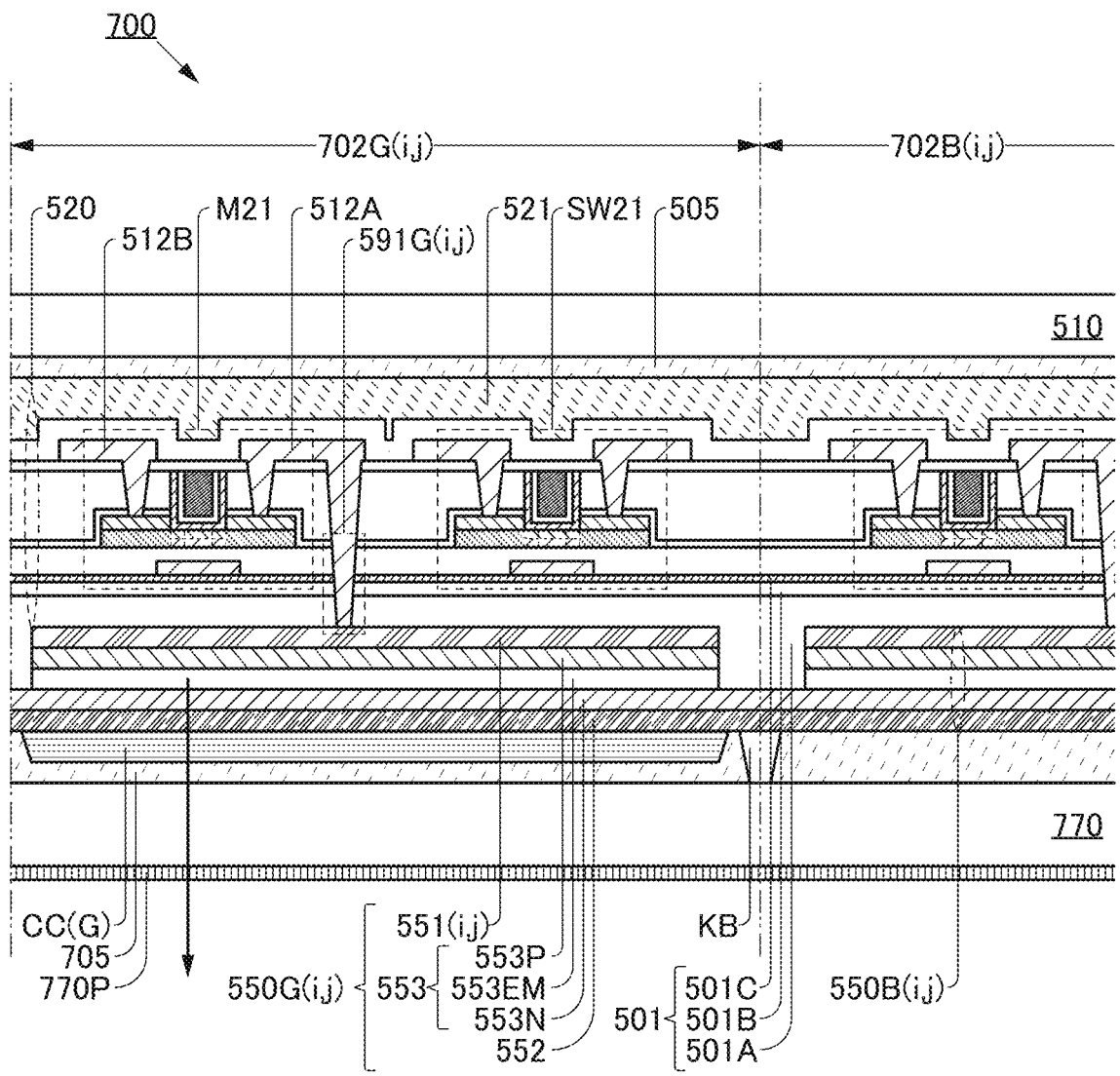
FIGS. 5A and 5B are cross-sectional views illustrating a structure of a functional panel of one embodiment.
Figure 5B:
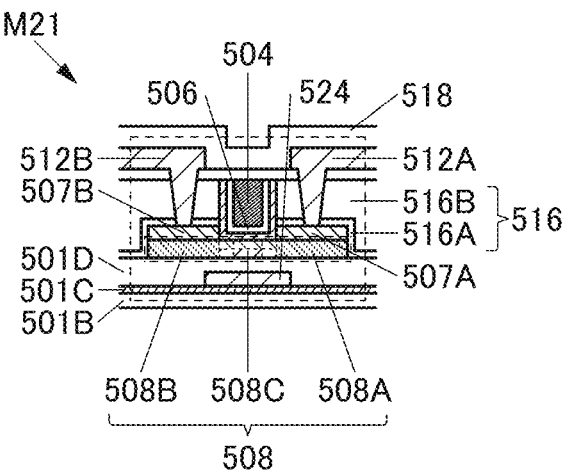

FIG. 5A illustrates a structure of the functional panel of one embodiment of the present invention and is a cross-sectional view of a pixel 702G(i,j) illustrated in FIG. 1B. FIG. 5B is a cross-sectional view illustrating part of FIG. 5A.

Figure 6A:
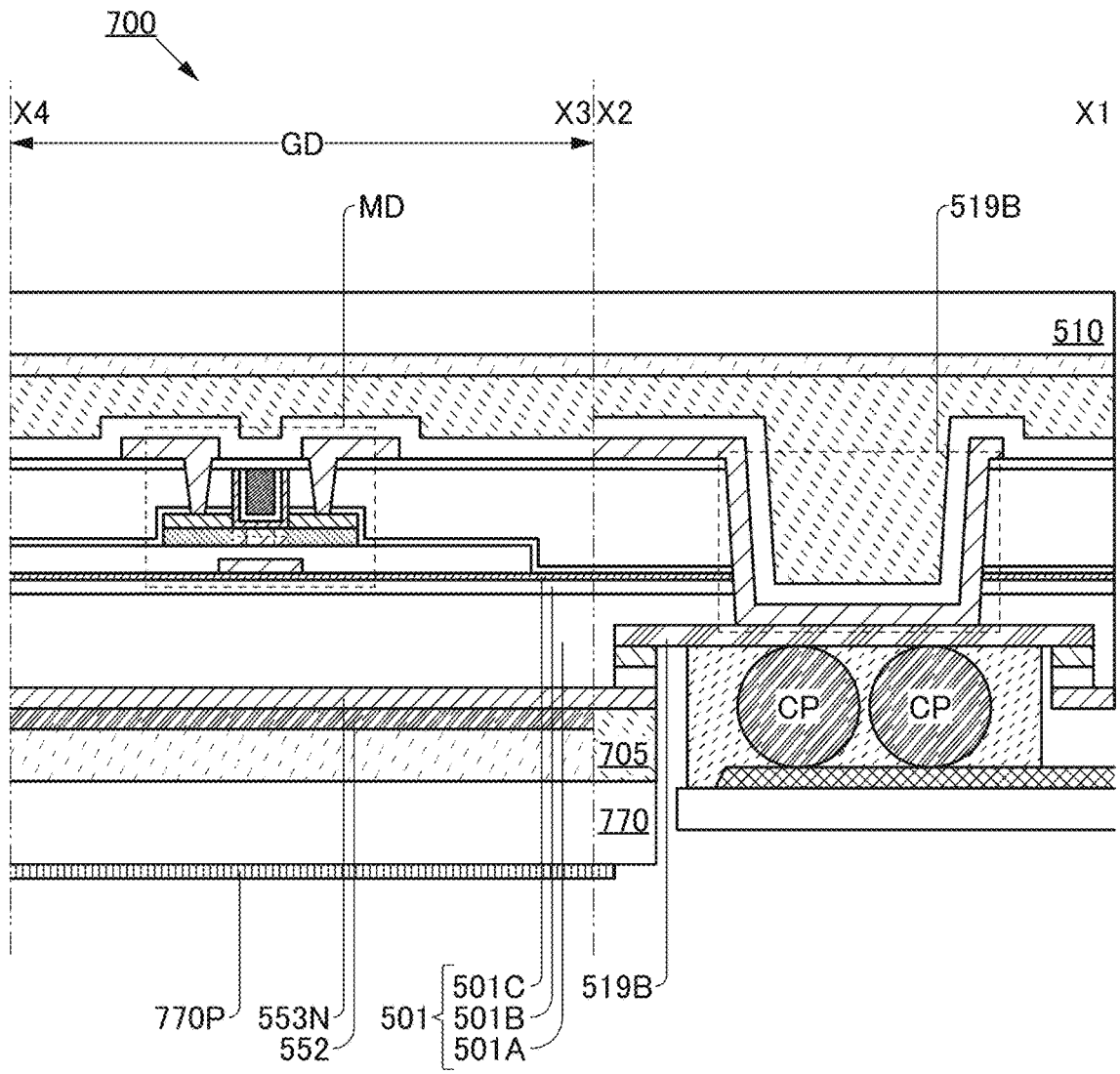
FIGS. 6A and 6B are cross-sectional views illustrating a structure of a functional panel of one embodiment.
Figure 6B:
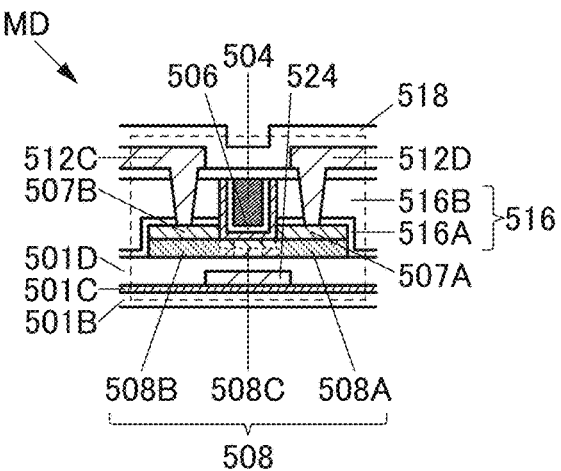

FIG. 6A illustrates a structure of the functional panel of one embodiment of the present invention and is a cross-sectional view taken along the cutting lines X1-X2 and X3-X4 in FIG. 1A. FIG. 6B illustrates part of FIG. 6A.

Note that in this specification, an integer variable of 1 or more may be used for reference numerals. For example, "(p)" where p is an integer variable of 1 or more may be used for part of a reference numeral that specifies any one of components (p components at a maximum). For another example, "(m,n)" where each of m and n is an integer variable of 1 or more may be used for part of a reference numeral that specifies any one of components (m×n components at a maximum).

<Structure Example 1 of Functional Panel 700>

A functional panel 700 described in this embodiment includes the pixel 702G(i,j) (see FIGS. 1A and 1).

<<Structure Example 1 of Pixel 702G(i,j)>>

The pixel 702G(i,j) includes an element 550G(i,j) and a functional layer 520 (see FIG. 1C and FIG. 5A).

<<Structure Example 1 of Element 550G(i,j)>>

The element 550G(i,j) has a function of emitting light, and includes an electrode 551($i,j$), an electrode 552, and a layer 553 containing a light-emitting material (see FIG. 5A). For example, a light-emitting diode can be used as the element 550G(i,j). Specifically, a vertical light-emitting diode can be used as the element 550G(i,j). In addition, a light-emitting diode that emits blue light can be used as the element 550G(i,j).

The layer 553 containing a light-emitting material includes a region positioned between the electrode 551($i,j$) and the electrode 552, and contains gallium nitride.

<<Structure Example 1 of Functional Layer 520>>

The functional layer 520 includes an insulating film 501 and a pixel circuit 530G(i,j) (see FIGS. 4A and 4B and FIG. 5A). The functional layer 520 includes, for example, a transistor M21 used in the pixel circuit 530G(i,j) (see FIG. 3 and FIG. 5A).

<<Structure Example 1 of Insulating Film 501>>

The insulating film 501 includes a region positioned between the pixel circuit 530G(i,j) and the element 550G(i,j), and has an opening 591G(i,j).

<<Structure Example of Pixel Circuit 530G(i,j)>>

The pixel circuit 530G(i,j) includes the transistor M21 (see FIG. 3 and FIG. 5A). The transistor M21 is electrically connected to the electrode 551($i,j$) through the opening 591G. Note that the transistor M21 includes an oxide semiconductor film. A conductive film 512A electrically connects the transistor M21 and the electrode 551($i,j$), for example. In addition, a conductive film 512B electrically connects the transistor M21 and a conductive film ANO (see FIG. 3).

Thus, the pixel circuit 530G(i,j) can be provided to overlap with the element 550G(i,j). The element 550G(i,j) can occupy a larger area in the pixel 702G(i,j). High luminance can be obtained at a low density of current flowing through the element 550G(i,j). The reliability can be improved as compared to the case of using an organic compound for the layer 553 containing a light-emitting material. Current leakage from the transistor M21 in an off state can be reduced. The transistor can have less operation characteristics distribution, which can reduce display unevenness. The pixel circuit 530G(i,j) can have stable operation characteristics. As a result, a novel functional panel that is highly convenient, useful, or reliable can be provided.

<<Structure Example 2 of Insulating Film 501>>

The insulating film 501 includes an insulating film 501B and an insulating film 501C. The insulating film 501B includes a region where the insulating film 501C is positioned between the transistor M21 and the insulating film 501B, and contains silicon and oxygen. The insulating film 501C contains silicon and nitrogen.

Accordingly, diffusion of impurities that cause malfunction during the operation into the transistor M21 can be inhibited. Alternatively, diffusion of impurities such as water and hydrogen into the transistor M21 can be inhibited. As a result, a novel functional panel that is highly convenient, useful, or reliable can be provided.

<Structure Example 2 of Functional Panel 700>

The functional panel described in this embodiment includes a pixel set 703(i,j).

<<Structure Example 1 of Pixel Set 703(i,j)>>

The pixel set 703(i,j) includes the pixel 702G(i,j) and a pixel 702B(i,j) (see FIG. 1i). The pixel 702B(i,j) includes an element 550B(i,j).

The insulating film 501 includes an insulating film 501A, and the insulating film 501A has a function of isolating the element 550B(i,j) from the element 550G(i,j) (see FIG. 5A). Specifically, the insulating film 501A has a function of isolating light-emitting layers 553EM between adjacent elements.

Accordingly, an influence of the operation of the element 550G(i,j) on the operation of the element 550B(i,j) can be reduced. Specifically, a crosstalk phenomenon in which the element 550B(i,j) is unintentionally operated in accordance with the operation of the element 550G(i,j) can be inhibited. Alternatively, the element 550B(i,j) can be positioned close to the element 550G(i,j). Alternatively, the element 550G(i,j) can occupy a larger area in the pixel 702G(i,j) and the element 550B(i,j) can occupy a larger area in the pixel 702B(i,j). Furthermore, the aperture ratio of the pixel 702G(i,j) can be increased. As a result, a novel functional panel that is highly convenient, useful, or reliable can be provided.

The functional panel 700 includes a conductive film G1(i), a conductive film G2(i), a conductive film S1g(j), a conductive film S2g(j), the conductive film ANO, and a conductive film VCOM2 (see FIG. 3).

The conductive film G(i) is supplied with a first selection signal, the conductive film G2(i) is supplied with a second selection signal, the conductive film S1g(j) is supplied with an image signal, and the conductive film S2g(j) is supplied with a control signal, for example.

<<Structure Example 2 of Pixel Set 703(i,j)>>

The pixel set 703(i,j) includes the pixel 702G(i,j) (see FIG. 1). The pixel 702G(i,j) includes the pixel circuit 530G(i,j) and the element 550G(i,j) (see FIG. 1C).

<<Structure Example 1 of Pixel Circuit 530G(i,j)>>

The pixel circuit 530G(i,j) is supplied with the first selection signal and obtains an image signal in accordance with the first selection signal. For example, the first selection signal can be supplied using the conductive film G1(i) (see FIG. 3). The image signal can be supplied using the conductive film S1g(j). Note that the operation of supplying the first selection signal and making the pixel circuit 530G(i,j) obtain an image signal can be referred to as "writing".

<<Structure Example 2 of Pixel Circuit 530G(i,j)>>

The pixel circuit 530G(i,j) includes a switch SW21, a switch SW22, the transistor M21, a capacitor C21, and a node N21 (see FIG. 3). The pixel circuit 530G(i,j) includes a node N22, a capacitor C22, and a switch SW23.

The transistor M21 includes a gate electrode electrically connected to the node N21, the first electrode electrically connected to the element 550G(i,j), and the second electrode electrically connected to the conductive film ANO.

The switch SW21 includes a first terminal electrically connected to the node N21 and a second terminal electrically connected to the conductive film Slg(j), and has a function of controlling its on/off state on the basis of the potential of the conductive film G1(i).

The switch SW22 includes a first terminal electrically connected to the conductive film S2g(j), and has a function of controlling its on/off state on the basis of the potential of the conductive film G2(i).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the element 550G(i,j) can be controlled with the potential of the node N21. As a result, a novel functional panel that is highly convenient or reliable is provided.

<<Structure Example 1 of Element 550G(i,j)>>

The element 550G(i,j) is electrically connected to the pixel circuit 530G(i,j) (see FIG. 2 and FIG. 3). The element 550G(i,j) includes the electrode 551G(i,j) electrically connected to the pixel circuit 530G(i,j), and the electrode 552 electrically connected to the conductive film VCOM2 (see FIG. 3 and FIG. 5A). Note that the element 550G(i,j) has a function of operating on the basis of the potential of the node N21.

Instead of the light-emitting diode, for example, an organic electroluminescent element or a quantum dot LED (QDLED) can be used as the element 550G(i,j).

<<Structure Example 3 of Pixel Set 703(i,j)>>

A plurality of pixels can be used in the pixel set 703(i,j). For example, a plurality of pixels that show colors of different hues can be used. Note that a plurality of pixels can be referred to as subpixels. In addition, a set of subpixels can be referred to as a pixel.

Such a structure enables additive mixture of colors shown by the plurality of pixels. Alternatively, it is possible to express a color of a hue that an individual pixel cannot show.

Specifically, the pixel 702B(i,j) for showing blue, the pixel 702G(i,j) for showing green, and a pixel 702R(i,j) for showing red can be used in the pixel set 703(i,j). The pixel 702B(i,j), the pixel 702G(i,j), and the pixel 702R(i,j) can each be referred to as a subpixel (see FIG. 1).

As another example, a pixel for showing white or the like in addition to the above set can be used in the pixel set 703(i,j). Moreover, a pixel for showing cyan, a pixel for showing magenta, and a pixel for showing yellow can be used in the pixel set 703(i,j).

As another example, a pixel emitting infrared rays in addition to the above set can be used in the pixel set 703(i,j). Specifically, a pixel that emits light including light with a wavelength of greater than or equal to 650 nm and less than or equal to 1000 nm can be used in the pixel set 703(i,j).

<Structure Example 3 of Functional Panel 700>

The functional panel described in this embodiment includes the driver circuit GD (see FIG. 1A). In addition, a driver circuit SD is included.

<<Structure Example of Driver Circuit GD>>

The driver circuit GD has a function of supplying the first selection signal and the second selection signal. For example, the driver circuit GD is electrically connected to the conductive film G1(i) to supply the first selection signal, and is electrically connected to the conductive film G2(i) to supply the second selection signal.

<<Structure Example of Driver Circuit SD>>

The driver circuit SD has a function of supplying the image signal and the control signal, and the control signal includes a first level and a second level. The driver circuit SD is electrically connected to the conductive film Slg(j) to supply the image signal, and is electrically connected to the conductive film S2g(j) to supply the control signal, for example.

<<Structure Example 2 of Functional Layer 520>>

The functional layer 520 includes the driver circuit GD (see FIGS. 4A and 4B and FIG. 6A). The functional layer 520 includes, for example, a transistor MD used in the driver circuit GD.

<<Structure Example 1 of Driver Circuit GD>>

The driver circuit GD includes the transistor MD, the transistor MD includes an oxide semiconductor film, and the oxide semiconductor film contains an element contained in the oxide semiconductor film of the transistor M21.

A semiconductor film with the same composition as the semiconductor film used for the transistor M21 can be used for the transistor MD, for example.

Thus, in the step of forming the semiconductor film of the transistor included in the pixel circuit 530G(i,j), the semiconductor film of the transistor included in the driver circuit GD can be formed. Alternatively, the fabrication process of the functional panel can be simplified. As a result, a novel functional panel that is highly convenient, useful, or reliable can be provided.

<<Structure Example of Transistor>>

A bottom-gate transistor, a top-gate transistor, or the like can be used in the functional layer 520. Specifically, a transistor can be used as a switch.

The transistor includes a semiconductor film 508, a conductive film 504, a conductive film 507A, and a conductive film 507B (see FIG. 5B).

The semiconductor film 508 includes a region 508A electrically connected to the conductive film 507A and a region 508B electrically connected to the conductive film 507B. The semiconductor film 508 includes a region 508C between the region 508A and the region 508B.

The conductive film 504 includes a region overlapping with the region 508C and has a function of a gate electrode.

An insulating film 506 includes a region positioned between the semiconductor film 508 and the conductive film 504. The insulating film 506 has a function of a gate insulating film.

The conductive film 507A has one of a function of a source electrode and a function of a drain electrode, and the conductive film 507B has the other.

A conductive film 524 can be used in the transistor. The conductive film 524 includes a region where the semiconductor film 508 is positioned between the conductive film 504 and the conductive film 524. The conductive film 524 has a functions of a second gate electrode.

Note that in a step of forming the semiconductor film used in the transistor of the pixel circuit, the semiconductor film used in the transistor of the driver circuit can be formed.

<<Structure Example 1 of Semiconductor Film 508>>

For example, a semiconductor containing a Group 14 element can be used for the semiconductor film 508. Specifically, a semiconductor containing silicon can be used for the semiconductor film 508.

[Hydrogenated Amorphous Silicon]

For example, hydrogenated amorphous silicon can be used for the semiconductor film 508. Microcrystalline silicon or the like can also be used for the semiconductor film 508. Thus, it is possible to provide a functional panel having less display unevenness than a functional panel using polysilicon for the semiconductor film 508, for example. Alternatively, the size of the functional panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that of a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. Alternatively, the driver circuit can be formed over a substrate where the pixel circuit is formed. Alternatively, the number of components included in an electronic device can be reduced.

<<Structure Example 2 of Semiconductor Film 508>>

For example, a metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of the data processing device can be reduced. Furthermore, power consumption for driving can be reduced.

Alternatively, a functional panel having less display unevenness than a functional panel using polysilicon for the semiconductor film 508, for example, can be provided. Alternatively, the element 550G(i,j) can be driven at a duty ratio of 50% or lower. For another example, smart glasses or a head mounted display can be provided.

For example, a transistor using an oxide semiconductor can be used. Specifically, an oxide semiconductor containing indium, an oxide semiconductor containing indium, gallium, and zinc, or an oxide semiconductor containing indium, gallium, zinc, and tin can be used for the semiconductor film.

For example, a transistor having a lower leakage current in an off state than a transistor using amorphous silicon for a semiconductor film can be used. Specifically, a transistor using an oxide semiconductor for a semiconductor film can be used as a switch or the like. In that case, the potential of the floating node can be held for a longer time than in a circuit in which a transistor using amorphous silicon is used as a switch.

For example, a 25-nm-thick film including indium, gallium, and zinc can be used as the semiconductor film 508.

Thus, flicker of display can be suppressed. Alternatively, power consumption can be reduced. A moving image that moves fast can be displayed smoothly. A photograph and the like can be displayed in a large number of gray levels. As a result, a novel functional panel that is highly convenient, useful, or reliable can be provided.

<<Structure Example 3 of Semiconductor Film 508>>

For example, a compound semiconductor can be used as a semiconductor of the transistor. Specifically, a semiconductor containing gallium arsenide can be used.

For example, an organic semiconductor can be used as a semiconductor of the transistor. Specifically, an organic semiconductor containing any of polyacenes or graphene can be used for the semiconductor film.

<<Structure Example of Capacitor>>

The capacitor includes one conductive film, another conductive film, and an insulating film. The insulating film includes a region positioned between these conductive films.

For example, the capacitor can include a conductive film used as the source electrode or the drain electrode of the transistor, a conductive film used as the gate electrode, and an insulating film used as the gate insulating film.

<<Structure Example 2 of Functional Layer 520>>

The functional layer 520 includes an insulating film 521, an insulating film 518, an insulating film 516, the insulating film 506, an insulating film 501C, and the like (see FIGS. 5A and 5B).

The insulating film 521 includes a region where the pixel circuit 530G(i,j) is positioned between the element 550G(i,j) and the insulating film 521.

The insulating film 518 includes a region positioned between the insulating film 521 and the insulating film 501C.

The insulating film 516 includes a region positioned between the insulating film 518 and the insulating film 501C.

The insulating film 506 includes a region positioned between the insulating film 516 and the insulating film 501C.

[Insulating Film 521]

For example, an insulating inorganic material, an insulating organic material, or an insulating composite material including an inorganic material and an organic material can be used for the insulating film 521.

Specifically, an inorganic oxide film, an inorganic nitride film, an inorganic oxynitride film, and the like, or a layered material obtained by stacking some of these films can be used for the insulating film 521.

For example, a film including any of a silicon oxide film, a silicon nitride film, a silicon oxynitride film, an aluminum oxide film, and the like, or a film including a material obtained by stacking any of these films can be used for the insulating film 521. Note that a silicon nitride film is a dense film and has an excellent function of inhibiting diffusion of impurities.

For example, polyimide, polysiloxane, a composite material of an inorganic material and polyimide or polysiloxane, or the like can be used for the insulating film 521. Note that polyimide is excellent in the following properties, for example, compared with other organic materials: thermal stability, an insulating property, toughness, a low dielectric constant, a low coefficient of thermal expansion, and high chemical resistance. Accordingly, in particular, polyimide can be suitably used for the insulating film 521 or the like. However, one embodiment of the present invention is not limited thereto. For example, for the insulating film 521, an inorganic material such as silicon oxide, silicon nitride, or aluminum oxide may be used. The use of an inorganic material for the insulating film 521 can improve the reliability of the transistor M21.

Alternatively, the insulating film 521 may be formed using a photosensitive material. Specifically, a film formed using photosensitive polyimide, a photosensitive acrylic resin, or the like can be used as the insulating film 521.

Thus, steps due to various components overlapping with the insulating film 521, for example, can be reduced. The insulating film 521 may have a stacked-layer structure of any of the above-described inorganic materials and an organic material having a planarization function, such as a polyimide or photosensitive acrylic resin.

[Insulating Film 518]

For example, a material that can be used for the insulating film 521 can be used for the insulating film 518.

For example, a material that has a function of inhibiting diffusion of oxygen, hydrogen, water, alkali metal, alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

For example, a material that can be used for the insulating film 521 can be used for the insulating film 516.

Specifically, a film formed by a method different from a method of forming the insulating film 518 can be used as the insulating film 516.

[Insulating Film 506]

For example, a material that can be used for the insulating film 521 can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region positioned between the insulating film 501C and the insulating film 516.

For example, a material that can be used for the insulating film 506 can be used for the insulating film 501D.

[Insulating Film 501C]

For example, a material that can be used for the insulating film 521 can be used for the insulating film 501C. Specifically, a material containing silicon and oxygen can be used for the insulating film 501C. Thus, diffusion of impurities into the pixel circuit, the element 550G(i,j), or the like can be inhibited.

<<Structure Example 3 of Functional Layer 520>>

The functional layer 520 includes a conductive film, a wiring, and a terminal. A conductive material can be used for the wiring, the electrode, the terminal, the conductive film, and the like.

[Wiring and the Like]

For example, an inorganic conductive material, an organic conductive material, a metal, conductive ceramics, or the like can be used for the wiring and the like.

Specifically, for example, a metal element selected from aluminum, gold, platinum, silver, copper, chromium, tantalum, titanium, molybdenum, tungsten, nickel, iron, cobalt, palladium, and manganese can be used for the wiring and the like. Alternatively, an alloy including any of the above-described metal elements, or the like can be used for the wiring and the like. In particular, an alloy of copper and manganese is suitably used in microfabrication using a wet etching method.

Specifically, the wiring and the like can employ any of the following structures, for example: a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and is subjected to reduction, so that a film containing graphene can be formed. As a reducing method, a method with application of heat, a method using a reducing agent, or the like can be employed.

For example, a film containing a metal nanowire can be used for the wiring and the like. Specifically, a nanowire containing silver can be used.

Specifically, a conductive polymer can be used for the wiring and the like.

For example, a terminal 519B can be electrically connected to a flexible printed circuit FPC1 with the use of a conductive material (see FIGS. 4A and 4B). Specifically, the terminal 519B can be electrically connected to the flexible printed circuit FPC1 with the use of a conductive material CP.

<Structure Example 4 of Functional Panel 700>

The functional panel 700 includes a base 510, a base 770, and the sealant 705 (see FIG. 5A). The functional panel 700 also includes a component KB.

<<Base 510 and Base 770>>

A light-transmitting material can be used for the base 510 or the base 770.

For example, a flexible material can be used for the base 510 or the base 770. Thus, a functional panel having flexibility can be provided.

For example, a material with a thickness greater than or equal to 0.1 mm and less than or equal to 0.7 mm can be used. Specifically, a material polished to a thickness of approximately 0.1 mm can be used. As a result, the base 510 or the base 770 can be lightweight.

A glass substrate having any of the following sizes, for example, can be used as the base 510 or the base 770: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

For the base 510 or the base 770, an organic material, an inorganic material, a composite material of an organic material and an inorganic material, or the like can be used.

For example, an inorganic material such as glass, ceramic, or metal can be used. Specifically, non-alkali glass, soda-lime glass, potash glass, crystal glass, aluminosilicate glass, tempered glass, chemically tempered glass, quartz, sapphire, or the like can be used for the base 510 or the base 770. Alternatively, aluminosilicate glass, tempered glass, chemically tempered glass, sapphire, or the like can be favorably used for the base 510 or the base 770 that is on the side closer to a user of the functional panel. This can prevent breakage or damage of the functional panel caused by the use.

Specifically, an inorganic oxide film, an inorganic nitride film, an inorganic oxynitride film, or the like can be used. For example, a silicon oxide film, a silicon nitride film, a silicon oxynitride film, or an aluminum oxide film can be used. Stainless steel, aluminum, or the like can be used for the base 510 or the base 770.

For example, a single crystal semiconductor substrate or a polycrystalline semiconductor substrate made of silicon or silicon carbide, a compound semiconductor substrate made of silicon germanium or the like, or an SOI substrate can be used as the base 510 or the base 770. Thus, a semiconductor element can be formed over the base 510 or the base 770.

For example, an organic material such as a resin, a resin film, or plastic can be used for the base 510 or the base 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base 510 or the base 770. For example, a resin film, a resin plate, a layered material, or the like containing any of these materials can be used. As a result, the base 510 or the base 770 can be lightweight. Alternatively, for example, the functional panel can be less likely to suffer from damage by dropping or the like.

Specifically, polyethylene terephthalate (PET), polyethylene naphthalate (PEN), polyethersulfone (PES), a cyclic olefin polymer (COP), a cyclic olefin copolymer (COC), or the like can be used for the base 510 or the base 770.

For example, a composite material formed by attaching a metal plate, a thin glass plate, or a film of an inorganic material or the like and a resin film or the like can be used for the base 510 or the base 770. For example, a composite material formed by dispersing a fibrous or particulate metal, glass, inorganic material, or the like into a resin can be used for the base 510 or the base 770. For example, a composite material formed by dispersing a fibrous or particulate resin, organic material, or the like into an inorganic material can be used for the base 510 or the base 770.

Furthermore, a single-layer material or a material in which a plurality of layers are stacked can be used for the base 510 or the base 770. For example, a material in which insulating films and the like are stacked can be used. Specifically, a material in which one or more films selected from a silicon oxide layer, a silicon nitride layer, a silicon oxynitride layer, and the like are stacked can be used. Thus, diffusion of impurities contained in the base can be prevented, for example. Alternatively, diffusion of impurities contained in glass or a resin can be prevented. Alternatively, diffusion of impurities that pass through a resin can be prevented.

Alternatively, paper, wood, or the like can be used for the base 510 or the base 770.

For example, a material having heat resistance high enough to withstand heat treatment in the fabrication process can be used for the base 510 or the base 770. Specifically, a material that is resistant to heat applied in the process of forming the transistor, the capacitor, and the like directly on the base can be used for the base 510 or the base 770.

For example, it is possible to employ a method in which an insulating film, a transistor, a capacitor, and the like are formed over a process substrate that is resistant to heat applied in the fabrication process, and then the formed components are transferred to the base 510 or the base 770, for example. Thus, the insulating film, the transistor, the capacitor, and the like can be formed over a flexible substrate, for example.

<<Sealant>>

The sealant 705 includes a region positioned between the functional layer 520 and the base 770, and has a function of bonding the functional layer 520 and the base 770 together (see FIG. 5A). A sealant 505 includes a region positioned between the functional layer 520 and the base 510, and has a function of attaching the functional layer 520 and the base 510 to each other.

For the sealant 705 and the sealant 505, an inorganic material, an organic material, a composite material of an inorganic material and an organic material, or the like can be used.

For example, an organic material such as a thermally fusible resin or a curable resin can be used for the sealant 705 and the sealant 505.

For example, an organic material such as a reactive curable adhesive, a light curable adhesive, a thermosetting adhesive, and/or an anaerobic adhesive can be used for the sealant 705 and the sealant 505.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin can be used as the sealant 705 and the sealant 505.

<<Component KB>>

The component KB includes a region positioned between the functional layer 520 and the base 770. The component KB has a function of providing a certain space between the functional layer 520 and the base 770.

<Fabrication Method of Functional Panel 700>

The fabrication method of the functional panel 700 includes the following 18 steps.

In a first step, an n-type clad layer 553N is formed over a sapphire substrate, for example.

In a second step, the light-emitting layer 553EM is formed to overlap with the n-type clad layer 553N.

In a third step, a p-type clad layer 553P is formed to overlap with the light-emitting layer 553EM.

In a fourth step, the electrode 551(i,j) is formed to overlap with the p-type clad layer 553P.

In a fifth step, the electrode 551(i,j), the p-type clad layer 553P, and the light-emitting layer 553EM are processed to have a predetermined shape by an etching method.

In a sixth step, the insulating film 501A is formed to cover the electrode 551(i,j).

In a seventh step, the insulating film 501A is processed to have a predetermined shape by a chemical polishing method, for example.

In an eighth step, the insulating film 501B is formed over the insulating film 501A.

In a ninth step, the insulating film 501C is formed over the insulating film 501B.

In a tenth step, the transistor M21 and the insulating film 516 are formed over the insulating film 501C.

In an eleventh step, an opening including the opening 591G is formed by an etching method.

In a twelfth step, the transistor M21 and the electrode 551(i,j) are made to be electrically connected to each other.

In a thirteenth step, the insulating film 518 and the insulating film 521 are formed over the transistor M21.

In a fourteenth step, the base 510 and the insulating film 521 are attached to each other with the sealant 505.

In a fifteenth step, the sapphire substrate, for example, is separated from the n-type clad layer 553N. Note that in the fifteenth step, a laser lift-off method can be used, for example.

In a sixteenth step, the electrode 552 is formed to overlap with the n-type clad layer 553N.

In a seventeenth step, the color conversion layer CC(G) is formed so that the electrode 552 is positioned between the coloring layer CC(G) and the light-emitting layer 553EM.

In an eighteenth step, the base 770 and the color conversion layer CC(G) are attached to each other with the sealant 705.

<Structure Example 5 of Functional Panel 700>

Figure 23A:
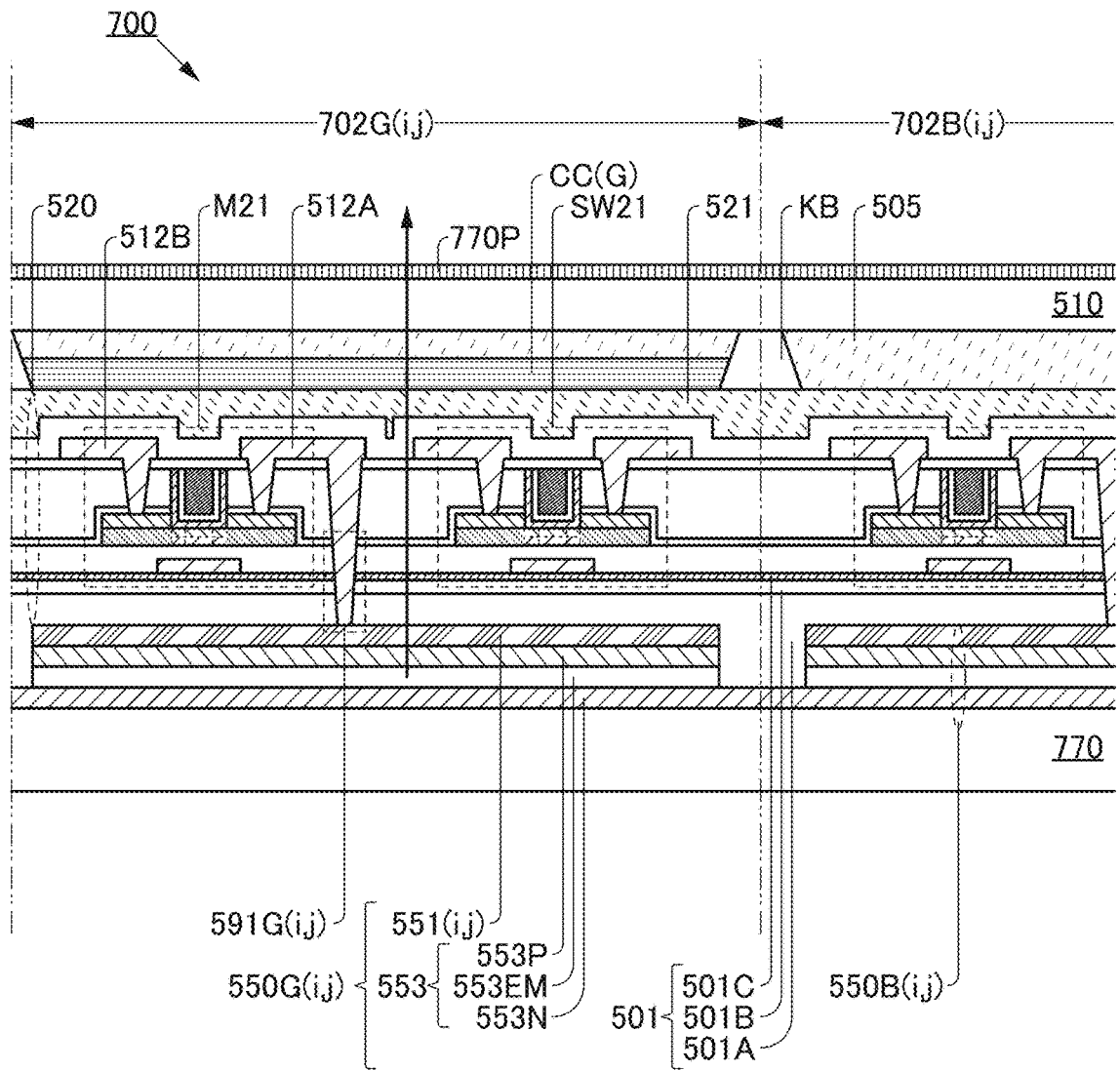
FIGS. 23A and 23B are cross-sectional views illustrating a structure of a functional panel of one embodiment.

The functional panel 700 described in this embodiment includes the pixel 702G(i,j) (see FIG. 4B and FIG. 23A).

<<Structure Example 1 of Pixel 702G(i,j)>>

The pixel 702G(i,j) includes the element 550G(i,j), the color conversion layer CC(G), and the functional layer 520 (see FIG. 23A).

<<Structure Example 1 of Element 550G(i,j)>>

The functional layer 520 is positioned between the color conversion layer CC(G) and the element 550G(i,j). The element 550G(i,j) has a function of emitting light and contains gallium nitride.

For example, a light-emitting diode can be used as the element 550G(i,j). Specifically, a vertical light-emitting diode can be used as the element 550G(i,j). In addition, a light-emitting diode that emits blue light can be used as the element 550G(i,j). Note that the n-type clad layer 553N has conductivity. Thus, the n-type clad layer 553N can electrically connect the element 550G(i,j) and an adjacent element, e.g., the element 550B(i,j). In other words, the n-type clad layer 553N also functions as an electrode.

<<Structure Example 1 of Color Conversion Layer CC(G)>>

The color conversion layer CC(G) has a function of converting the color of light emitted from the element 550G(i,j) into a different color. For example, the light emitted from the element 550G(i,j) passes through the functional layer 520 to reach the color conversion layer CC(G). For example, in the case where the element 550G(i,j) emits blue light, the color conversion layer CC(G) can convert the blue light into green light, for example. Note that the color conversion layer CC(G) can be formed by a photolithography method. Alternatively, the component KB is formed by a photolithography method and the color conversion layer CC(G) can be formed by an ink-jet method in a region surrounded by the component KB, for example.

<<Structure Example 1 of Functional Layer 520>>

The functional layer 520 includes the insulating film 501 and the pixel circuit 530G(i,j).

The insulating film 501 includes a region positioned between the pixel circuit 530G(i,j) and the element 550G(i,j), and has the opening 591G.

Figure 23B:
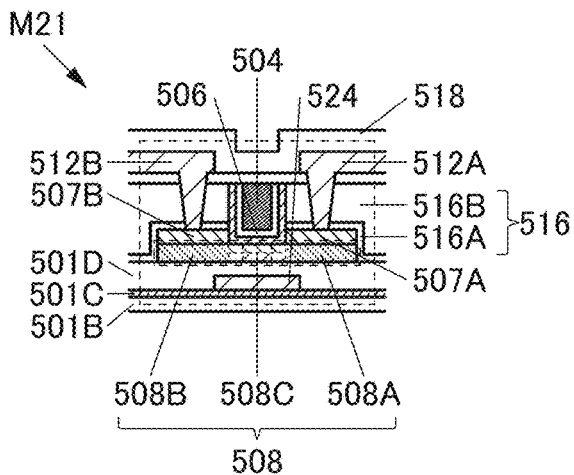

The pixel circuit 530G(i,j) includes the transistor M21, and the transistor M21 includes an oxide semiconductor film. The transistor M21 is electrically connected to the element 550G(i,j) through the opening 591G. The conductive film 512A electrically connects the transistor M21 and the electrode 551(i,j), for example (see FIG. 23B). In addition, the conductive film 512B electrically connects the transistor M21 and the conductive film ANO (see FIG. 3).

Note that a light-blocking layer may be provided between the element 550G(i,j) and the transistor M21. Alternatively, a light-blocking material can be used for the conductive film 524. With the light-blocking layer, the transistor M21 can be prevented from being irradiated with light emitted from the element 550G(i,j).

Note that this embodiment can be combined with any of the other embodiments in this specification as appropriate.

Embodiment 2

In this embodiment, structures of a functional panel of one embodiment of the present invention will be described with reference to FIG. 16, FIGS. 17A to 17C, FIGS. 18A to 18C, FIG. 19, and FIG. 20.

Figure 16:
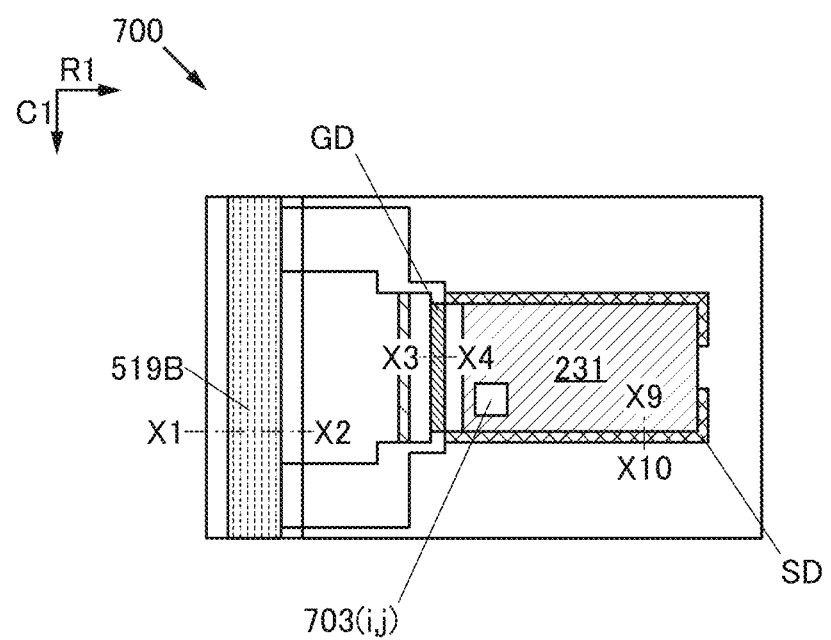
FIG. 16 illustrates a structure of a functional panel of one embodiment.

FIG. 16 is a block diagram illustrating the functional panel of one embodiment of the present invention.

Figure 17A:
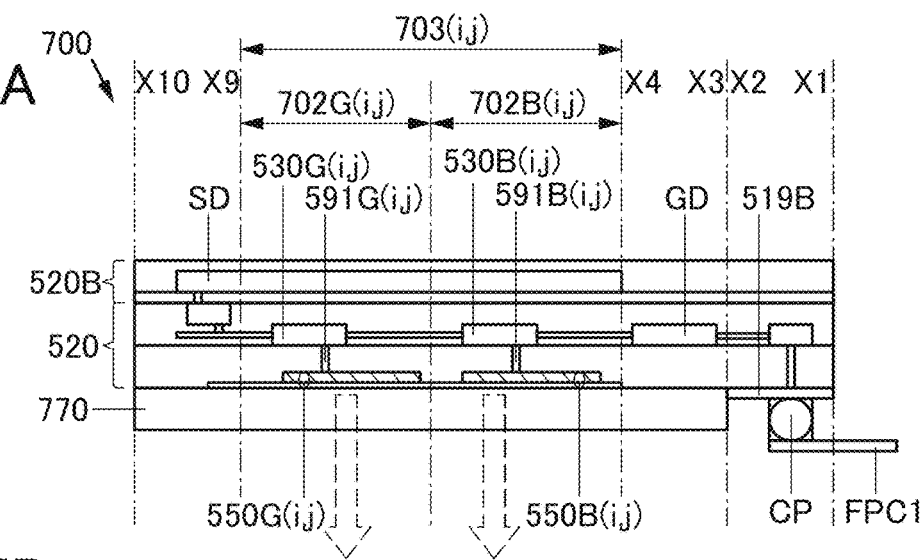
FIGS. 17A to 17C are cross-sectional views each illustrating a structure of a functional panel of one embodiment.
Figure 17B:
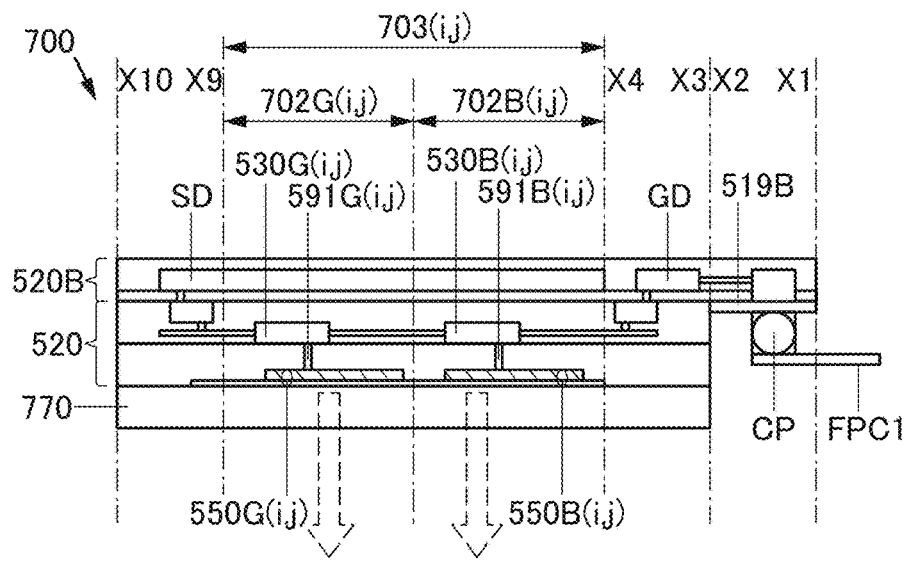
Figure 17C:
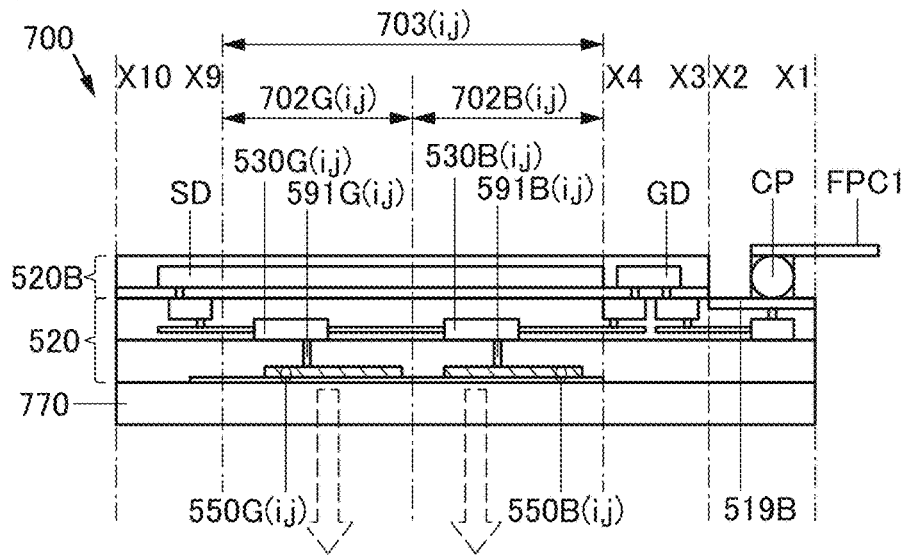

FIG. 17A illustrates a structure of the functional panel of one embodiment of the present invention, and illustrates a cross-section of the pixel set 703(i,j) and cross sections along the cutting lines X1-X2, X3-X4, and X9-X10 in FIG. 16. FIG. 17B illustrates a structure of the functional panel of one embodiment of the present invention, which is different from that in FIG. 17A. FIG. 17C illustrates a structure of the functional panel of one embodiment of the present invention, which is different from those in FIGS. 17A and 17B.

Figure 18A:
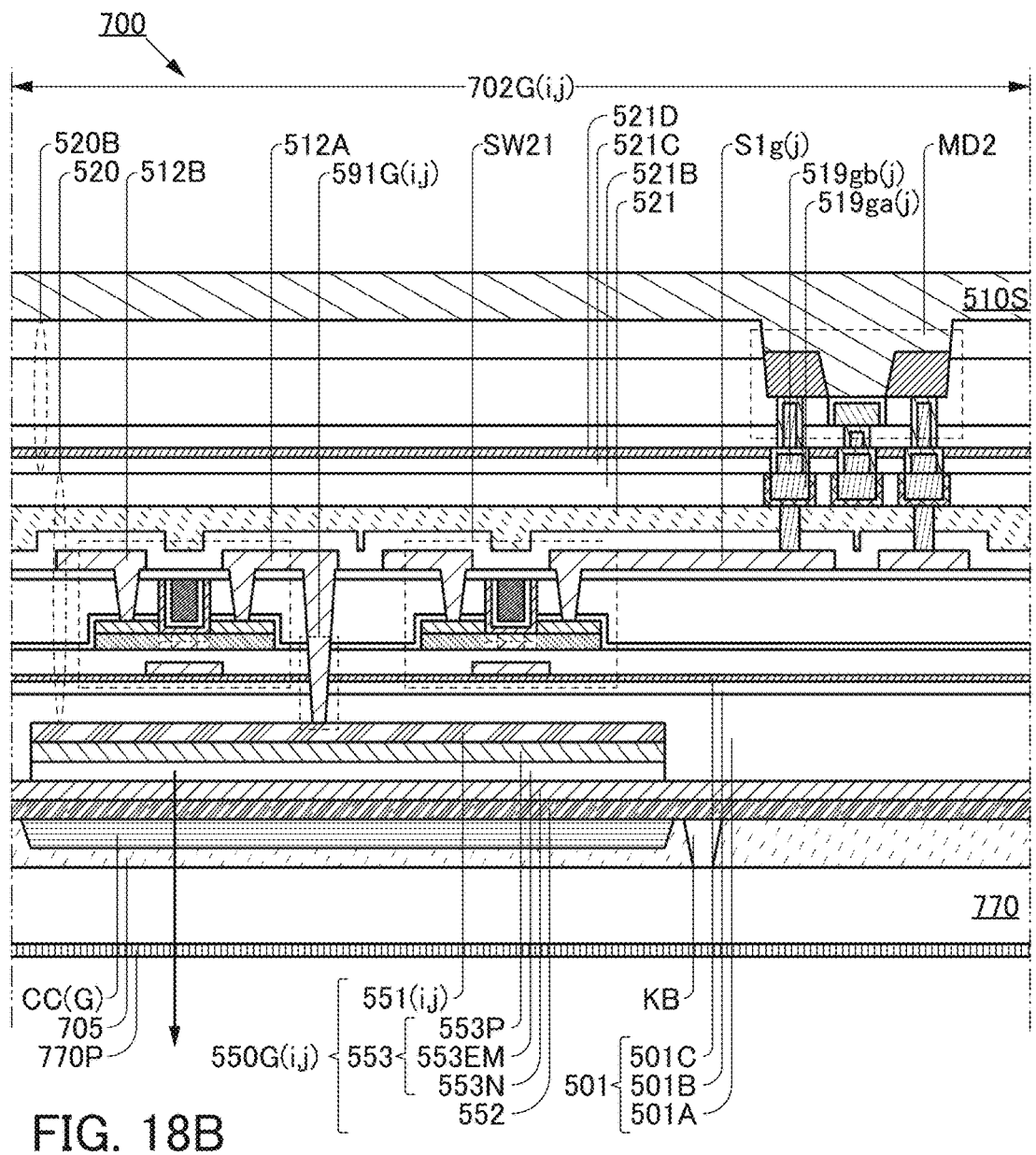
FIGS. 18A to 18C are cross-sectional views illustrating a structure of a functional panel of one embodiment.
Figure 18B:
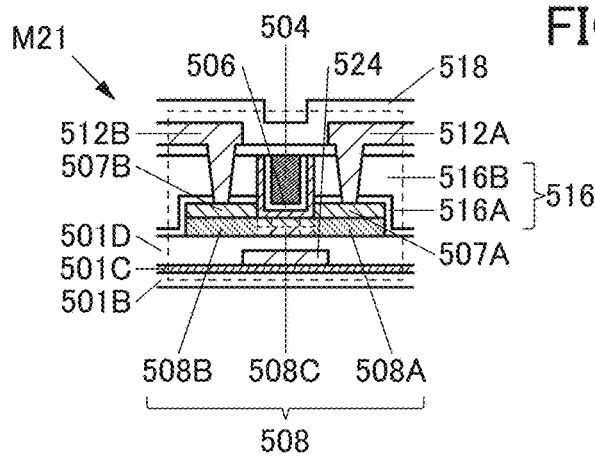
Figure 18C:
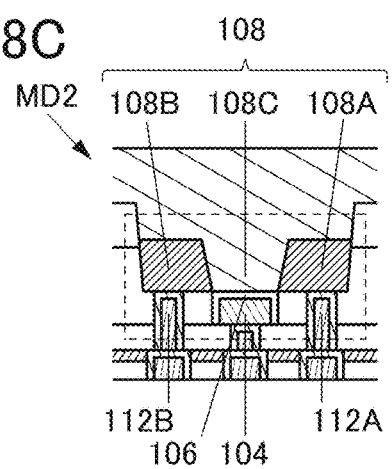

FIG. 18A illustrates a structure of the functional panel of one embodiment of the present invention and is a cross-sectional view of the pixel 702G(i,j) illustrated in FIG. 17B. FIG. 18B is a cross-sectional view illustrating part of FIG. 18A, and FIG. 18C is a cross-sectional view illustrating another part of FIG. 18A.

Figure 19:
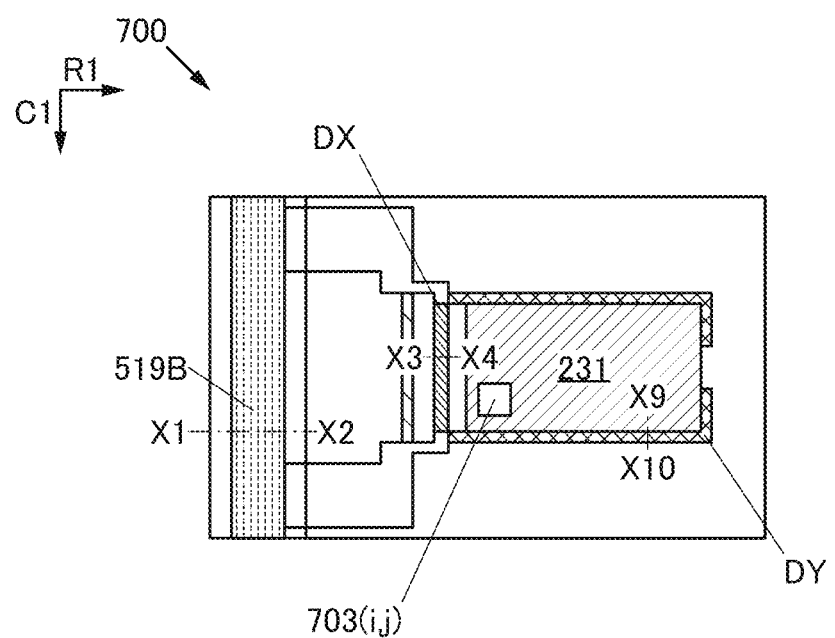
FIG. 19 illustrates a structure of a functional panel of one embodiment.

FIG. 19 is a block diagram of the functional panel of one embodiment of the present invention.

Figure 20:
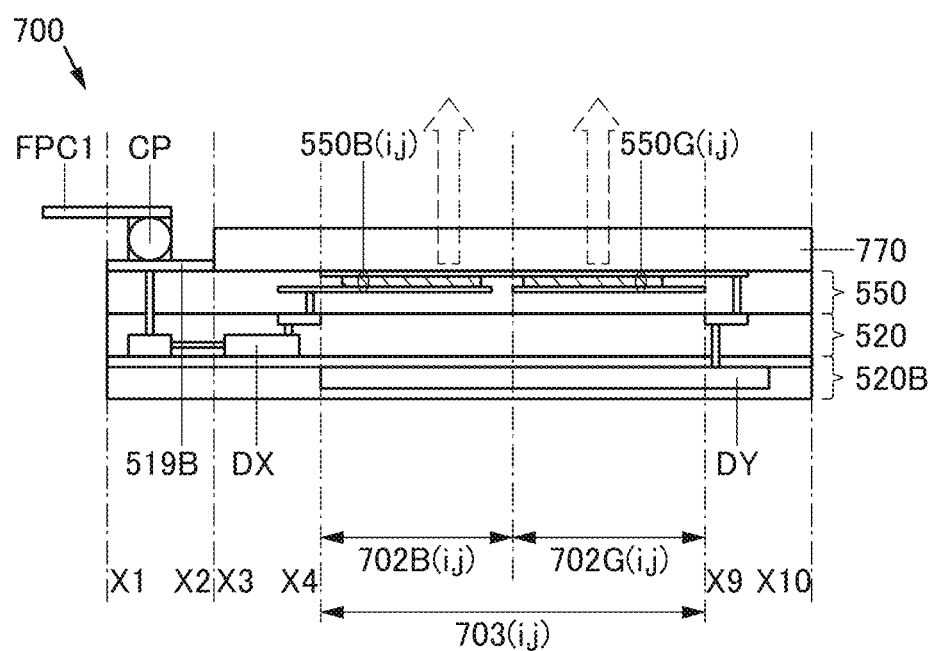
FIG. 20 is a cross-sectional view illustrating a structure of a functional panel of one embodiment.

FIG. 20 illustrates a structure of the functional panel of one embodiment of the present invention, and illustrates a cross-section of the pixel set 703(i,j) and cross sections along the cutting lines X1-X2, X3-X4, and X9-X10 in FIG. 19.

<Structure Example 1 of Functional Panel 700>

The functional panel 700 described in this embodiment includes a functional layer 520B (see FIG. 17A and FIG. 18A).

<<Structure Example 1 of Functional Layer 520B>>

The functional layer 520B includes a contact 519gb(j), the driver circuit SD, and an insulating film 521C (see FIG. 18A). The contact 519gb(j) is electrically connected to the driver circuit SD.

The functional layer 520B includes an insulating film 521D. The insulating film 521D includes a region positioned between the driver circuit SD and the insulating film 521C. As the insulating film 521D, a film containing silicon and nitrogen can be used, for example. Thus, diffusion of impurities into the driver circuit SD can be inhibited. Note that the impurities might cause a malfunction.

The driver circuit SD includes a transistor MD2, and the transistor MD2 includes a semiconductor containing a Group 14 element. As the transistor MD2, a transistor formed using a single crystal silicon substrate can be used, for example.

The transistor MD2 includes a semiconductor film 108, a conductive film 104, a conductive film 112A, and a conductive film 112B (see FIG. 18C).

The semiconductor film 108 includes a region 108A electrically connected to the conductive film 112A and a region 108B electrically connected to the conductive film 112B. The semiconductor film 108 includes a region 108C between the region 108A and the region 108B.

The conductive film 104 includes a region overlapping with the region 108C and has a function of a gate electrode.

An insulating film 106 includes a region positioned between the semiconductor film 108 and the conductive film 104. The insulating film 106 has a function of a gate insulating film.

The conductive film 112A has one of a function of a source electrode and a function of a drain electrode, and the conductive film 112B has the other.

<<Structure Example 1 of Functional Layer 520>>

The functional layer 520 includes an insulating film 521B and a contact 519ga(j) (see FIG. 18A).

The insulating film 521B includes a region positioned between the insulating film 521C and the insulating film 521. The insulating film 521B includes a region bonded to the insulating film 521C.

An insulating film containing silicon and oxygen can be used as the insulating film 521B and the insulating film 521C, for example. Thus, the insulating film 521B and the insulating film 521C can be bonded to each other by a surface activated bonding method, for example. Alternatively, the functional layer 520 and the functional layer 520B can be attached to each other.

The contact 519ga(j) is electrically connected to the contact 519gb(j) and the pixel circuit 530G(i,j).

For example, metal can be used for the contacts 519ga(j) and 519gb(j). Specifically, copper, gold, or the like can be used for the contacts 519ga(j) and 519gb(j).

Thus, the contacts 519ga(j) and 519gb(j) can be electrically connected to each other by a surface activated bonding method, for example. The conductive film S1g(j) can be electrically connected to the driver circuit SD. A pixel signal can be supplied using the driver circuit SD. A transistor using single crystal silicon as a semiconductor can be used for the driver circuit SD, for example. The driver circuit SD can be positioned to overlap with the pixel 702G(i,j), for example. The outer size of the functional panel can be reduced. The number of components can be reduced. As a result, a novel functional panel that is highly convenient, useful, or reliable can be provided.

<Structure Example 2 of Functional Panel 700>

Another structure of the functional panel of one embodiment of the present invention will be described with reference to FIG. 17B. Note that the structure example 2 of the functional panel is different from the structure of the functional panel described with reference to FIG. 17A in that the function layer 520B includes the driver circuit GD and the terminal 519B. Here, the differences will be described in detail below, and the above description is referred to for similar portions.

For example, a transistor including a semiconductor containing a Group 14 element can be used in the driver circuit GD. Specifically, a transistor containing single crystal silicon can be used in the driver circuit GD. Thus, the driver circuit GD can be downsized. Alternatively, the outer size of the functional panel can be reduced.

<Structure Example 3 of Functional Panel 700>

Another structure of the functional panel of one embodiment of the present invention will be described with reference to FIG. 17C. Note that the structure example 3 of the functional panel is different from the structure of the functional panel described with reference to FIG. 17A in that the functional layer 520B includes the driver circuit GD, and in the position of the terminal 519B.

<Structure Example 4 of Functional Panel 700>

Another structure of the functional panel of one embodiment of the present invention will be described with reference to FIG. 19 and FIG. 20.

Note that the structure example 4 of the functional panel is different from the structure of the functional panel described with reference to FIG. 17A in that the functional layer 520 includes a driver circuit DX, the functional layer 520B includes a driver circuit DY, and the element 550B(i,j) is passive-driven.

Note that this embodiment can be combined with any of the other embodiments in this specification as appropriate.

Embodiment 3

In this embodiment, a structure of the functional panel of one embodiment of the present invention will be described with reference to FIGS. 5A and 5B.

<Structure Example 1 of Functional Panel 700>

The functional panel 700 includes the pixel set 703(i,j), and the pixel set 703(i,j) includes the pixel 702G(i,j) and the pixel 702B(i,j) (see FIG. 1).

<<Structure Example 1 of Pixel 702B(i,j)>>

The pixel 702B(i,j) has a function of performing display using light emitted from the element 550B(i,j), and the element 550B(i,j) has a function of emitting light of the same color as the light emitted from the element 550G(i,j). For example, the element 550B(i,j) and the element 550G(i,j) have a function of emitting blue light.

<<Structure Example 2 of Pixel 702G(i,j)>>

The pixel 702G(i,j) includes the color conversion layer CC(G). The color conversion layer CC(G) has a function of converting the color of light emitted from the element 550G(i,j) into a different color.

Thus, the element 550B(i,j) can be formed in the same step as the element 550G(i,j). Alternatively, the pixel 702G(i,j) can display a color different from that of the pixel 702B(i,j). As a result, a novel functional panel that is highly convenient, useful, or reliable can be provided.

<<Structure Example 1 of Element 550G(i,j)>>

The element 550G(i,j) includes the electrode 551G(i,j), the electrode 552, and the layer 553 containing a light-emitting material (see FIG. 5A). The layer 553 containing a light-emitting material includes a region positioned between the electrode 551G(i,j) and the electrode 552.

For example, a mini-LED can be used as the element 550(i,j). Specifically, a mini-LED whose light-emitting region has an area of 1 mm² or less, preferably 50000 m² or less, further preferably 30000 μm² or less, still further preferably 10000 μm² or less and 200 μm² or more can be used as the element 550G(i,j).

Alternatively, a micro LED can be used as the element 550G(i,j). Specifically, a micro LED whose light-emitting region has an area of less than 200 μm², preferably 60 μm² or less, further preferably 15 μm² or less, still further preferably 5 μm² or less and 3 μm² or more can be used as the element 550G(i,j).

[Structure Example 1 of Layer 553 Containing Light-Emitting Material]

The layer 553 containing a light-emitting material includes the p-type clad layer 553P, the n-type clad layer 553N, and the light-emitting layer 553EM, for example. The light-emitting layer 553EM includes a region positioned between the p-type clad layer 553P and the n-type clad layer 553N. This allows carrier recombination in the light-emitting layer 553EM, resulting in light emission.

For example, a layered material for emitting blue light, green light, or red light can be used for the pixel. Specifically, a compound of gallium and phosphorus, a compound of gallium and arsenic, a compound of gallium, aluminum, and arsenic, a compound of aluminum, gallium, indium, and phosphorus, a compound of indium and gallium nitride, or the like can be used for the pixel.

In particular, an element emitting blue light can be used as the element 550G(i,j) and the element 550B(i,j). Thus, the element 550G(i,j) and the element 550B(i,j) can be formed in the same step.

Alternatively, an element emitting ultraviolet rays can be used as the element 550G(i,j) and the element 550B(i,j). A color conversion layer can be provided to overlap with the element 550B(i,j) to convert the ultraviolet rays into blue light.

<<Color Conversion Layer>>

The color conversion layer includes a region positioned between the base 770 and the element 550G(i,j).

For example, a material emitting light with a wavelength longer than that of incident light can be used for the color conversion layer. For example, a material that absorbs blue light or ultraviolet rays, converts it into green light, and emits green light; a material that absorbs blue light or ultraviolet rays, converts it into red light, and emits red light; or a material that absorbs ultraviolet rays, converts it into blue light, and emits blue light can be used for the color conversion layer. For example, a phosphor can be used for the color conversion layer. Specifically, quantum dots with a diameter of several nanometers can be used for the color conversion layer. Thus, light with a narrow spectral half-width can be emitted. Alternatively, light with high saturation can be emitted.

<Structure Example 2 of Functional Panel 700>

The functional panel 700 includes a functional film 770P and the like (see FIG. 5A).

<<Functional Film 770P and the Like>>

The functional film 770P includes a region overlapping with the element 550G(i,j).

For example, an anti-reflection film, a polarizing film, a retardation film, a light diffusion film, a condensing film, or the like can be used as the functional film 770P.

For example, an anti-reflection film with a thickness of 1 μm or less can be used as the functional film 770P. Specifically, a stacked-layer film in which three or more, preferably five or more, further preferably 15 or more dielectrics are stacked can be used as the functional film 770P. This allows the reflectivity to be as low as 0.5% or less, preferably 0.08% or less.

For example, a circularly polarizing film can be used as the functional film 770P.

Furthermore, an antistatic film preventing the attachment of a foreign substance, a water repellent film preventing stains, an oil repellent film preventing stains, an anti-reflection film, an anti-glare (non-glare) film, a hard coat film inhibiting a scratch in use, a self-healing film that self-heals from scratches, or the like can be used as the functional film 770P.

Note that this embodiment can be combined with any of the other embodiments in this specification as appropriate.

Embodiment 4

In this embodiment, a structure of the functional panel of one embodiment of the present invention will be described with reference to FIG. 7.

Figure 7:
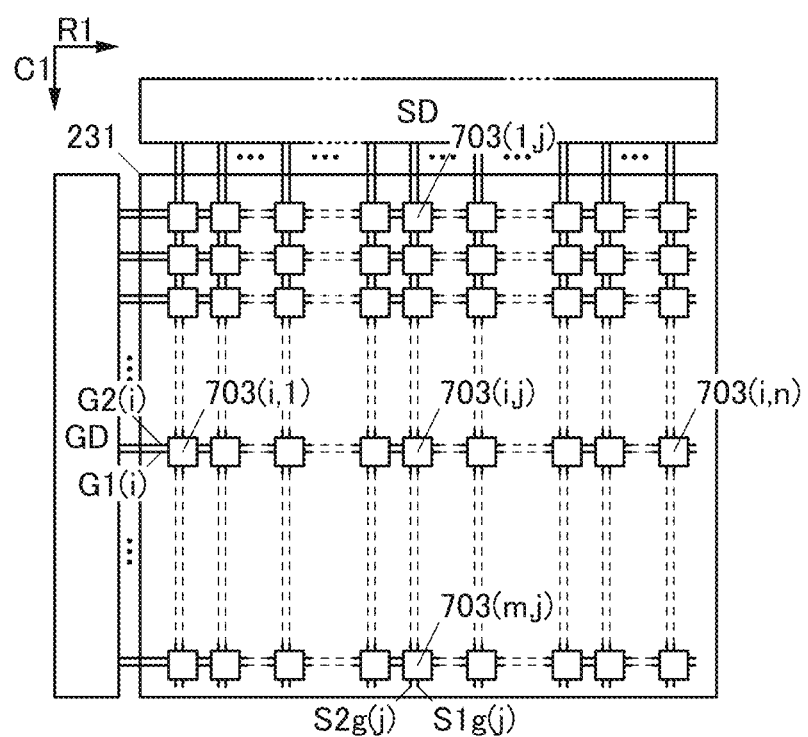
FIG. 7 illustrates a structure of a functional panel of one embodiment.

FIG. 7 is a block diagram illustrating a structure of the functional panel of one embodiment of the present invention.

<Structure Example 1 of Functional Panel 700>

The functional panel 700 described in this embodiment includes a region 231 (see FIG. 7).

<<Structure Example 1 of Region 231>>

The region 231 includes a group of pixel sets 703($i$,1) to 703($i$,$n$) and another group of pixel sets 703(1,$j$) to 703($m$,$j$). The region 231 includes the conductive film G1($i$) and the conductive film S1$g$($j$).

The group of pixel sets 703($i$,1) to 703($i$,$n$) is arranged in the row direction (the direction indicated by an arrow R1 in FIG. 7) and includes the pixel set 703($i$,$j$).

Furthermore, the group of pixel sets 703($i$,1) to 703($i$,$n$) is electrically connected to the conductive film G1($i$). Furthermore, the group of pixel sets 703($i$,1) to 703($i$,$n$) is electrically connected to the conductive film G2($i$).

The another group of pixel sets 703(1,$j$) to 703($m$,$j$) is arranged in the column direction intersecting the row direction (the direction indicated by an arrow C1 in FIG. 7) and includes the pixel set 703($i$,$j$).

The another group of pixel sets 703(1,$j$) to 703($m$,$j$) is electrically connected to the conductive film S1$g$($j$). The another group of pixel sets 703(1,$j$) to 703($m$,$j$) is electrically connected to the conductive film S2$g$($j$).

Thus, image data can be supplied to a plurality of pixels. Alternatively, imaging data can be obtained from a plurality of pixels. As a result, a novel functional panel that is highly convenient, useful, or reliable can be provided.

<<Structure Example 2 of Region 231>>

The region 231 includes 600 or more pixel sets per inch, for example. Note that the plurality of pixel sets include the pixel set 703($i$,$j$). The region 231 preferably includes 1000 or more pixel sets, further preferably 3000 or more pixel sets, still further preferably 6000 or more pixel sets per inch. This can reduce the screen-door effect.

<<Structure Example 3 of Region 231>>

The region 231 includes a plurality of pixel sets in a matrix. For example, the region 231 includes 7600 or more pixel sets in the row direction and 4300 or more pixel sets in the column direction. Specifically, the region 231 includes 7680 pixel sets in the row direction and 4320 pixel sets in the column direction.

Such a structure makes it possible to display a high-definition image. As a result, a novel functional panel that is highly convenient or reliable is provided.

Note that this embodiment can be combined with any of the other embodiments in this specification as appropriate.

Embodiment 5

In this embodiment, a structure of a display device of one embodiment of the present invention will be described with reference to FIGS. 8A to 8D.

Figure 8A:
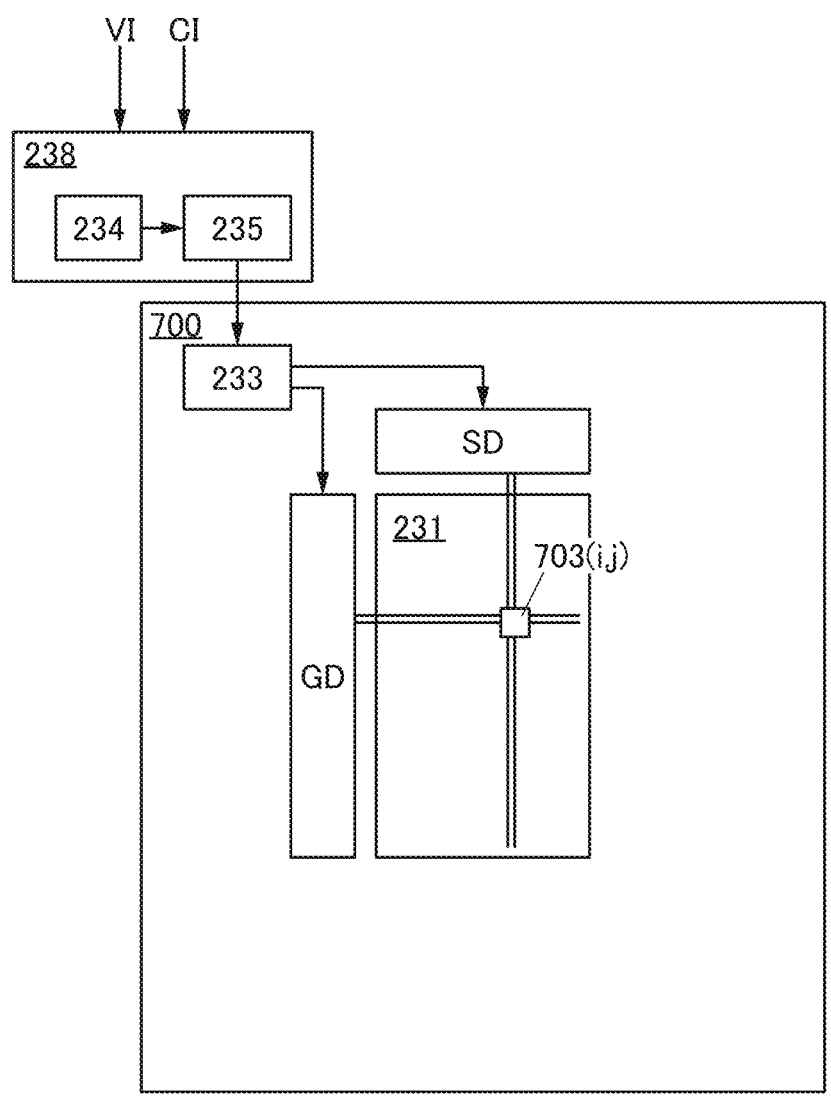
FIGS. 8A to 8D illustrate structures of display devices of embodiments.
Figure 8B:
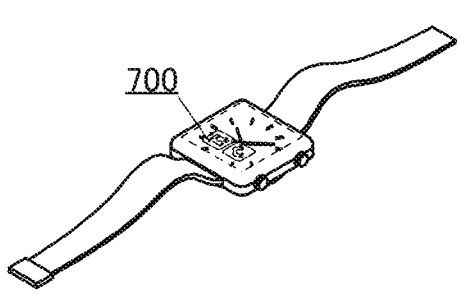
Figure 8C:
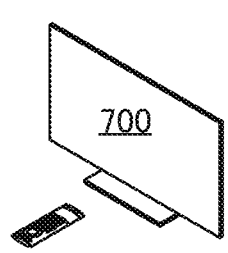
Figure 8D:
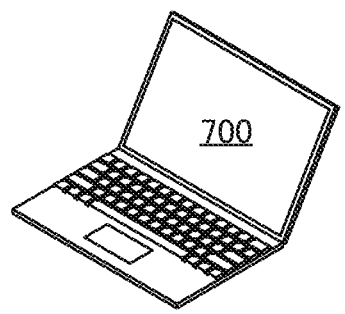

FIG. 8A is a block diagram of a display device of one embodiment of the present invention, and FIGS. 8B to 8D are perspective views each illustrating the appearance of a display device of one embodiment of the present invention.

<Structure Example of Display Device>

The display device described in this embodiment includes a control unit 238 and the functional panel 700 (see FIG. 8A).

<<Structure example 1 of control unit 238>>

The control unit 238 is supplied with image data VI and control data CI. For example, a clock signal, a timing signal, or the like can be used as the control data CI.

The control unit 238 generates data on the basis of the image data VI and generates a control signal on the basis of the control data CI. Moreover, the control unit 238 supplies the data and the control signal.

For example, the data includes gray levels of 8 bits or more, preferably 12 bits or more. A clock signal, a start pulse, or the like of a shift register used in a driver circuit, for example, can be used as the control signal.

<<Structure Example 2 of Control Unit 238>>

For example, a decompression circuit 234 and an image processing circuit 235 can be used in the control unit 238.

<<Decompression Circuit 234>>

The decompression circuit 234 has a function of decompressing the image data VI that is supplied in a compressed state. The decompression circuit 234 includes a memory unit. The memory unit has a function of storing decompressed image data, for example.

<<Image Processing Circuit 235>>

The image processing circuit 235 includes a memory region, for example. The memory region has a function of storing data contained in the image data VI, for example.

The image processing circuit 235 has a function of generating data by correcting the image data VI on the basis of a predetermined characteristics curve and a function of supplying the data, for example.

<<Structure Example 1 of Functional Panel 700>>

The functional panel 700 is supplied with the data and the control signal. For example, the functional panel 700 described in any one of Embodiments 1 to 4 can be used.

<<Structure Example 3 of Pixel Set 703($i$,$j$)>>

The pixel set 703($i$,$j$) performs display on the basis of the data.

Thus, the image data VI can be displayed using the element 550G($i$,$j$). Consequently, a novel display device that is highly convenient, useful, or reliable can be provided. For example, an information terminal (see FIG. 8B), a video display system (see FIG. 8C), or a computer (see FIG. 8D) can be provided.

<<Structure Example 2 of Functional Panel 700>>

For example, the functional panel 700 includes driver circuits and control circuits.

<<Driver Circuit>>

The driver circuit operates on the basis of the control signal. The use of the control signal enables a plurality of driver circuits to operate in synchronization with each other (see FIG. 8A).

For example, the driver circuit GD can be used in the functional panel 700. The driver circuit GD is supplied with the control signal and has a function of supplying a first selection signal.

For example, a driver circuit SD can be used in the functional panel 700. The driver circuit SD is supplied with the control signal and the data, and can supply an image signal.

<<Control Circuit>>

A control circuit has a function of generating and supplying the control signal. For example, a clock signal, a timing signal, or the like can be used as the control signal.

Specifically, a control circuit formed over a rigid substrate can be used in the functional panel. Alternatively, a control circuit formed over a rigid substrate can be electrically connected to the control unit 238 with the use of a flexible printed circuit.

<<Control Circuit 233>>

A timing controller can be used as the control circuit, for example.

Note that this embodiment can be combined with any of the other embodiments in this specification as appropriate.

Embodiment 6

In this embodiment, a structure of an input/output device of one embodiment of the present invention will be described with reference to FIG. 9.

Figure 9:
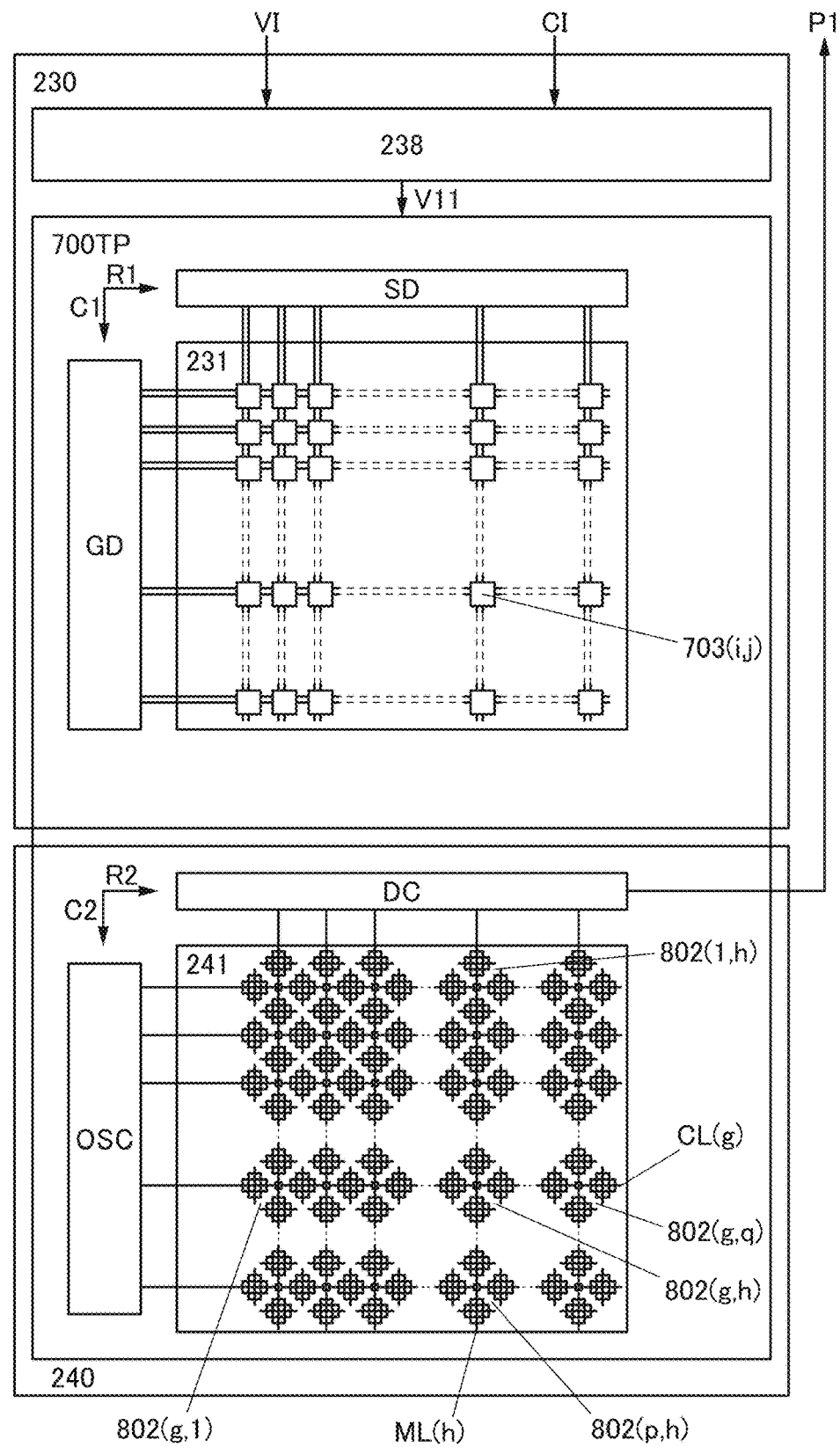
FIG. 9 is a block diagram illustrating a structure of an input/output device of one embodiment.

FIG. 9 is a block diagram illustrating a structure of an input/output device of one embodiment of the present invention.

<Structure Example 1 of Input/Output Device>

The input/output device described in this embodiment includes an input unit 240 and a display unit 230 (see FIG. 9).

<<Structure Example 1 of Display Unit 230>>

The display unit 230 includes the functional panel 700. For example, the functional panel 700 described in any one of Embodiments 1 to 4 can be used as the display unit 230. Note that the panel including the input unit 240 and the display unit 230 can be referred to as a functional panel 700TP.

<<Structure Example 1 of Input Unit 240>>

The input unit 240 includes a sensing region 241. The input unit 240 senses an object approaching the sensing region 241.

The sensing region 241 includes a region overlapping with the pixel set 703(i,j).

Accordingly, an object that approaches the region overlapping with the display unit can be sensed while image data is displayed using the display unit 230. Alternatively, a finger or the like that approaches the display unit 230 can be used as a pointer to input positional data. Alternatively, positional data can be associated with image data displayed on the display unit 230. Consequently, a novel input/output device that is highly convenient, useful, or reliable can be provided.

<<Structure Example 1 of Sensing Region 241>>

The sensing region 241 can include one or more sensors, for example.

The sensing region 241 includes a group of sensors 802(g,1) to 802(g,q) and another group of sensors 802(1,h) to 802(p,h). Note that g is an integer greater than or equal to 1 and less than or equal top, h is an integer greater than or equal to 1 and less than or equal to q, and each of p and q is an integer greater than or equal to 1.

The group of sensors 802(g,1) to 802(g,q) includes the sensor 802(g,h), is arranged in the row direction (the direction indicated by an arrow R2 in FIG. 9), and is electrically connected to a wiring CL(g). Note that the direction indicated by the arrow R2 may be the same as or different from the direction indicated by the arrow R1.

The another group of sensors 802(1,h) to 802(p,h) includes the sensor 802(g,h), is arranged in the column direction intersecting the row direction (the direction indicated by the arrow C2 in FIG. 9), and is electrically connected to a wiring ML(h).

<<Sensor>>

The sensor has a function of sensing an approaching pointer. For example, a finger or a stylus pen can be used as the pointer. For example, a piece of metal or a coil can be used as the stylus pen.

Specifically, a capacitive proximity sensor, an electromagnetic inductive proximity sensor, an optical proximity sensor, a resistive proximity sensor, or the like can be used as the sensor.

Alternatively, a plurality of kinds of sensors can be used in combination. For example, a sensor that senses a finger and a sensor that senses a stylus pen can be used in combination.

Accordingly, the kind of a pointer can be identified. Alternatively, a different instruction can be associated with sensing data on the basis of the kind of the identified pointer. Specifically, when a finger is identified as being used as the pointer, sensing data can be associated with a gesture. Meanwhile, when a stylus pen is identified as being used as the pointer, sensing data can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

<<Structure Example 2 of Input Unit 240>>

The input unit 240 can include an oscillator circuit OSC and a sensor circuit DC (see FIG. 9).

The oscillator circuit OSC supplies a search signal to the sensor 802(g,h). For example, a rectangular wave, a sawtooth wave, a triangular wave, or a sine wave can be used as the search signal.

The sensor 802(g,h) generates and supplies a sensing signal that changes in accordance with the search signal and the distance to a pointer approaching the sensor 802(g,h).

The sensor circuit DC supplies input data in accordance with the sensing signal.

Accordingly, the distance from an approaching pointer to the sensing region 241 can be sensed. Alternatively, the position in the sensing region 241 where the pointer comes the closest can be sensed.

Note that this embodiment can be combined with any of the other embodiments in this specification as appropriate.

Embodiment 7

In this embodiment, a structure of a data processing device of one embodiment of the present invention will be described with reference to FIGS. 10A to 10C, FIGS. 11A and 11B, and FIGS. 12A to 12C.

Figure 10A:
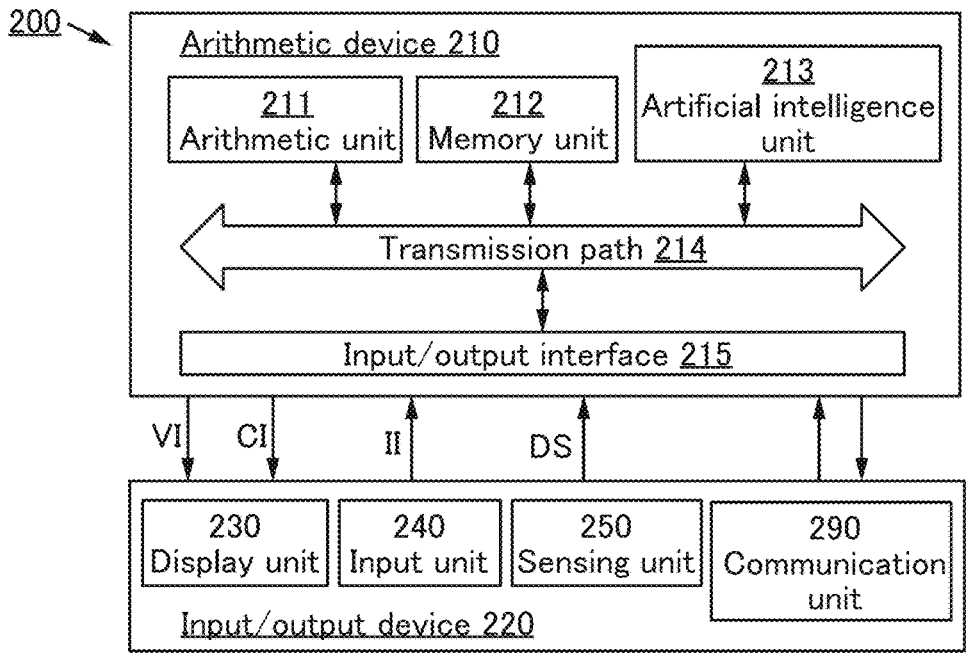
FIGS. 10A to 10C are a block diagram and projection views illustrating structures of data processing devices of embodiments.
Figure 10B:
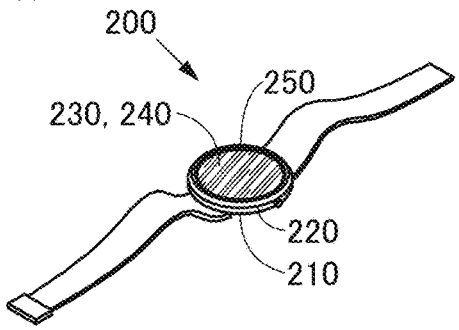
Figure 10C:
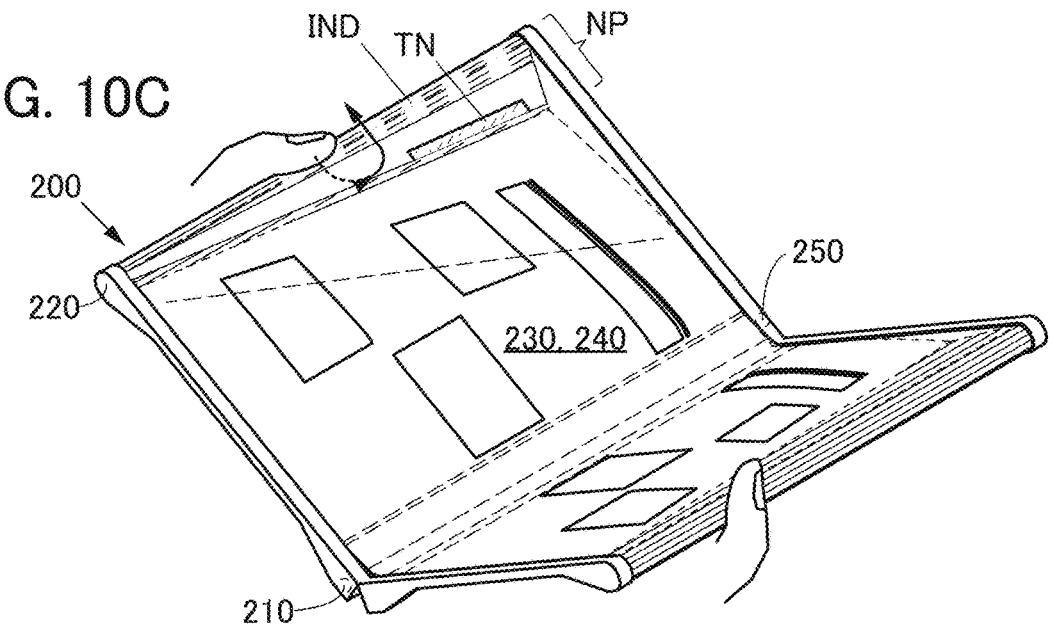

FIG. 10A is a block diagram illustrating a structure of a data processing device of one embodiment of the present invention. FIGS. 10B and 10C are projection views each illustrating an example of the appearance of a data processing device.

Figure 11A:
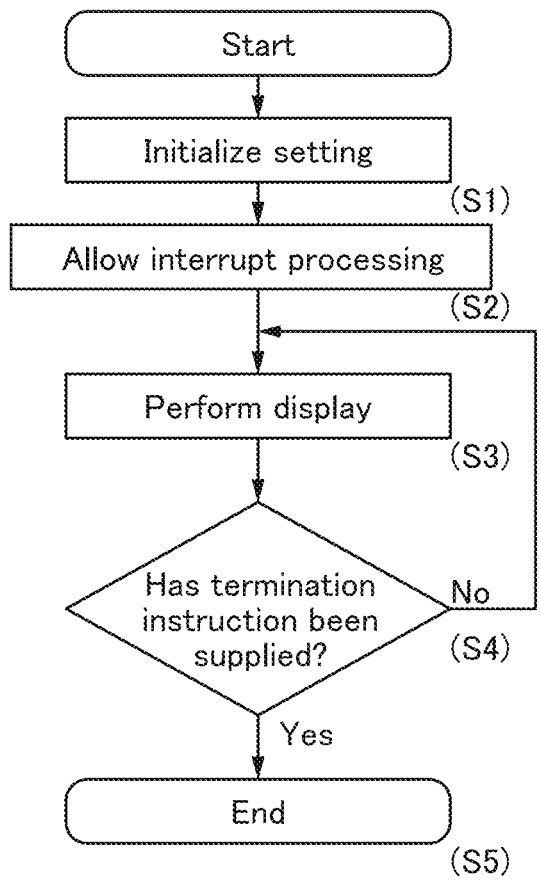
FIGS. 11A and 11B are flow charts showing a method for driving a data processing device of one embodiment.
Figure 11B:
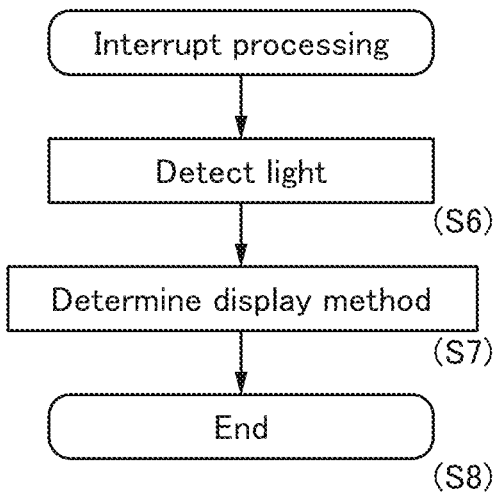

FIGS. 11A and 11B are flow charts showing a program of one embodiment of the present invention. FIG. 11A is a flow chart showing main processing of the program of one embodiment of the present invention, and FIG. 11B is a flow chart showing interrupt processing.

Figure 12A:
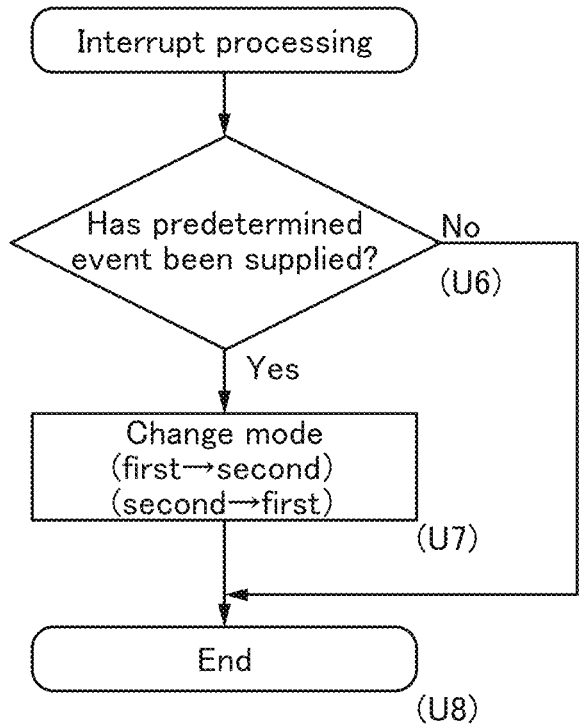
FIGS. 12A to 12C show a method for driving a data processing device of one embodiment.
Figure 12B:
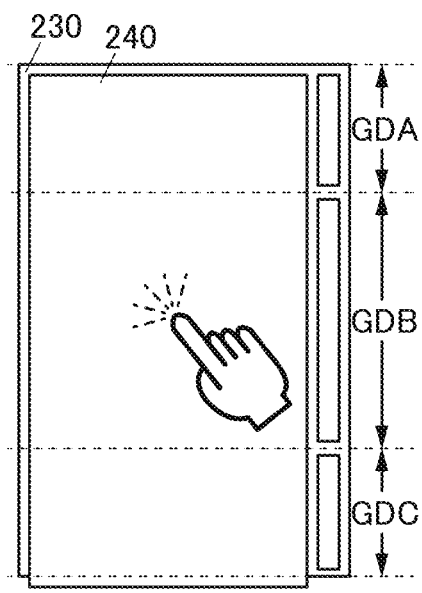
Figure 12C:
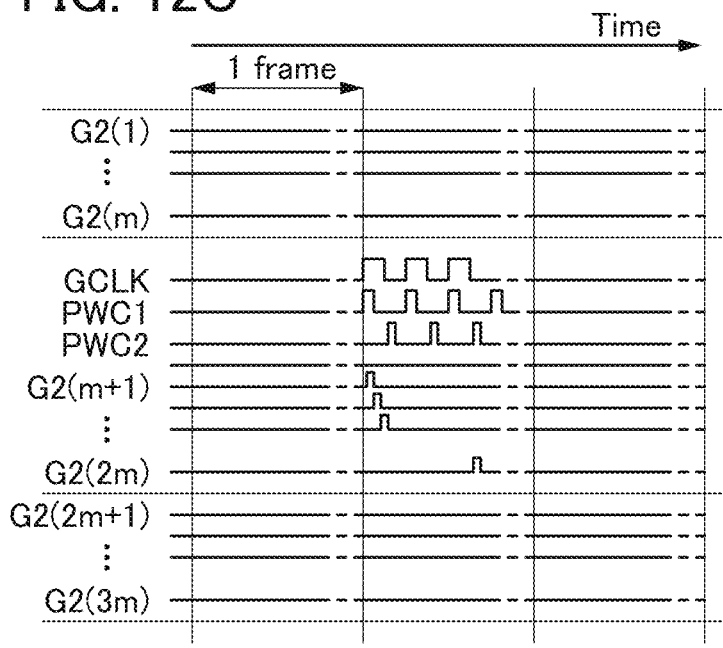

FIGS. 12A to 12C illustrate a program of one embodiment of the present invention. FIG. 12A is a flow chart showing interrupt processing of the program of one embodiment of the present invention. FIG. 12B is a schematic view illustrating handling of a data processing device, and FIG. 12C is a timing chart showing operation of the data processing device of one embodiment of the present invention.

<Structure Example 1 of Data Processing Device>

The data processing device described in this embodiment includes an arithmetic device 210 and an input/output device 220 (see FIG. 10A). The input/output device 220 is electrically connected to the arithmetic device 210. The data processing device 200 can include a housing (see FIG. 10B and FIG. 10C).

<<Structure Example 1 of Arithmetic Device 210>>

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic unit 211 and a memory unit 212. The arithmetic device 210 also includes a transmission path 214 and an input/output interface 215.

The transmission path 214 is electrically connected to the arithmetic unit 211, the memory unit 212, and the input/output interface 215.

<<Arithmetic Unit 211>>

The arithmetic unit 211 has a function of executing a program, for example.

<<Memory Unit 212>>

The memory unit 212 has a function of, for example, storing a program executed by the arithmetic unit 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and receiving data. For example, the input/output interface 215 can be electrically connected to the transmission path 214. Moreover, the input/output interface 215 can be electrically connected to the input/output device 220.

The transmission path 214 includes a wiring and has a function of supplying data and receiving data. For example, the transmission path 214 can be electrically connected to the input/output interface 215. In addition, the transmission path 214 can be electrically connected to the arithmetic unit 211, the memory unit 212, or the input/output interface 215.

<<Structure Example of Input/Output Device 220>>

The input/output device 220 supplies the input data II and the sensing data DS. The input/output device 220 is supplied with the control data CI and the image data VI (see FIG. 10A).

For example, a keyboard scan code, positional data, data on button handling, sound data, or image data can be used as the input data II. For example, data on illuminance, attitude, acceleration, direction, pressure, temperature, or humidity of the environment where the data processing device 200 is used, for example, can be used as the sensing data DS.

For example, a signal for controlling the luminance, a signal for controlling the color saturation, or a signal for controlling the hue to display the image data VI can be used as the control data CI. Alternatively, a signal for changing part of display based on the image data VI can be used as the control data CI.

The input/output device 220 includes the display unit 230, the input unit 240, and a sensor unit 250. For example, the input/output device described in Embodiment 6 can be used as the input/output device 220. The input/output device 220 can include a communication unit 290.

<<Structure Example of Display Unit 230>>

The display unit 230 displays the image data VI on the basis of the control data CI. The display device described in Embodiment 5 can be used for the display unit 230, for example.

<<Structure Example of Input Unit 240>>

The input unit 240 generates the input data II. The input unit 240 has a function of supplying positional data, for example.

For example, a human interface or the like can be used as the input unit 240 (see FIG. 10A). Specifically, a keyboard, a mouse, a touch sensor, a microphone, a camera, or the like can be used as the input unit 240.

A touch sensor having a region overlapping with the display unit 230 can be used. Note that an input/output device that includes the display unit 230 and a touch sensor having a region overlapping with the display unit 230 can be referred to as a touch panel or a touch screen.

For example, a user can make various gestures (e.g., tap, drag, swipe, and pinch in) using a finger on the touch panel as a pointer.

The arithmetic device 210, for example, analyzes data on the position, track, or the like of the finger on the touch panel and determines that a predetermined gesture is supplied when the analysis results meet predetermined conditions. Therefore, the user can supply a certain operating instruction associated with a predetermined gesture by using the gesture.

For example, the user can supply a scrolling instruction for changing the position where image data is displayed, by using a gesture of touching and moving a finger on the touch panel.

The user can supply a dragging instruction for pulling out and displaying a navigation panel NP at an edge portion of the region 231, by using a gesture of moving a finger touching the edge portion of the region 231 (see FIG. 10C). Moreover, the user can supply a leafing through instruction for displaying index images IND, some parts of other pages, or thumbnail images TN of other pages in a predetermined order on the navigation panel NP so that the user can flip through these images, by using a gesture of moving the position where a finger presses hard or by using the pressure of pressing the finger. Consequently, the user can turn the pages of an e-book reader like flipping through the pages of a paper book. Moreover, the user can search a given page with the aid of the thumbnail images TN or the index images IND.

<<Structure Example of Sensor Unit 250>>

The sensor unit 250 generates the sensing data DS. The sensor unit 250 has a function of sensing the illuminance of the environment where the data processing device 200 is used and a function of supplying illuminance data, for example.

The sensor unit 250 has a function of sensing the ambient conditions and supplying the sensing data. Specifically, the sensor unit 250 can supply data on illuminance, attitude, acceleration, direction, pressure, temperature, humidity, or the like.

For example, a photosensor, an attitude sensor, an acceleration sensor, a direction sensor, a global positioning system (GPS) signal receiving circuit, a pressure-sensitive switch, a pressure sensor, a temperature sensor, a humidity sensor, or a camera can be used as the sensor unit 250.

<<Communication Unit 290>>

The communication unit 290 has a function of supplying data to a network and acquiring data from a network.

<<Housing>>

The housing has a function of housing the input/output device 220 or the arithmetic device 210. Alternatively, the housing has a function of supporting the display unit 230 or the arithmetic device 210.

Accordingly, the control data CI can be generated on the basis of the input data II or the sensing data DS. Alternatively, the image data VI can be displayed on the basis of the input data II or the sensing data DS. Alternatively, the data processing device is capable of operating with knowledge of the intensity of light that the housing of the data processing device receives in the environment where the data processing device is used. Alternatively, the user of the data processing device can select a display method. Consequently, a novel data processing device that is highly convenient, useful, or reliable can be provided.

Note that in some cases, these components cannot be clearly distinguished from each other and one component may also serve as another component or include part of another component. For example, a touch panel in which a touch sensor overlaps with a display panel serves as an input unit as well as a display unit.

<<Structure Example 2 of Arithmetic Device 210>>

The arithmetic device 210 includes an artificial intelligence unit 213 (see FIG. 10A).

The artificial intelligence unit 213 is supplied with the input data II or the sensing data DS, and infers the control data CI on the basis of the input data II or the sensing data DS. Moreover, the artificial intelligence unit 213 supplies the control data CI.

In this manner, the control data CI for performing display which the user finds suitable can be generated. Alternatively, it is possible to perform display which the user finds suitable. Alternatively, the control data CI for performing display which the user finds comfortable can be generated. Alternatively, it is possible to perform display which the user finds comfortable. Consequently, a novel data processing device that is highly convenient, useful, or reliable can be provided.

[Natural Language Processing on Input Data II]

Specifically, the artificial intelligence unit 213 can perform natural language processing on the input data II and extract one feature from the whole input data II. For example, the artificial intelligence unit 213 can infer emotion or the like in the input data II and regard the inference as a feature. The artificial intelligence unit 213 can also infer the color, design, font, or the like empirically felt suitable for the feature. The artificial intelligence unit 213 can also generate data specifying the color, design, or font of a letter or data specifying the color or design of the background, and use the generated data as the control data CI.

Specifically, the artificial intelligence unit 213 can perform natural language processing on the input data II and extract some words included in the input data II. For example, the artificial intelligence unit 213 can extract expressions including a grammatical error, a factual error, emotion, or the like. Moreover, the artificial intelligence unit 213 can generate data for displaying extracted part in the color, design, font, or the like different from those of another part, and use the generated data as the control data CI.

[Image Processing on Input Data II]

Specifically, the artificial intelligence unit 213 can perform image processing on the input data II and extract one feature from the input data II. For example, the artificial intelligence unit 213 can infer the age where the input data II was captured, whether the input data II was captured indoors or outdoors, or whether the input data II was captured in the daytime or at night, for example, and regard the inference as a feature. The artificial intelligence unit 213 can also infer the color tone empirically felt suitable for the feature and generate the control data CI for using the color tone for display. Specifically, data specifying color (e.g., full color, monochrome, or sepia) used for expressing a gradation can be used as the control data CI.

Specifically, the artificial intelligence unit 213 can perform image processing on the input data II and extract some images included in the input data II. For example, the artificial intelligence unit 213 can generate the control data CI for displaying a boundary between one part and another part of the extracted image. Specifically, the artificial intelligence unit 213 can generate the control data CI for displaying a rectangle surrounding part of the extracted image.

[Inference Using Sensing Data DS]

Specifically, the artificial intelligence unit 213 can make inference with the use of the sensing data DS. Alternatively, the artificial intelligence unit 213 can generate the control data CI on the basis of the inference so that the user of the data processing device 200 can feel comfortable.

Specifically, the artificial intelligence unit 213 can generate the control data CI for adjusting display brightness on the basis of the ambient illuminance or the like to provide comfortable display brightness. The artificial intelligence unit 213 can also generate the control data CI for adjusting volume on the basis of the ambient noise or the like to provide comfortable volume.

As the control data CI, a clock signal, a timing signal, or the like that is supplied to the control unit 238 included in the display unit 230 can be used. A clock signal, a timing signal, or the like that is supplied to a control unit included in the input unit 240 can also be used as the control data CI.

<Structure Example 2 of Data Processing Device>

Another structure of the data processing device of one embodiment of the present invention will be described with reference to FIGS. 11A and 11B.

<<Program>>

A program of one embodiment of the present invention includes the following steps (see FIG. 11A).

[First Step]

In a first step, the setting is initialized (see S1 in FIG. 11A).

For example, predetermined image data that is to be displayed on start-up and data for determining a predetermined mode of displaying the image data and a predetermined method of displaying the image data are acquired from the memory unit 212. Specifically, still image data or moving image data can be used as the predetermined image data. Furthermore, a first mode or a second mode can be used as the predetermined mode.

[Second Step]

In a second step, interrupt processing is allowed (see S2 in FIG. 11A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is always ready to be executed after the program is started up.

[Third Step]

In a third step, image data is displayed in a predetermined mode or a predetermined display method selected in the first step or the interrupt processing (see S3 in FIG. 11A). Note that the predetermined mode identifies a mode for displaying data, and the predetermined display method identifies a method of displaying the data. For example, the image data VI can be used as data to be displayed.

For example, one method of displaying the image data VI can be associated with the first mode. Another method of displaying the image data VI can be associated with the second mode. Thus, a display method can be selected on the basis of the selected mode.

<<First Mode>>

Specifically, a method of supplying selection signals to a scan line at a frequency of 30 Hz or more, preferably 60 Hz or more and performing display in accordance with the selection signals can be associated with the first mode.

For example, the supply of selection signals at a frequency of 30 Hz or more, preferably 60 Hz or more enables motion in a moving image to be displayed smoothly.

For example, refreshing an image at a frequency of 30 Hz or more, preferably 60 Hz or more allows the data processing device 200 that the user is using to display an image smoothly following the user's operation.

<<Second Mode>>

Specifically, a method of supplying selection signals to a scan line at a frequency less than 30 Hz, preferably less than 1 Hz, further preferably less than once a minute and performing display in accordance with the selection signals can be associated with the second mode.

The supply of selection signals at a frequency less than 30 Hz, preferably less than 1 Hz, further preferably less than once a minute allows display with flickering reduced. Furthermore, power consumption can be reduced.

For example, when the data processing device 200 is used in a clock or a watch, the display can be refreshed once a second, once a minute, or the like.

[Fourth Step]

In a fourth step, the program moves to a fifth step when a termination instruction has been supplied, whereas the program moves to the third step when the termination instruction has not been supplied (see S4 in FIG. 11A).

For example, a termination instruction supplied in the interrupt processing can be used to determine the next step.

[Fifth Step]

In the fifth step, the program terminates (see S5 in FIG. 11A).

<<Interrupt Processing>>

The interrupt processing includes sixth to eighth steps described below (see FIG. 11B).

[Sixth Step]

In the sixth step, the illuminance of the environment where the data processing device 200 is used is sensed using the sensor unit 250, for example (see S6 in FIG. 11B). Note that the color temperature or chromaticity of ambient light may be sensed instead of the illuminance of the environment.

[Seventh Step]

In the seventh step, a display method is determined on the basis of the sensed illuminance data (see S7 in FIG. 11B). For example, a display method is determined such that the brightness of display is not too bright or too dark.

In the case where the color temperature or chromaticity of the ambient light is sensed in the sixth step, the color of display may be adjusted.

[Eighth Step]

In the eighth step, the interrupt processing terminates (see S8 in FIG. 11B).

<Structure Example 3 of Data Processing Device>

Another structure of the data processing device of one embodiment of the present invention will be described with reference to FIGS. 12A to 12C.

FIG. 12A is a flow chart showing a program of one embodiment of the present invention. The interrupt processing in the flow chart in FIG. 12A is different from that in FIG. 11B.

Note that the structure example 3 of the data processing device is different from the interrupt processing in FIG. 11B in that the interrupt processing includes a step of changing a mode on the basis of a supplied predetermined event. Here, the differences will be described in detail below, and the above description is referred to for similar portions.

<<Interrupt Processing>>

The interrupt processing includes the following sixth to eighth steps (see FIG. 12A).

[Sixth Step]

In the sixth step, the processing proceeds to the seventh step when a predetermined event has been supplied, whereas the processing proceeds to the eighth step when the predetermined event has not been supplied (see U6 in FIG. 12A). For example, whether the predetermined event is supplied in a predetermined period or not can be a branch condition. Specifically, the predetermined period can be a period longer than 0 seconds and 5 seconds or less, 1 second or less, 0.5 seconds or less, preferably 0.1 seconds or less.

[Seventh Step]

In the seventh step, the mode is changed (see U7 in FIG. 12A). Specifically, the mode is changed from the first mode to the second mode, or the mode is changed from the second mode to the first mode.

For example, a display mode of part of a region in the display unit 230 can be changed. Specifically, it is possible to change a display mode of a region where one driver circuit in the display unit 230 including a driver circuit GDA, a driver circuit GDB, and a driver circuit GDC supplies a selection signal (see FIG. 12B).

For example, the display mode of the region where a selection signal is supplied from the driver circuit GDB can be changed when a predetermined event is supplied to the input unit 240 in a region overlapping with the region where a selection signal is supplied from the driver circuit GDB (see FIGS. 12B and 12C). Specifically, the frequency of the selection signal supplied from the driver circuit GDB can be changed in accordance with a "tap" event supplied to a touch panel with a finger or the like.

A signal GCLK is a clock signal for controlling the operation of the driver circuit GDB, and signals PWC1 and PWC2 are pulse width control signals for controlling the operation of the driver circuit GDB. The driver circuit GDB supplies selection signals to conductive films G2($m$+1) to G2(2m) on the basis of the signals GCLK, PWC1, PWC2, and the like.

Thus, for example, the driver circuit GDB can supply selection signals without supply of selection signals from the driver circuits GDA and GDC. Alternatively, the display of the region where selection signals are supplied from the driver circuit GDB can be refreshed without any change in the display of regions where selection signals are supplied from the driver circuits GDA and GDC. Alternatively, power consumed by the driver circuits can be reduced.

[Eighth Step]

In the eighth step, the interrupt processing terminates (see U8 in FIG. 12A). Note that the interrupt processing may be repeatedly executed in a period during which the main processing is executed.

<<Predetermined Event>>

For example, the following events can be used: events supplied using a pointing device such as a mouse (e.g., click and drag) and events supplied to a touch panel with a finger or the like used as a pointer (e.g., tap, drag, and swipe).

For example, the position of a slide bar pointed by a pointer, the swipe speed, and the drag speed can be used as parameters assigned to an instruction associated with a predetermined event.

For example, data sensed by the sensor unit 250 is compared to a predetermined threshold value, and the compared results can be used for the event.

Specifically, a pressure sensor or the like in contact with a button or the like that can be pushed in a housing can be used as the sensor unit 250.

<<Instruction Associated with Predetermined Event>>

For example, a termination instruction can be associated with a predetermined event.

For example, a page-turning instruction for switching displayed image data from one to another can be associated with a predetermined event. Note that a parameter determining the page-turning speed or the like when the page-turning instruction is executed can be supplied using the predetermined event.

For example, a scroll instruction for moving the position of displayed part of image data and displaying another part continuing from that part can be associated with a predetermined event. Note that a parameter determining the moving speed of the display, for example, when the scroll instruction is executed can be supplied using the predetermined event.

For example, an instruction for setting the display method or an instruction for generating image data can be associated with a predetermined event. Note that a parameter determining the brightness of a generated image can be associated with the predetermined event. A parameter determining the brightness of a generated image may be determined on the basis of ambient brightness sensed by the sensor unit 250.

For example, an instruction for acquiring data distributed via a push service using the communication unit 290 can be associated with a predetermined event.

Note that positional data sensed by the sensor unit 250 may be used to determine the presence or absence of a qualification for acquiring data. Specifically, the user may be considered to have a qualification for acquiring data when the user is in a predetermined class room, school, conference room, office, building, or the like. Accordingly, for example, the data processing device 200 that receives educational materials distributed in a classroom of a school or a university can be used as a schoolbook or the like (see FIG. 10C). Alternatively, materials distributed in a company's conference room, for example, can be received and used for a conference material.

Note that this embodiment can be combined with any of the other embodiments in this specification as appropriate.

Embodiment 8

In this embodiment, a structure of a data processing device of one embodiment of the present invention will be described with reference to FIGS. 13A to 13E, FIGS. 14A to 14E, and FIGS. 15A and 15B.

FIGS. 13A to 13E, FIGS. 14A to 14E, and FIGS. 15A and 15B illustrate structures of a data processing device of one embodiment of the present invention.

Figure 13A:
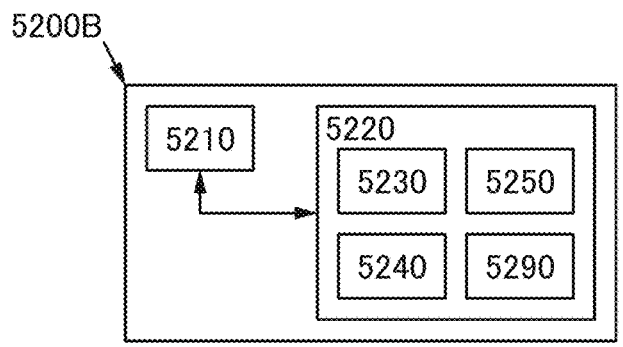
FIGS. 13A to 13E each illustrate a structure of a data processing device of one embodiment.

FIG. 13A is a block diagram of a data processing device, and FIGS. 13B to 13E are perspective views each illustrating a structure of the data processing device. FIGS. 14A to 14E are perspective views each illustrating a structure of the data processing device. FIGS. 15A and 15B are perspective views each illustrating a structure of the data processing device.

<Data Processing Device>

A data processing device 5200B described in this embodiment includes an arithmetic device 5210 and an input/output device 5220 (see FIG. 13A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in any of Embodiments 1 to 4 can be used in the display unit 5230.

The sensor unit 5250 has a function of supplying sensing data. For example, the sensor unit 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, or near field communication, for example.

<<Structure Example 1 of Data Processing Device>>

Figure 13B:
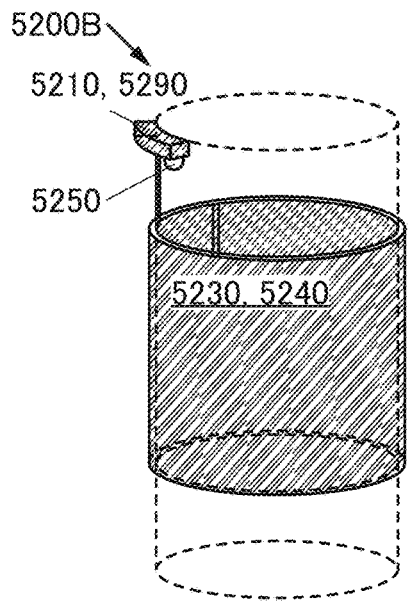

For example, the display unit 5230 can have an outer shape along a cylindrical column (see FIG. 13B). The data processing device has a function of changing its display method in accordance with the illuminance of a usage environment. In addition, the data processing device has a function of changing the displayed content when sensing the existence of a person. This allows the data processing device to be provided on a column of a building, for example. The data processing device can display advertising, guidance, or the like. The data processing device can be used for digital signage or the like.

<<Structure Example 2 of Data Processing Device>>

Figure 13C:
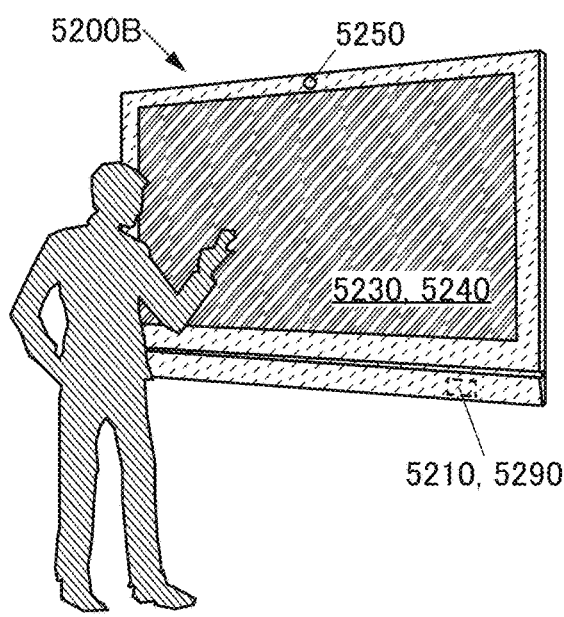

For example, the data processing device has a function of generating image data on the basis of the path of a pointer used by a user (see FIG. 13C). Specifically, a display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 3 of Data Processing Device>>

Figure 13D:
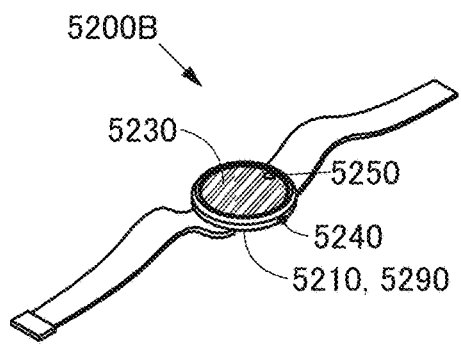

The data processing device can receive data from another device, and the data can be displayed on the display unit 5230 (see FIG. 13D). Moreover, several options can be displayed. The user can choose some from the options and send a reply to the data transmitter. As another example, the data processing device has a function of changing its display method in accordance with the illuminance of a usage environment. Thus, it is possible to obtain a smartwatch with reduced power consumption, for example. As another example, it is possible to obtain a smartwatch which can display an image such that the smartwatch can be suitably used in an environment under strong external light, e.g., outdoors in fine weather.

<<Structure Example 4 of Data Processing Device>>

Figure 13E:
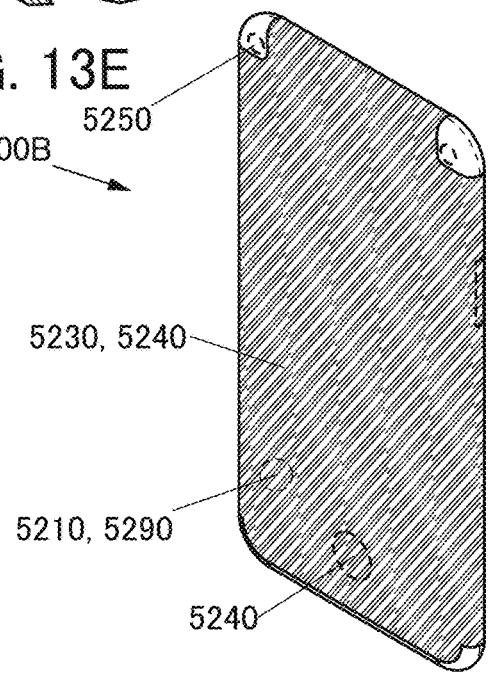

For example, the display unit 5230 has a surface gently curved along a side surface of a housing (see FIG. 13E). The display unit 5230 includes a display panel that is capable of displaying an image on the front surface, the side surfaces, the top surface, and the rear surface, for example. Thus, it is possible to obtain a mobile phone that can display image data on not only its front surface but also its side surfaces, top surface, and rear surface, for example.

<<Structure Example 5 of Data Processing Device>>

Figure 14A:
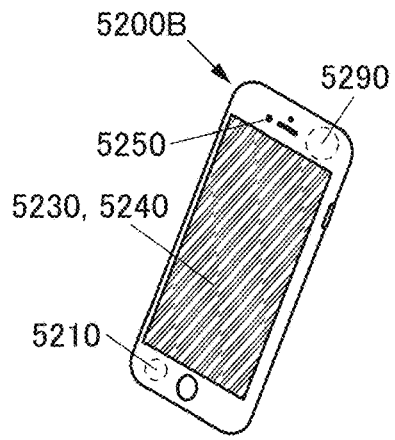
FIGS. 14A to 14E each illustrate a structure of a data processing device of one embodiment.
Figure 15A:
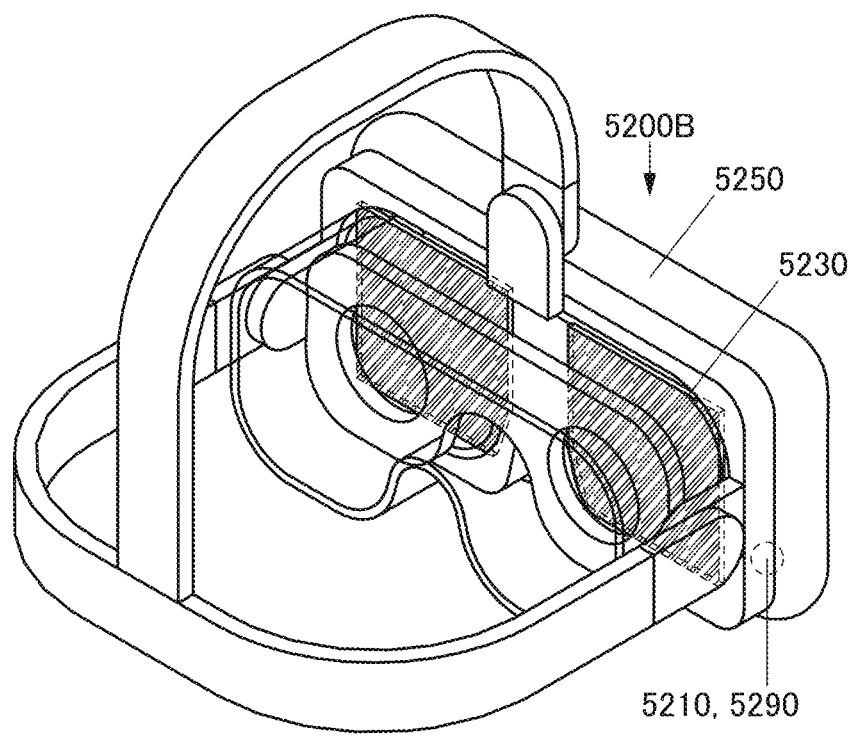
FIGS. 15A and 15B each illustrate a structure of a data processing device of one embodiment.
Figure 15B:
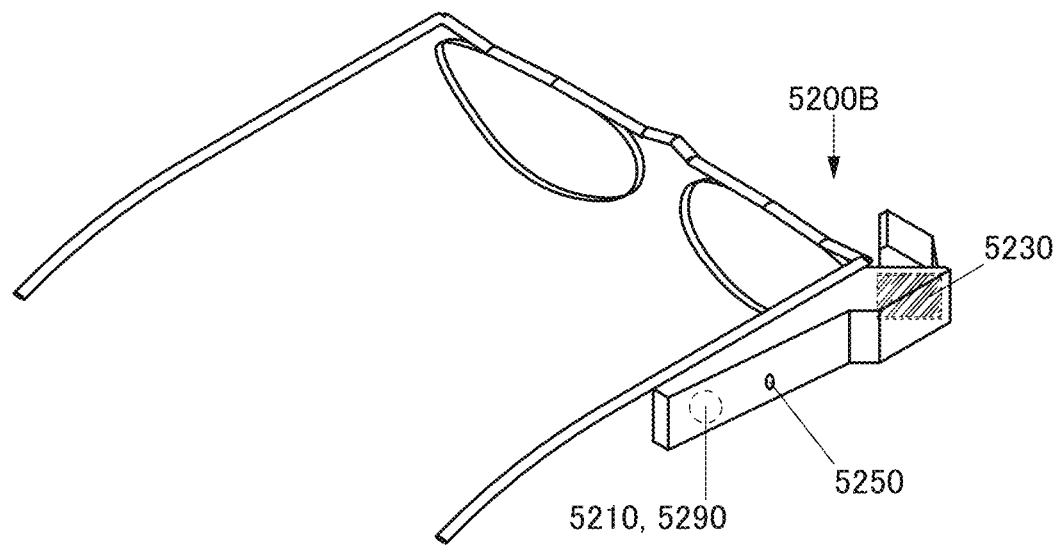

For example, the data processing device can receive data via the Internet and display the data on the display unit 5230 (see FIG. 14A). The user can check a created message on the display unit 5230 or send the created message to another device. As another example, the data processing device has a function of changing its display method in accordance with the illuminance of a usage environment. Thus, it is possible to obtain a smartphone with reduced power consumption. Alternatively, for example, it is possible to obtain a smartphone which can display an image such that the smartphone can be suitably used in an environment under strong external light, e.g., outdoors in fine weather.

<<Structure Example 6 of Data Processing Device>>

Figure 14B:
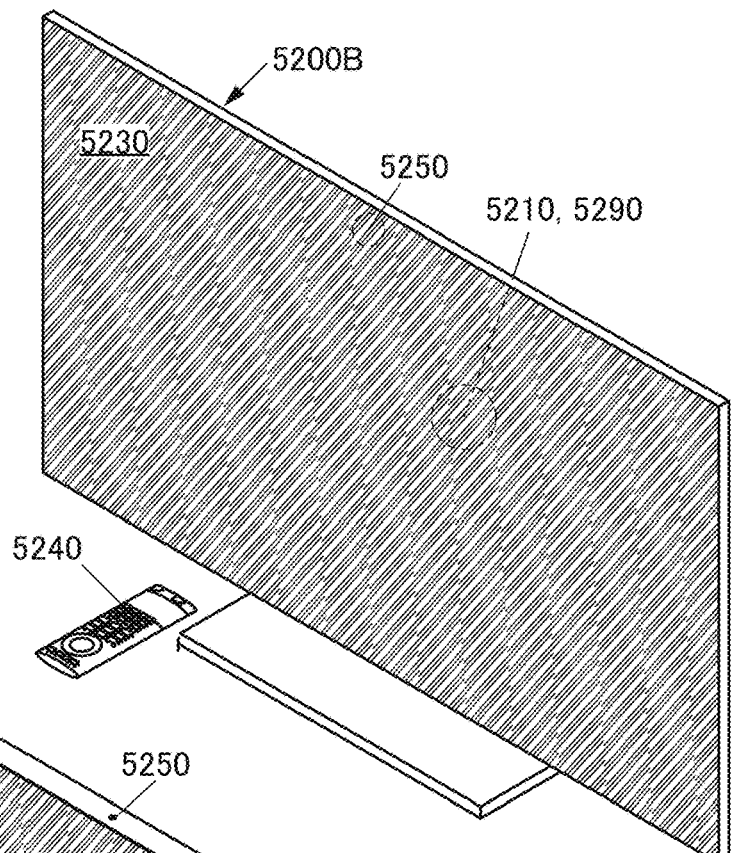

A remote controller can be used as the input unit 5240 (see FIG. 14B). For example, the data processing device can receive data from a broadcast station or via the Internet and display the data on the display unit 5230. Alternatively, the data processing device can take an image of the user with the sensor unit 5250 and transmit the image of the user. The data processing device can acquire a viewing history of the user and provide it to a cloud service. The data processing device can acquire recommendation data from a cloud service and display the data on the display unit 5230. A program or a moving image can be displayed on the basis of the recommendation data. As another example, the data processing device has a function of changing its display method in accordance with the illuminance of a usage environment. Accordingly, for example, it is possible to obtain a television system which can display an image such that the television system can be suitably used even when irradiated with strong external light that enters the room from the outside in fine weather.

<<Structure Example 7 of Data Processing Device>>

Figure 14C:
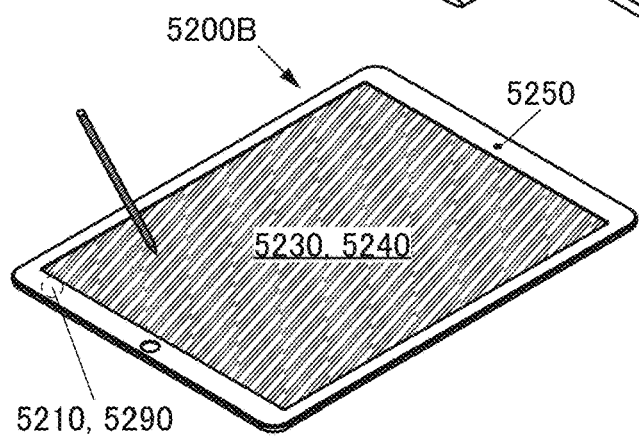

For example, the data processing device can receive educational materials via the Internet and display them on the display unit 5230 (see FIG. 14C). The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, the display unit 5230 can perform display using an image signal received from another data processing device. When the data processing device is placed on a stand or the like, the display unit 5230 can be used as a sub-display. Thus, for example, it is possible to obtain a tablet computer which can display an image such that the tablet computer is favorably used even in an environment under strong external light, e.g., outdoors in fine weather.

<<Structure Example 8 of Data Processing Device>>

Figure 14D:
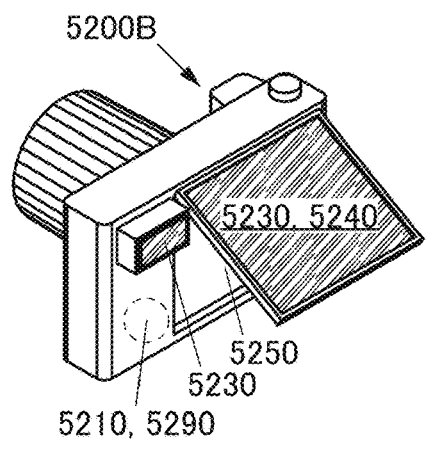

The data processing device includes, for example, a plurality of display units 5230 (see FIG. 14D). For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The data processing device has a function of changing shooting conditions in accordance with the illuminance of a usage environment. Accordingly, for example, it is possible to obtain a digital camera that can display a subject such that an image is favorably viewed even in an environment under strong external light, e.g., outdoors in fine weather.

<<Structure Example 9 of Data Processing Device>>

Figure 14E:
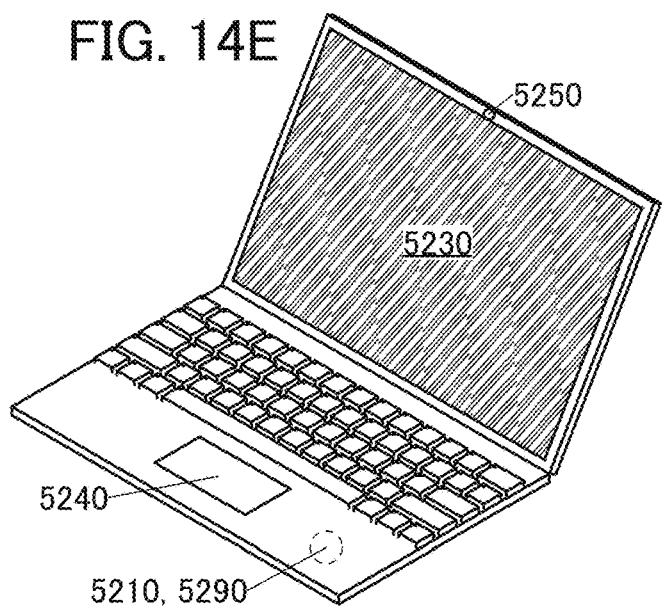

For example, the data processing device of this embodiment is used as a master and another data processing device is used as a slave, whereby the other data processing device can be controlled (see FIG. 14E). As another example, part of image data can be displayed on the display unit 5230 and another part of the image data can be displayed on a display unit of another data processing device. In addition, image signals can be supplied. Alternatively, with the communication unit 5290, data to be written can be obtained from an input unit of another data processing device. Thus, a large display region can be utilized by using a portable personal computer, for example.

<<Structure Example 10 of Data Processing Device>>

The data processing device includes, for example, the sensor unit 5250 that senses an acceleration or a direction (see FIG. 15A). The sensor unit 5250 can supply data on the position of the user or the direction in which the user faces. The data processing device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensor unit 5250 that senses an acceleration or a direction (see FIG. 15B). The sensor unit 5250 can supply data on the position of the user or the direction in which the user faces. Alternatively, the data processing device can generate image data in accordance with the position of the user or the direction in which the user faces. Accordingly, the data can be shown together with a real-world scene, for example. Alternatively, an augmented reality image can be displayed on a glasses-type data processing device.

Note that this embodiment can be combined with any of the other embodiments in this specification as appropriate.

Embodiment 9

In this embodiment, a structure of a transistor that can be used in the functional panel of one embodiment of the present invention will be described with reference to FIGS. 21A to 21D. For example, the structure can be used for the transistor M21, the transistor MD, or the like of the functional panel of one embodiment of the present invention, which is described in Embodiment 1.

<Structure Example of Semiconductor Device>

Figure 21A:
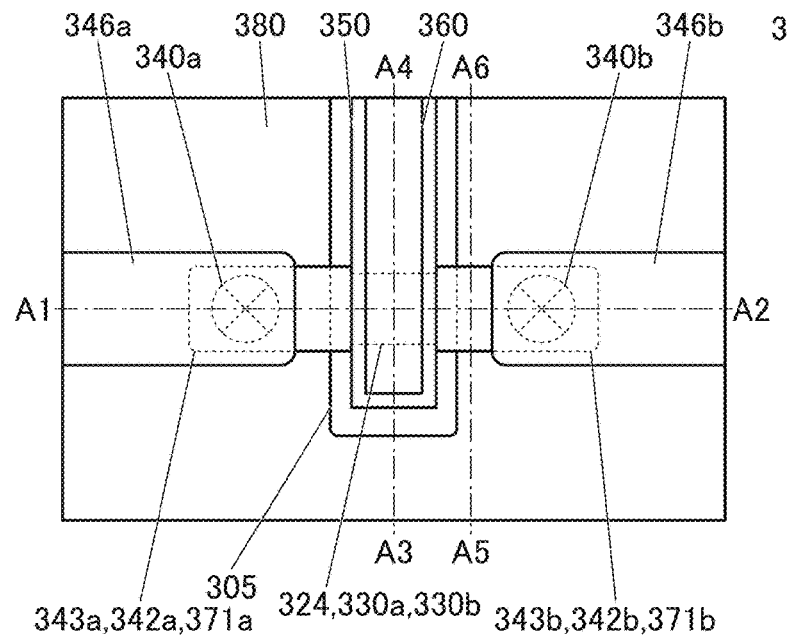
FIG. 21A is a top view of a semiconductor device of one embodiment of the present invention.
Figure 21C:
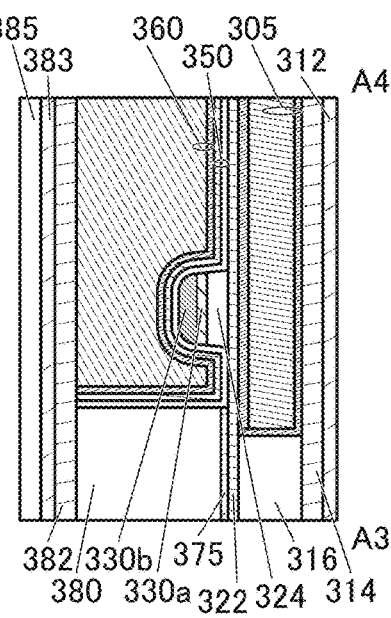
FIGS. 21B to 21D are cross-sectional views of the semiconductor device of one embodiment of the present invention.
Figure 21B:
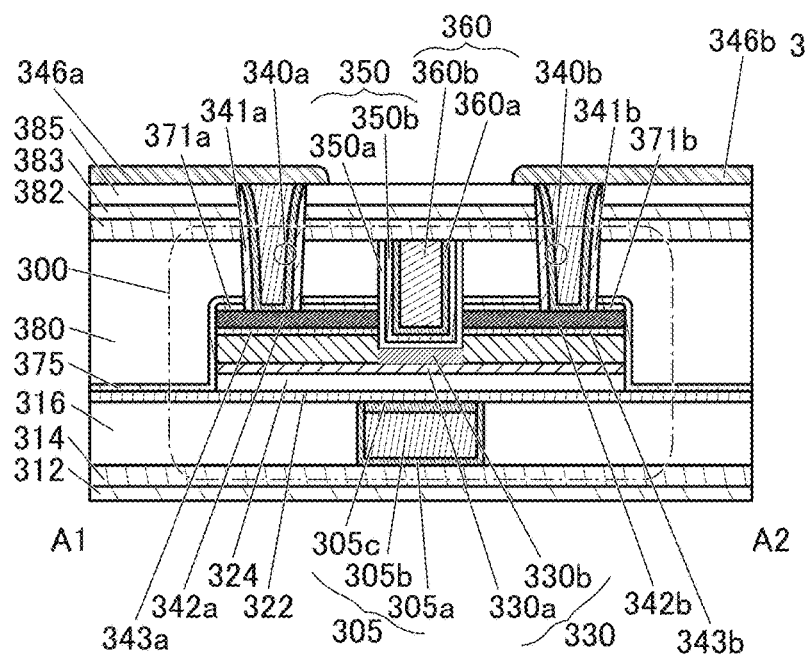
Figure 21D:
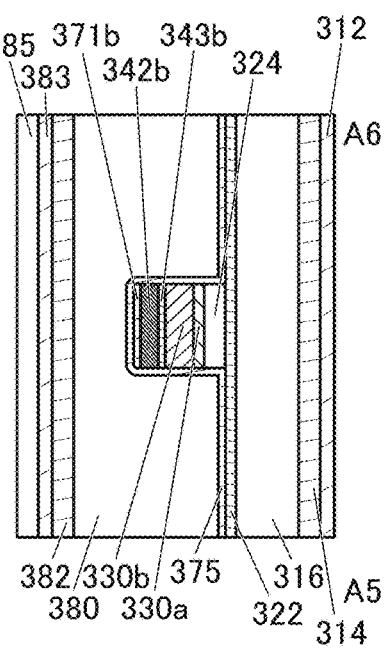

A structure of a semiconductor device including a transistor 300 will be described with reference to FIGS. 21A to 21D. FIGS. 21A to 21D are atop view and cross-sectional views of the semiconductor device including the transistor 300. FIG. 21A is the top view of the semiconductor device. FIGS. 21B to 21D are the cross-sectional views of the semiconductor device. FIG. 21B is a cross-sectional view taken along dashed-dotted line A1-A2 in FIG. 21A, which corresponds to a cross-sectional view of the transistor 300 in the channel length direction. FIG. 21C is a cross-sectional view taken along dashed-dotted line A3-A4 in FIG. 21A, which corresponds to a cross-sectional view of the transistor 300 in the channel width direction. FIG. 21D is a cross-sectional view taken along dashed-dotted line A5-A6 in FIG. 21A. Note that for simplification, some components are not illustrated in the top view in FIG. 21A.

An insulator, a conductor, an oxide, or a semiconductor described below can be deposited by a sputtering method, a chemical vapor deposition (CVD) method, a molecular beam epitaxy (MBE) method, a pulsed laser deposition (PLD) method, an atomic layer deposition (ALD) method, or the like. In this specification and the like, the term "insulator" can be replaced with an insulating film or an insulating layer. The term "conductor" can be replaced with a conductive film or a conductive layer. The term "oxide" can be replaced with an oxide film or an oxide layer. The term "semiconductor" can be replaced with a semiconductor film or a semiconductor layer.

The semiconductor device of one embodiment of the present invention includes an insulator 312 over a substrate (not illustrated), an insulator 314 over the insulator 312, the transistor 300 over the insulator 314, an insulator 380 over the transistor 300, an insulator 382 over the insulator 380, an insulator 383 over the insulator 382, and an insulator 385 over the insulator 383. The insulators 312, 314, 380, 382, 383, and 385 each function as an interlayer insulating film. The semiconductor device also includes a conductor 340 (a conductor 340a and a conductor 340b) that is electrically connected to the transistor 300 and functions as a plug. Note that an insulator 341 (an insulator 341a and an insulator 341b) is provided in contact with a side surface of the conductor 340 functioning as a plug. A conductor 346 (a conductor 346a and a conductor 346b) electrically connected to the conductor 340 and functioning as a wiring is provided over the insulator 385 and the conductor 340.

The insulator 341a is provided in contact with an inner wall of an opening formed in the insulators 380, 382, 383, and 385, a first conductor of the conductor 340a is provided in contact with the side surface of the insulator 341a, and a second conductor of the conductor 340a is provided inside the first conductor. The insulator 341b is provided in contact with an inner wall of an opening formed in the insulators 380, 382, 383, and 385, a first conductor of the conductor 340b is provided in contact with the side surface of the insulator 341b, and a second conductor of the conductor 340b is provided inside the first conductor. A top surface of the conductor 340 can be substantially level with a top surface of the insulator 385 in a region overlapping with the conductor 346. Although the first conductor of the conductor 340 and the second conductor of the conductor 340 are stacked in the transistor 300, the present invention is not limited thereto. For example, the conductor 340 may have a single-layer structure or a stacked-layer structure of three or more layers. In the case where a stacked-layer structure is employed, the layers may be distinguished by numbers corresponding to the formation order.

[Transistor 300]

As illustrated in FIGS. 21A to 21D, the transistor 300 includes an insulator 316 over the insulator 314; a conductor 305 (a conductor 305a, a conductor 305b, and a conductor 305c) placed to be embedded in the insulator 316; an insulator 322 over the insulator 316 and the conductor 305; an insulator 324 over the insulator 322; an oxide 330a over the insulator 324; an oxide 330b over the oxide 330a; an oxide 343 (an oxide 343a and an oxide 343b) over the oxide 330b; a conductor 342a over the oxide 343a; an insulator 371a over the conductor 342a; a conductor 342b over the oxide 343b; an insulator 371b over the conductor 342b; an insulator 350 (an insulator 350a and an insulator 350b) over the oxide 330b; a conductor 360 (a conductor 360a and a conductor 360b) positioned over the insulator 350 and overlapping with part of the oxide 330b; and an insulator 375 placed to cover the insulator 322, the insulator 324, the oxide 330a, the oxide 330b, the oxide 343a, the oxide 343b, the conductor 342a, the conductor 342b, the insulator 371a, and the insulator 371b.

Hereinafter, the oxide 330a and the oxide 330b are collectively referred to as an oxide 330 in some cases. In addition, the conductor 342a and the conductor 342b are collectively referred to as a conductor 342 in some cases. In addition, the insulator 371a and the insulator 371b are collectively referred to as an insulator 371 in some cases.

An opening that reaches the oxide 330b is provided in the insulator 380 and the insulator 375. The insulator 350 and the conductor 360 are placed in the opening. In the channel length direction of the transistor 300, the conductor 360 and the insulator 350 are provided between the insulator 371a, the conductor 342a, and the oxide 343a, and the insulator 371b, the conductor 342b, and the oxide 343b. The insulator 350 includes a region in contact with a side surface of the conductor 360 and a region in contact with a bottom surface of the conductor 360.

The oxide 330 preferably includes the oxide 330a placed over the insulator 324 and the oxide 330b placed over the oxide 330a. The oxide 330a under the oxide 330b can inhibit diffusion of impurities into the oxide 330b from the components formed below the oxide 330a.

Although the oxide 330 has a two-layer structure of the oxide 330a and the oxide 330b in the transistor 300, the present invention is not limited thereto. For example, the oxide 330 may have a single-layer structure of the oxide 330b or a stacked-layer structure of three or more layers, or the oxide 330a and the oxide 330b may each have a stacked-layer structure.

The conductor 360 functions as a first gate (also referred to as a top gate) electrode and the conductor 305 functions as a second gate (also referred to as a back gate) electrode. In addition, the insulator 350 functions as a first gate insulating film, and the insulator 324 and the insulator 322 each function as a second gate insulating film. The conductor 342a functions as one of a source electrode and a drain electrode, and the conductor 342b functions as the other of the source electrode and the drain electrode. A region of the oxide 330 overlapping with the conductor 360 at least partly functions as a channel formation region.

The oxide 330b includes one of the source and drain regions in a region overlapping with the conductor 342a, and includes the other of the source and drain regions in a region overlapping with the conductor 342b. The oxide 330b includes the channel formation region (region indicated by a shaded portion in FIG. 21B) in a region between the source and drain regions.

The channel formation region has fewer oxygen vacancies or lower impurity concentration than the source and drain regions, and thus is a high-resistance region with a low carrier concentration. The carrier concentration of the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the channel formation region is not particularly limited and can be, for example, $1\times10^{-9}$ cm$^{-3}$.

Although the channel formation region, the source region, and the drain region are formed in the oxide 330b in the above example, the present invention is not limited thereto. For example, the channel formation region, the source region, and the drain region are formed also in the oxide 330a in some cases.

In the transistor 300, the oxide 330 (the oxide 330a and the oxide 330b) which includes the channel formation region preferably contains a metal oxide functioning as a semiconductor (hereinafter also referred to as oxide semiconductor).

The metal oxide functioning as a semiconductor preferably has a band gap of 2 eV or more, preferably 2.5 eV or more. The use of such a metal oxide having a wide band gap can reduce the off-state current of the transistor.

For example, as the oxide 330, a metal oxide such as an In-M-Zn oxide containing indium, an element M, and zinc is used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like. Alternatively, an In—Ga oxide, an In—Zn oxide, or indium oxide may be used as the oxide 330.

Here, the atomic ratio of In to the element M in the metal oxide used as the oxide 330b is preferably greater than that in the metal oxide used as the oxide 330a.

Specifically, as the oxide 330a, a metal oxide having an atomic ratio of In:M:Zn=1:3:4 or in the vicinity thereof, or In:M:Zn=1:1:0.5 or in the vicinity thereof may be used. As the oxide 330b, a metal oxide having an atomic ratio of In:M:Zn=1:1:1 or in the vicinity thereof, or In:M:Zn=4:2:3 or in the vicinity thereof may be used. Note that the vicinity of the atomic ratio includes ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 330a is provided under the oxide 330b in the above manner, impurities and oxygen can be inhibited from diffusing into the oxide 330b from the components formed below the oxide 330a.

The density of defect states at the interface between the oxide 330a and the oxide 330b can be made low when the oxide 330a and the oxide 330b contain the same element (as a main component) in addition to oxygen. Since the density of defect states at the interface between the oxide 330a and the oxide 330b can be low, the influence of interface scattering on carrier conduction can be small and a high on-state current can be obtained.

The oxide 330a and the oxide 330b each preferably has crystallinity. In particular, as the oxide 330b, a c-axis-aligned crystalline oxide semiconductor (CAAC-OS) is preferably used.

The CAAC-OS is a metal oxide having a dense structure with high crystallinity and a small amount of impurities or defects (oxygen vacancies (Vo) or the like). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

By contrast, in the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

At least one of the insulators 312, 314, 371, 375, 382, and 383 preferably functions as a barrier insulating film that inhibits diffusion of impurities such as water and hydrogen into the transistor 300 from the substrate side or from above the transistor 300. Therefore, at least one of the insulators 312, 314, 371, 375, 382, and 383 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the impurities are less likely to pass. Alternatively, it is preferable to use an insulating material having a function of inhibiting diffusion of oxygen (e.g., at least one of oxygen atoms, oxygen molecules, and the like), that is, an insulating material through which the oxygen is less likely to pass.

Note that in this specification, a barrier insulating film refers to an insulating film having a barrier property. A barrier property in this specification means a function of inhibiting diffusion of a particular substance (also referred to as a function of less easily transmitting the substance). Alternatively, a barrier property in this specification means a function of capturing or fixing (also referred to as gettering) a particular substance.

Aluminum oxide, magnesium oxide, hafnium oxide, gallium oxide, indium gallium zinc oxide, silicon nitride, silicon nitride oxide, or the like can be used for the insulators 312, 314, 371, 375, 382, and 383. For example, silicon nitride, which has a high hydrogen barrier property, is preferably used for the insulators 312, 375, and 383. For example, aluminum oxide or magnesium oxide, which has a function of capturing or fixing more hydrogen, is preferably used for the insulators 314, 371, and 382. Accordingly, impurities such as water and hydrogen can be inhibited from diffusing to the transistor 300 side from the substrate side through the insulators 312 and 314. Furthermore, impurities such as water and hydrogen can be inhibited from diffusing to the transistor 300 side from an interlayer insulating film and the like positioned outside the insulator 383. In addition, oxygen contained in the insulator 324 and the like can be inhibited from diffusing to the substrate side through the insulators 312 and 314. Furthermore, oxygen contained in the insulator 380 and the like can be inhibited from diffusing over the transistor 300 through the insulator 382 and the like. In this manner, the transistor 300 is preferably surrounded by the insulators 312, 314, 371, 375, 382, and 383 having a function of inhibiting diffusion of oxygen and impurities such as water and hydrogen.

Here, an oxide having an amorphous structure is preferably used as the insulators 312, 314, 371, 375, 382, and 383. For example, a metal oxide such as AlOx (x is a given number greater than 0) or MgOy (y is a given number greater than 0) is preferably used. In such a metal oxide having an amorphous structure, an oxygen atom has a dangling bond and a property of trapping or fixing hydrogen by the dangling bond. When such a metal oxide having an amorphous structure is used as the component of the transistor 300 or provided around the transistor 300, hydrogen in or around the transistor 300 can be trapped or fixed. In particular, hydrogen contained in the channel formation region of the transistor 300 is preferably trapped or fixed. When a metal oxide having an amorphous structure is used as the component of the transistor 300 or provided around the transistor 300, the transistor 300 and the semiconductor device with favorable characteristics and high reliability can be fabricated.

The insulators 312, 314, 371, 375, 382, and 383 each preferably have an amorphous structure, but may partly include a region with a polycrystalline structure. Alternatively, the insulators 312, 314, 371, 375, 382, and 383 may each have a multilayer structure including a layer with an amorphous structure and a layer with a polycrystalline structure. For example, a stacked-layer structure in which a layer with a polycrystalline structure is formed over a layer with an amorphous structure may be employed.

The insulators 312, 314, 371, 375, 382, and 383 can be formed by a sputtering method, for example. Since the sputtering method does not need to use hydrogen as a deposition gas, the hydrogen concentration in the insulators 312, 314, 371, 375, 382, and 383 can be reduced. Note that the deposition method is not limited to a sputtering method, and a CVD method, an MBE method, a PLD method, an ALD method, or the like can be used as appropriate.

The insulators 316, 380, and 385 preferably have a lower dielectric constant than the insulator 314. The use of a material having a low dielectric constant for the interlayer insulating film can reduce the parasitic capacitance between wirings. For example, for the insulators 316, 380, and 385, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The conductor 305 is placed to overlap with the oxide 330 and the conductor 360. The conductor 305 is preferably provided to be embedded in an opening formed in the insulator 316.

The conductor 305 includes the conductor 305a, the conductor 305b, and the conductor 305c. The conductor 305a is provided in contact with a bottom surface and a side wall of the opening. The conductor 305b is provided to be embedded in a recessed portion formed in the conductor 305a. Here, a top surface of the conductor 305b is lower in level than top surfaces of the conductor 305a and the insulator 316. The conductor 305c is provided in contact with the top surface of the conductor 305b and a side surface of the conductor 305a. Here, a top surface of the conductor 305c is substantially level with the top surfaces of the conductor 305a and the insulator 316. That is, the conductor 305b is surrounded by the conductor 305a and the conductor 305c.

The conductor 305a and the conductor 305c may be formed using a conductive material that can be used for the conductor 360a, which will be described later. The conductor 305b may be formed using a conductive material that can be used for the conductor 360b, which will be described later. Although the conductor 305a, the conductor 305b, and the conductor 305c are stacked in the transistor 300, the present invention is not limited thereto. For example, the conductor 305 may have a single-layer structure, a two-layer structure, or a stacked-layer structure of four or more layers.

The insulators 322 and 324 each function as a gate insulating film.

The insulator 322 preferably has a function of inhibiting diffusion of hydrogen (e.g., at least one of hydrogen atoms, hydrogen molecules, and the like). The insulator 322 also preferably has a function of inhibiting diffusion of oxygen (e.g., at least one of oxygen atoms and oxygen molecules). For example, the insulator 322 preferably has a function of inhibiting diffusion of much hydrogen and/or oxygen compared to the insulator 324.

As the insulator 322, an insulator containing an oxide of aluminum and/or hafnium, which is an insulating material, is preferably used. As the insulator, aluminum oxide, hafnium oxide, an oxide containing aluminum and hafnium (hafnium aluminate), or the like is preferably used. Alternatively, as the insulator 322, a barrier insulating film that can be used for the above-described insulator 314 and the like may be used.

For example, silicon oxide or silicon oxynitride can be used as appropriate for the insulator 324. When the insulator containing oxygen is provided in contact with the oxide 330, oxygen vacancies in the oxide 330 can be reduced, leading to an improvement in reliability of the transistor 300. The insulator 324 is preferably processed into an island shape to overlap with the oxide 330a. In that case, the insulator 375 is in contact with a side surface of the insulator 324 and a top surface of the insulator 322. Accordingly, the insulator 324 and the insulator 380 can be separated from each other by the insulator 375, so that oxygen contained in the insulator 380 can be inhibited from diffusing into the insulator 324 and serving as excess oxygen in the insulator 324.

Note that the insulators 322 and 324 may each have a stacked-layer structure of two or more layers. In that case, the stacked layers are not necessarily formed of the same material and may be formed of different materials. Although the insulator 324 is formed into an island shape to overlap with the oxide 330a in FIG. 21B and the like, the present invention is not limited thereto. As long as the amount of oxygen contained in the insulator 324 can be adjusted appropriately, the insulator 324 is not necessarily patterned, like the insulator 322.

The oxides 343a and 343b are provided over the oxide 330b. The oxides 343a and 343b are provided apart from each other with the conductor 360 therebetween. The oxide 343 (the oxide 343a and the oxide 343b) preferably has a function of inhibiting oxygen transmission. When the oxide 343, which has a function of inhibiting oxygen transmission, is provided between the oxide 330b and the conductor 342 functioning as the source electrode or the drain electrode, the electrical resistance between the conductor 342 and the oxide 330b can be reduced, which is preferable. In the case where the electrical resistance between the conductor 342 and the oxide 330b can be sufficiently reduced, the oxide 343 is not necessarily provided.

A metal oxide containing the element M may be used as the oxide 343. In particular, aluminum, gallium, yttrium, or tin is preferably used as the elementM. The concentration of the element M in the oxide 343 is preferably higher than that in the oxide 330b. Alternatively, gallium oxide may be used as the oxide 343. A metal oxide such as an In-M-Zn oxide may be used as the oxide 343. Specifically, the atomic ratio of the element Mto In in the metal oxide used as the oxide 343 is preferably higher than that in the metal oxide used as the oxide 330b. The thickness of the oxide 343 ranges preferably from 0.5 nm to 5 nm, further preferably from 1 nm to 3 nm, still further preferably from 1 nm to 2 nm.

It is preferable that the conductor 342a be provided in contact with a top surface of the oxide 343a, and the conductor 342b be provided in contact with a top surface of the oxide 343b. The conductors 342a and 342b function as the source electrode and the drain electrode of the transistor 300.

For the conductor 342 (the conductor 342a and the conductor 342b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

No curved surface is preferably formed between the side surface and the top surface of the conductor 342. Without the curved surface, the conductor 342 can have a large cross-sectional area in the channel width direction as illustrated in FIG. 21D. Accordingly the conductivity of the conductor 342 and the on-state current of the transistor 300 can be increased.

The insulator 371a is provided in contact with a top surface of the conductor 342a, and the insulator 371b is provided in contact with a top surface of the conductor 342b.

The insulator 375 is provided in contact with the top surface of the insulator 322, the side surface of the insulator 324, a side surface of the oxide 330a, a side surface of the oxide 330b, a side surface of the oxide 343, a side surface of the conductor 342, and the side surface and top surface of the insulator 371. The insulator 375 has an opening in a region where the insulator 350 and the conductor 360 are provided.

The insulators 314, 371, and 375, which have a function of capturing impurities such as hydrogen, are provided in a region interposed between the insulator 312 and the insulator 375, whereby impurities such as hydrogen contained in the insulator 324, the insulator 316, or the like can be captured and the amount of hydrogen in the region can be kept constant. In that case, the insulators 314, 371, and 375 preferably contain aluminum oxide with an amorphous structure.

The insulator 350 includes the insulator 350a and the insulator 350b over the insulator 350a, and functions as a gate insulating film. The insulator 350a is preferably placed in contact with a top surface of the oxide 330b, the side surface of the oxide 343, the side surface of the conductor 342, the side surface of the insulator 371, a side surface of the insulator 375, and aside surface of the insulator 380. The thickness of the insulator 350 is preferably greater than or equal to 1 nm and less than or equal to 20 nm.

The insulator 350a can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. As in the insulator 324, the concentration of impurities such as water and hydrogen in the insulator 350a is preferably reduced.

It is preferable that the insulator 350a be formed using an insulator from which oxygen is released by heating and the insulator 350b be formed using an insulator having a function of inhibiting diffusion of oxygen. Owing to this structure, diffusion of oxygen contained in the insulator 350a into the conductor 360 can be inhibited. That is, a reduction in the amount of oxygen supplied to the oxide 330 can be inhibited. Moreover, oxidation of the conductor 360 due to oxygen contained in the insulator 350a can be inhibited. The insulator 350b can be formed using a material similar to that for the insulator 322.

Specifically, for the insulator 350b, a metal oxide containing one or more of hafnium, aluminum, gallium, yttrium, zirconium, tungsten, titanium, tantalum, nickel, germanium, magnesium, and the like or a metal oxide that can be used as the oxide 330 can be used. In particular, an insulator containing an oxide of one or both of aluminum and hafnium is preferably used. As the insulator, aluminum oxide, hafnium oxide, an oxide containing aluminum and hafnium (hafnium aluminate), or the like is preferably used. The thickness of the insulator 350b is preferably greater than or equal to 0.5 nm and less than or equal to 3.0 nm, further preferably greater than or equal to 1.0 nm and less than or equal to 1.5 nm.

Note that although the insulator 350 has a stacked-layer structure of two layers in FIGS. 21B and 21C, the present invention is not limited thereto. The insulator 350 may have a single-layer structure or a stacked-layer structure of three or more layers.

The conductor 360 is provided over the insulator 350b and functions as a first gate electrode of the transistor 300. The conductor 360 preferably includes the conductor 360a and the conductor 360b over the conductor 360a. For example, the conductor 360a is preferably positioned to cover the bottom surface and the side surface of the conductor 360b. As illustrated in FIGS. 21B and 21C, a top surface of the conductor 360 is substantially aligned with a top surface of the insulator 350. Although the conductor 360 has a two-layer structure of the conductor 360a and the conductor 360b in FIGS. 21B and 21C, the conductor 360 may have a single-layer structure or a stacked-layer structure of three or more layers.

The conductor 360a is preferably formed using a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, the conductor 360a is preferably formed using a conductive material having a function of inhibiting diffusion of oxygen (e.g., at least one of oxygen atoms and oxygen molecules).

When the conductor 360a has a function of inhibiting diffusion of oxygen, the conductivity of the conductor 360b can be prevented from being lowered because of oxidization of the conductor 360b due to oxygen in the insulator 350. As the conductive material having a function of inhibiting diffusion of oxygen, for example, titanium, titanium nitride, tantalum, tantalum nitride, ruthenium, or ruthenium oxide is preferably used.

The conductor 360 also functions as a wiring and thus is preferably a conductor having high conductivity. For example, a conductive material containing tungsten, copper, or aluminum as its main component can be used for the conductor 360b. The conductor 360b may have a stacked-layer structure, for example, a stacked-layer structure of any of the above conductive materials and titanium or titanium nitride.

In the transistor 300, the conductor 360 is formed in a self-aligned manner to fill an opening formed in the insulator 380 and the like. In this manner, the conductor 360 can surely be provided in a region between the conductor 342a and the conductor 342b without alignment.

As illustrated in FIG. 21C, in the channel width direction of the transistor 300, the bottom surface of the conductor 360 not overlapping with the oxide 330b is preferably lower in level than the bottom surface of the oxide 330b, with the level of the bottom surface of the insulator 322 as a reference. When the conductor 360 functioning as the gate electrode covers the side and top surfaces of the channel formation region in the oxide 330b with the insulator 350 and the like therebetween, the electric field of the conductor 360 is likely to affect the entire channel formation region in the oxide 330b. Hence, the transistor 300 can have a higher on-state current and higher frequency characteristics. With the level of the bottom surface of the insulator 322 as a reference, a distance between the bottom surface of the conductor 360 and the bottom surface of the oxide 330b in a region where the conductor 360 does not overlap with the oxides 330a and 330b is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 380 is provided over the insulator 375, and an opening is formed in a region where the insulator 350 and the conductor 360 are provided. The top surface of the insulator 380 may be planarized. In this case, it is preferable that the top surface of the insulator 380 be substantially aligned with the top surfaces of the insulator 350 and the conductor 360.

The insulator 382 is provided in contact with the top surfaces of the insulator 380, the insulator 350, and conductor 360. The insulator 382 preferably functions as a barrier insulating film that inhibits impurities such as water and hydrogen from diffusing into the insulator 380 from the above and also has a function of capturing impurities such as hydrogen. The insulator 382 also preferably functions as a barrier insulating film for inhibiting transmission of oxygen. As the insulator 382, for example, an insulator such as aluminum oxide can be used. The insulator 382, which has a function of capturing impurities such as hydrogen, is provided in contact with the insulator 380 in a region interposed between the insulator 312 and the insulator 383, whereby impurities such as hydrogen contained in the insulator 380 and the like can be captured and the amount of hydrogen in the region can be kept constant. It is particularly preferable to use aluminum oxide having an amorphous structure as the insulator 382 because hydrogen can be sufficiently trapped or fixed in some cases. Accordingly, the transistor 300 and the semiconductor device with favorable characteristics and high reliability can be fabricated.

The conductors 340a and 340b are preferably formed using a conductive material containing tungsten, copper, or aluminum as its main component. The conductors 340a and 340b may have a stacked-layer structure. In the case where the conductor 340 has a stacked-layer structure, the conductor in contact with the insulator 341 is preferably formed using a conductive material having a function of inhibiting the transmission of oxygen and impurities such as water and hydrogen. For example, any of the above conductive materials that can be used for the conductor 360a may be used.

An insulator such as silicon nitride, aluminum oxide, or silicon nitride oxide may be used as the insulators 341a and 341b, for example. Since the insulators 341a and 341b are provided in contact with the insulators 383, 382, and 371, impurities such as water and hydrogen contained in the insulator 380 or the like can be inhibited from entering the oxide 330 through the conductors 340a and 340b.

The conductor 346 (the conductor 346a and the conductor 346b) functioning as a wiring may be provided in contact with the top surfaces of the conductors 340a and 340b. The conductor 346 is preferably formed using a conductive material containing tungsten, copper, or aluminum as its main component. The conductor may have a stacked-layer structure, for example, a stack of any of the above conductive materials and titanium or titanium nitride. Note that the conductor may be formed to be embedded in an opening in an insulator.

Accordingly, a semiconductor device having favorable electrical characteristics can be provided. A highly reliable semiconductor device can be provided. A semiconductor device that can be miniaturized or highly integrated can be provided. A semiconductor device with low power consumption can be provided.

Note that this embodiment can be combined with any of the other embodiments in this specification as appropriate.

Embodiment 10

Described in this embodiment is a metal oxide (hereinafter also referred to as an oxide semiconductor) applicable to an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 22A. FIG. 22A is a diagram showing the classification of crystal structures of an oxide semiconductor, typically IGZO (a metal oxide containing In, Ga, and Zn).

As shown in FIG. 22A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 22A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 22B shows an XRD spectrum, which is obtained by grazing-incidence XRD (GIXD) measurement, of a CAAC-IGZO film classified into "Crystalline". Note that a GIXD method is also referred to as a thin film method or a Seemann-Bohlin method. The XRD spectrum that is shown in FIG. 22B and obtained by GIXD measurement is hereinafter simply referred to as an XRD spectrum. The CAAC-IGZO film in FIG. 22B has an atomic ratio of In:Ga:Zn=4:2:3 or a neighborhood thereof. The CAAC-IGZO film in FIG. 22B has a thickness of 500 nm.

As shown in FIG. 22B, a clear peak indicating crystallinity is observed in the XRD spectrum of the CAAC-IGZO film. Specifically, a peak indicating c-axis alignment is observed at around 2θ=31° in the XRD spectrum of the CAAC-IGZO film. As shown in FIG. 22B, the peak at around 2θ=31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 22C shows a diffraction pattern of the CAAC-IGZO film. FIG. 22C shows a diffraction pattern obtained by the NBED method in which an electron beam is incident in the direction parallel to the substrate. The CAAC-IGZO film in FIG. 22C has an atomic ratio of In:Ga:Zn=4:2:3 or a neighborhood thereof. In the nanobeam electron diffraction method, electron diffraction is performed with a probe diameter of 1 nm.

As shown in FIG. 22C, a plurality of spots indicating c-axis alignment are observed in the diffraction pattern of the CAAC-IGZO film.

<<Structure of Oxide Semiconductor>>

Oxide semiconductors might be classified in a manner different from the one in FIG. 22A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region in the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for of the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Thus, the concentration of nitrogen in the channel formation region using the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 11

In this embodiment, a structure example of an electronic device including the functional panel of one embodiment of the present invention will be described.

Figure 24A:
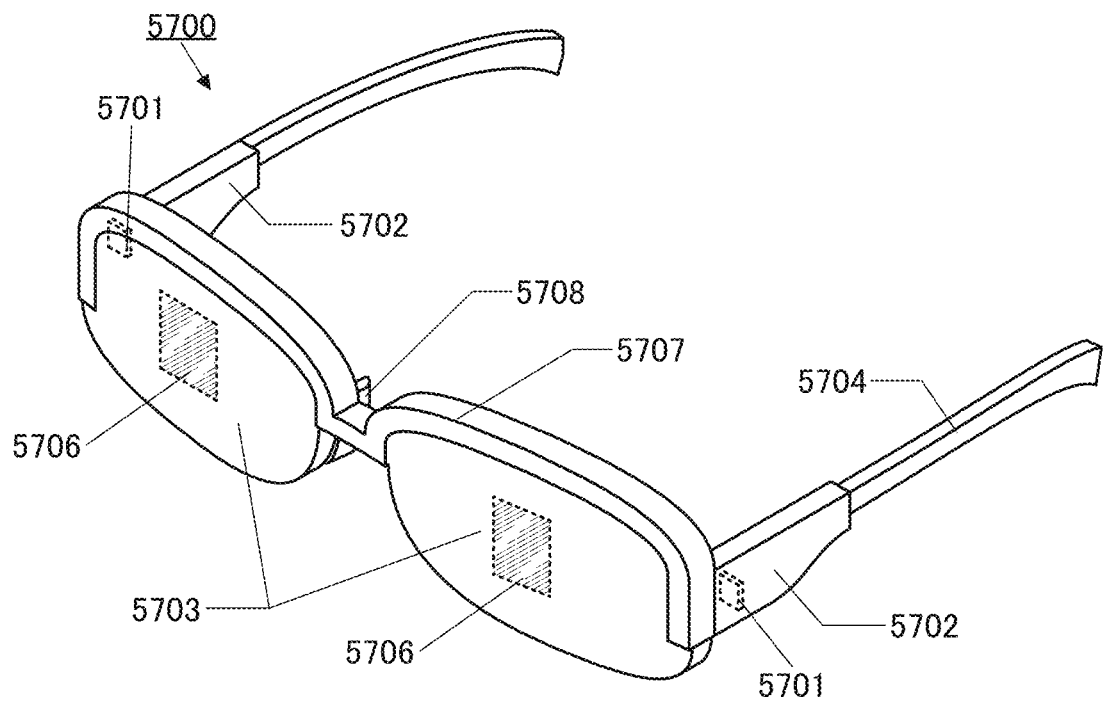
FIGS. 24A and 24B illustrate a structure example of an electronic device.

FIG. 24A is a perspective view of a glasses-type electronic device 5700. The electronic device 5700 includes a pair of display panels 5701, a pair of housings 5702, a pair of optical members 5703, a pair of wearing portions 5704, a frame 5707, a nose pad 5708, and the like.

The electronic device 5700 can project an image displayed on the display panel 5701 onto a display region 5706 of the optical member 5703. Since the optical members 5703 have a light-transmitting property, a user can see images displayed on the display regions 5706, which are superimposed on transmission images seen through the optical members 5703. Thus, the electronic device 5700 is an electronic device capable of AR display.

One or both of the housings 5702 may be provided with a camera capable of taking an image of what lies in front thereof. The housing 5702 may have a wireless communication device, in which case a video signal or the like can be supplied to the housing 5702 by the wireless communication device. Instead of or in addition to the wireless communication device, a connector that can be connected to a cable for supplying a video signal or a power supply potential may be provided. Furthermore, when the housing 5702 is provided with an acceleration sensor such as a gyroscope sensor, the orientation of the user's head can be detected and an image corresponding to the orientation can be displayed on the display region 5706.

One or both of the housings 5702 may be provided with a processor. The processor has a function of controlling the components of the electronic device 5700, such as a camera, a wireless communication device, and the pair of display panels 5701, a function of generating an image, and the like. The processor may have a function of generating a synthesized image for AR display.

Furthermore, data communication with an external device can be performed by the wireless communication device. For example, when data transmitted from the outside is output to the processor, the processor can generate image data for AR display on the basis of the data. Examples of the data transmitted from the outside include, in addition to image data, data including biological information transmitted from a biological sensor device or the like.

Next, a method for projecting an image on the display region 5706 of the electronic device 5700 is described with reference to FIG. 24B. The display panel 5701 is provided inside the housing 5702. Furthermore, a reflective plate 5712 is provided in the optical member 5703, and a reflective surface 5713 functioning as a half mirror is provided in a portion corresponding to the display region 5706 of the optical member 5703.

Light 5715 emitted from the display panel 5701 is reflected by the reflective plate 5712 to the optical member 5703 side. In the optical member 5703, the light 5715 is fully reflected repeatedly by surfaces of an edge portion of the optical member 5703 and reaches the reflective surface 5713, whereby an image is projected on the reflective surface 5713. Accordingly, the user can see both the light 5715 reflected by the reflective surface 5713 and transmitted light 5716 that passes through the optical member 5703 (including the reflective surface 5713).

Figure 24B:
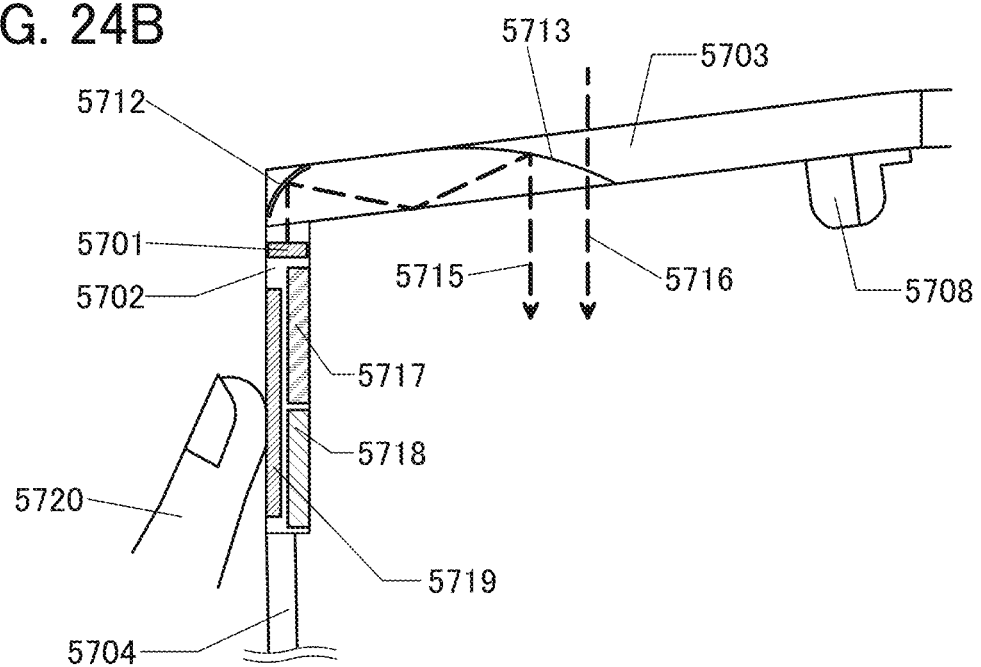

FIGS. 24A and 24B show an example in which the reflective plate 5712 and the reflective surface 5713 each have a curved surface. This structure can increase optical design flexibility and reduce the thickness of the optical member 5703, compared to the case where the reflective plate 5712 and the reflective surface 5713 are flat. Note that the reflective plate 5712 and the reflective surface 5713 may be flat.

The reflective plate 5712 can be a component having a mirror surface and preferably has high reflectance. As the reflective surface 5713, a half mirror utilizing reflection of a metal film may be used, but the use of a total-reflection prism or the like can increase the transmittance of the transmitted light 5716.

The housing 5702 may include a lens between the display panel 5701 and the reflective plate 5712. In this case, the housing 5702 preferably includes a mechanism for adjusting the distance and angle between the lens and the display panel 5701, in which case the focus can be adjusted and images can be zoomed in and out. One or both of the lens and the display panel 5701 is preferably configured to be movable in the optical-axis direction, for example.

The housing 5702 preferably includes a mechanism capable of adjusting the angle of the reflective plate 5712. The position of the display region 5706 where images are displayed can be changed by changing the angle of the reflective plate 5712.

Thus, the display region 5706 can be placed at the most appropriate position in accordance with the position of the user's eye.

Furthermore, the housing 5702 is preferably provided with a battery 5717 and a wireless power supply module 5718. With the battery 5717, the electronic device 5700 can be used without being connected to a battery, and thus can have higher convenience. In addition, the wireless power supply module 5718 enables wireless charging, leading to higher convenience and higher design property. Furthermore, the wireless power supply module 5718 can reduce the risk of malfunction due to a defective contact or the like compared to the case of wired charging through a connector or the like, leading to higher reliability of the electronic device 5700.

The housing 5702 is provided with a touch sensor module 5719. The touch sensor module 5719 has a function of detecting a touch on the outer surface of the housing 5702. FIG. 24B illustrates a state where the outer surface of the housing 5702 is touched by a finger 5720. Detecting a tap or slide operation by a user with the touch sensor module 5719 enables a variety of processings. For example, a video can be paused or restarted by a tap operation, or can be fast-forwarded or fast-reversed by a slide operation. Furthermore, providing the touch sensor module 5719 for each of the housings 5702 enables more kinds of operations.

A variety of touch sensors can be used for the touch sensor module 5719. For example, any of touch sensors of the following types can be used: a capacitive type, a resistive type, an infrared type, an electromagnetic induction type, a surface acoustic wave type, and an optical type. In particular, a capacitive touch sensor or an optical sensor is preferably used for the touch sensor module 5719.

In the case of using an optical touch sensor, a photoelectric conversion element can be used as a light-receiving element. The photoelectric conversion element includes an inorganic semiconductor or an organic semiconductor in its active layer, for example.

The display device or the functional panel of one embodiment of the present invention can be used for the display panel 5701. Thus, the electronic device 5700 capable of extremely-high-resolution display can be provided.

At least part of this embodiment can be implemented in combination with any of the other embodiments described in this specification as appropriate.

When this specification and the like explicitly states that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows electrical connection between X and Y provided therebetween.

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is turned on or off to determine whether current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even if another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "X and Y are electrically connected" is considered to be disclosure of the same contents as ones using a simple and explicit description "X and Y are connected" in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path"; and "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

This application is based on Japanese Patent Application Serial No. 2019-205057 filed with Japan Patent Office on Nov. 12, 2019 and Japanese Patent Application Serial No. 2019-210593 filed with Japan Patent Office on Nov. 21, 2019, the entire contents of which are hereby incorporated by reference.

What is claimed is:

1. A functional panel comprising:
   a first pixel comprising:
   a first element configured to emit light;
   a first functional layer; and
   a second functional layer,
   wherein the first element comprises a first electrode, a second electrode, and a layer containing a light-emitting material between the first electrode and the second electrode,
   wherein the layer containing a light-emitting material comprises gallium nitride,
   wherein the first functional layer comprises:
   a first insulating film comprising an opening; and
   a pixel circuit over the first insulating film, the pixel circuit comprising a first transistor,
   wherein the first transistor is electrically connected to the first electrode through the opening,
   wherein the first insulating film comprises a region between the pixel circuit and the first element, and
   wherein the first transistor comprises a first oxide semiconductor film,
   wherein the second functional layer comprises a first contact, a second driver circuit, and a second insulating film,
   wherein the first contact is electrically connected to the second driver circuit, wherein the second driver circuit comprises a second transistor, wherein the second transistor comprises a semiconductor comprising a Group 14 element, wherein the first functional layer comprises a third insulating film and a second contact, wherein the third insulating film comprises a region between the first insulating film and the second insulating film, wherein the third insulating film comprises a region bonded to the second insulating film, wherein the second contact is electrically connected to the first contact, and wherein the second contact is electrically connected to the pixel circuit.

2. The functional panel according to claim 1, wherein the first insulating film comprises a fourth insulating film and a fifth insulating film, wherein the fourth insulating film comprises a region where the fifth insulating film is positioned between the first transistor and the fourth insulating film, wherein the fourth insulating film comprises silicon and oxygen, and wherein the fifth insulating film comprises silicon and nitrogen.

3. The functional panel according to claim 1, further comprising:

a pixel set comprising;
the first pixel; and
a second pixel comprising a second element, wherein the first insulating film comprises a sixth insulating film, and wherein the sixth insulating film is configured to isolate the second element from the first element.

4. The functional panel according to claim 3, wherein the second pixel is configured to perform display using light emitted from the second element, wherein the second element is configured to emit light of the same color as light emitted from the first element, wherein the first pixel comprises a color conversion layer, and wherein the color conversion layer is configured to convert the color of the light emitted from the first element into a different color.

5. The functional panel according to claim 1, further comprising a first driver circuit, wherein the first functional layer comprises the first driver circuit, wherein the first driver circuit comprises a third transistor, wherein the third transistor comprises a second oxide semiconductor film, and wherein the second oxide semiconductor film comprises an element contained in the first oxide semiconductor film.

6. The functional panel according to claim 1, further comprising:

a region comprising a first group of pixel sets and a second group of pixel sets, wherein the first group of pixel sets is arranged in a row direction, wherein one of the first group of pixel sets is electrically connected to a first conductive film, wherein the second group of pixel sets is arranged in a column direction intersecting the row direction, and wherein one of the second group of pixel sets is electrically connected to a second conductive film.

7. A display device comprising:
a control unit; and
the functional panel according to claim 1, wherein the control unit is configured to be supplied with image data and control data, wherein the control unit is configured to generate an image signal from the image data, wherein the control unit is configured to generate a control signal from the control data, wherein the control unit is configured to supply the image signal and the control signal, wherein the functional panel is configured to be supplied with the image signal and the control signal, and wherein the first pixel performs display by the image signal.

8. An input/output device comprising:
an input unit comprising a sensing region; and
a display unit comprising the functional panel according claim 1, wherein the input unit is configured to sense an object approaching the sensing region, and wherein the sensing region and the pixel set overlap each other.

9. A data processing device comprising:
an arithmetic device; and
an input/output device, wherein the arithmetic device is configured to be supplied with input data or sensing data, wherein the arithmetic device is configured to generate control data and image data from the input data or the sensing data, wherein the arithmetic device is configured to supply the control data and the image data, wherein the input/output device is configured to supply the input data and the sensing data, wherein the input/output device is configured to be supplied with the control data and the image data, wherein the input/output device comprises:
a display unit configured to display the image data by the control data;
an input unit configured to generate the input data; and
a sensor unit configured to generate the sensing data, and wherein the display unit comprises the functional panel according to claim 1.

10. A data processing device comprising:
at least one of a keyboard, a hardware button, a pointing device, a touch sensor, an illuminance sensor, an imaging device, an audio input device, an eye-gaze input device, and an attitude detection device; and
the functional panel according to claim 1.

11. A functional panel comprising:
a first pixel comprising:
a first element configured to emit light;
a color conversion layer over the first element, the color conversion layer configured to convert a color of light emitted from the first element into a different color; and
a first functional layer between the first element and the color conversion layer, wherein the first element comprises gallium nitride,
wherein the first functional layer comprises:
a first insulating film comprising an opening; and
a pixel circuit over the first insulating film, the pixel circuit comprising a first transistor,
wherein the first transistor is electrically connected to the first element through the opening, wherein the first insulating film comprises a region between the pixel circuit and the first element, and wherein the first transistor comprises a first oxide semiconductor film.

12. The functional panel according to claim 11, further comprising:

a region comprising a first group of pixel sets and a second group of pixel sets, wherein the first group of pixel sets is arranged in a row direction, wherein one of the first group of pixel sets is electrically connected to a first conductive film, wherein the second group of pixel sets is arranged in a column direction intersecting the row direction, and wherein one of the second group of pixel sets is electrically connected to a second conductive film.

13. A display device comprising:

a control unit; and the functional panel according to claim 11, wherein the control unit is configured to be supplied with image data and control data, wherein the control unit is configured to generate an image signal from the image data, wherein the control unit is configured to generate a control signal from the control data, wherein the control unit is configured to supply the image signal and the control signal, wherein the functional panel is configured to be supplied with the image signal and the control signal, and wherein the first pixel performs display by the image signal.

14. An input/output device comprising:

an input unit comprising a sensing region; and a display unit comprising the functional panel according claim 11, wherein the input unit is configured to sense an object approaching the sensing region, and wherein the sensing region and the pixel set overlap each other.

15. A data processing device comprising:

an arithmetic device; and an input/output device, wherein the arithmetic device is configured to be supplied with input data or sensing data, wherein the arithmetic device is configured to generate control data and image data from the input data or the sensing data, wherein the arithmetic device is configured to supply the control data and the image data, wherein the input/output device is configured to supply the input data and the sensing data, wherein the input/output device is configured to be supplied with the control data and the image data, wherein the input/output device comprises:

a display unit configured to display the image data by the control data;

an input unit configured to generate the input data; and a sensor unit configured to generate the sensing data, and wherein the display unit comprises the functional panel according to claim 11.

16. A data processing device comprising:

at least one of a keyboard, a hardware button, a pointing device, a touch sensor, an illuminance sensor, an imaging device, an audio input device, an eye-gaze input device, and an attitude detection device; and the functional panel according to claim 11.

* * * * *